(12) United States Patent
LaRoche

(10) Patent No.: US 10,566,428 B2
(45) Date of Patent: Feb. 18, 2020

(54) METHOD FOR FORMING GATE STRUCTURES FOR GROUP III-V FIELD EFFECT TRANSISTORS

(71) Applicant: Raytheon Company, Waltham, MA (US)

(72) Inventor: Jeffrey R. LaRoche, Andover, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/882,250

(22) Filed: Jan. 29, 2018

(65) Prior Publication Data
US 2019/0237552 A1    Aug. 1, 2019

(51) Int. Cl.
*H01L 21/20* (2006.01)
*H01L 29/40* (2006.01)
(Continued)

(52) U.S. Cl.
CPC ...... *H01L 29/401* (2013.01); *H01L 21/28264* (2013.01); *H01L 21/28575* (2013.01); *H01L 21/28581* (2013.01); *H01L 21/76805* (2013.01); *H01L 21/76877* (2013.01); *H01L 21/76898* (2013.01); *H01L 21/8252* (2013.01); *H01L 23/481* (2013.01); *H01L 23/485* (2013.01); *H01L 23/5226* (2013.01); *H01L 23/53238* (2013.01); *H01L 29/4175* (2013.01); *H01L 29/452* (2013.01); *H01L 29/475* (2013.01); *H01L 29/495* (2013.01); *H01L 29/66462* (2013.01); *H01L 29/7786* (2013.01); *H01L 21/28587* (2013.01); *H01L 21/76816* (2013.01); *H01L 29/2003* (2013.01); *H01L 29/41758* (2013.01); *H01L 29/7787* (2013.01)

(58) Field of Classification Search
CPC ............. H01L 29/401; H01L 21/76898; H01L 29/495; H01L 21/28575; H01L 23/481; H01L 21/76877; H01L 21/76805; H01L 21/8252; H01L 29/475; H01L 23/53238; H01L 23/5226; H01L 29/452; H01L 21/28264; H01L 21/76816; H01L 29/7787
USPC ........................................................ 438/584
See application file for complete search history.

(56) References Cited

U.S. PATENT DOCUMENTS 8,293,597 B2 * 10/2012 Raaijmakers ......... C23C 16/405
                                                            257/E21.632
8,455,672 B2    6/2013 Gordon et al.
(Continued)

OTHER PUBLICATIONS

Chae et al.; Atomic Layer Deposition of Nickel by the Reduction of Preformed Nickel Oxide. Electromechanical and Solid-State Letters; 5 (6); Oct. 20, 2001; p. C64-C66; 3 pages.
(Continued)

*Primary Examiner* — Vu A Vu
(74) *Attorney, Agent, or Firm* — Daly, Crowley, Mofford & Durkee, LLP

(57) ABSTRACT

A method for forming a gate structure for a Field Effect Transistor includes providing a semiconductor. A dielectric layer is formed over the semiconductor with an opening therein over a selected portion of the semiconductor. A deposition process is used to selectively deposit a gate metal over the dielectric layer and into the opening, the gate metal being deposited being non-adherent to the dielectric layer by the gate metal deposition process.

7 Claims, 59 Drawing Sheets

(51) Int. Cl.

| | |
|---|---|
| *H01L 29/66* | (2006.01) |
| *H01L 21/285* | (2006.01) |
| *H01L 23/485* | (2006.01) |
| *H01L 29/417* | (2006.01) |
| *H01L 29/778* | (2006.01) |
| *H01L 21/28* | (2006.01) |
| *H01L 21/768* | (2006.01) |
| *H01L 21/8252* | (2006.01) |
| *H01L 23/48* | (2006.01) |
| *H01L 23/522* | (2006.01) |
| *H01L 23/532* | (2006.01) |
| *H01L 29/45* | (2006.01) |
| *H01L 29/47* | (2006.01) |
| *H01L 29/49* | (2006.01) |
| *H01L 29/20* | (2006.01) |

(56) References Cited

U.S. PATENT DOCUMENTS

| | | | |
|---|---|---|---|
| 9,105,650 B2 * | 8/2015 | Chang | H01L 29/6625 |
| 9,129,897 B2 * | 9/2015 | Pore | C23C 16/06 |
| 9,478,508 B1 | 10/2016 | LaRoche et al. | |
| 9,570,302 B1 | 2/2017 | Chang et al. | |
| 10,128,237 B2 * | 11/2018 | Tsau | H01L 29/66545 |
| 2006/0240662 A1 | 10/2006 | Conley et al. | |
| 2010/0039168 A1 | 2/2010 | Bettencourt | |
| 2015/0235856 A1 | 8/2015 | Hwang et al. | |
| 2017/0032975 A1 * | 2/2017 | Tai | H01L 29/517 |
| 2017/0213899 A1 | 7/2017 | Cheng et al. | |

OTHER PUBLICATIONS

Gu et al.; Characterization of interface and border traps in ALD $Al_2O_3$/GaN MOS capacitors with two-step surface pretreatments on Ga-polar GaN. Applied Surface Science; v.317; Oct. 30, 2014; p. 1022-7. 6 pages.

Hattori et al.; Chemical etchant dependence of surface structure and morphology on GaN (0001) substrates. Surface Science; v. 604; Apr. 7, 2010; p. 1247-53. 7 pages.

Lindahl et al.; Atomic Layer Deposition of NiO by the $Ni(thd)_2/H_2O$ Precursor Combination. Chem. Vap. Deposition. Feb. 2, 2009; v.15; p. 186-91. 6 pages.

Maruyama et al.; Surface treatment of GaN and InN using $(NH_4)_2S_x$. Phys. Stat. Sol.; No. 7; Jan. 1, 2003; p. 2031-4. 4 pages.

Smith et al.; Reconstructions of GaN (0001) and (0001) surfaces: Ga-rich metallic structures. J. Vac. Sci. Technol. B 16(4). Jul. 1, 1998; p. 2242-9. 8 pages.

Son et al.; Fixed charge in high-k/GaN metal-oxide-semiconductor capacitor structures. Appl. Phys. Lett.; v.101; Jan. 1, 2012; 4 pages.

Utriainen et al.; Studies of metallic thin film growth in an atomic layer epitaxy reactor using $M(acac)_2$ (M=Ni, Cu, Pt) precursors. Applied Surface Science; v.157; Jan. 1, 2000; p. 151-8. 8 pages.

Vezian et al.; Origins of GaN (0 0 0 1) surface reconstructions. Surface Science; v. 541; Sep. 1, 2003. 14 pages.

Yang, T.S. et al.; Atomic layer deposition of nickel oxide films using $Ni(dmamp)_2$ and water. J. Vac. Sci. Technol. A 23 (4); Jul. 1, 2005; p. 1238-43. 7 pages.

Yang et al.; Comparative band alignment of plasma enhanced atomic layer deposited high-k dielectric on gallium nitride. J. Appl. Phys. v.112; Jan. 1, 2012. 14 pages.

Yang et al.; Surface band bending and band alignment of plasma enhanced atomic layer deposited dielectrics on Ga- and N-face gallium nitride. J. Appl. Phys.; v. 116; Jun. 10, 2014; 13 pages.

Rong Chen, Hyoungsub Kim, Paul C. McIntyre, David W. Porter, Stacey F. Bent, Achieving area-selective atomic layer deposition on patterned substrates by selective surface modification, Applied Physics Letters 86, 191910 (2005), pp. 191910-1-191919-3 (3 pages).

Notification of Transmittal of the International Search Report and Written Opinion of the ISA dated Apr. 23, 2019, for International Application No. PCT/US2019/012265; 1 Page.

International Search Report dated Apr. 23, 2019 for International Application No. PCT/US2019/012265; 5 Pages.

Written Opinion of the ISA dated Apr. 23, 2019 for International Application No. PCT/US2019/012265, 10 Pages.

* cited by examiner

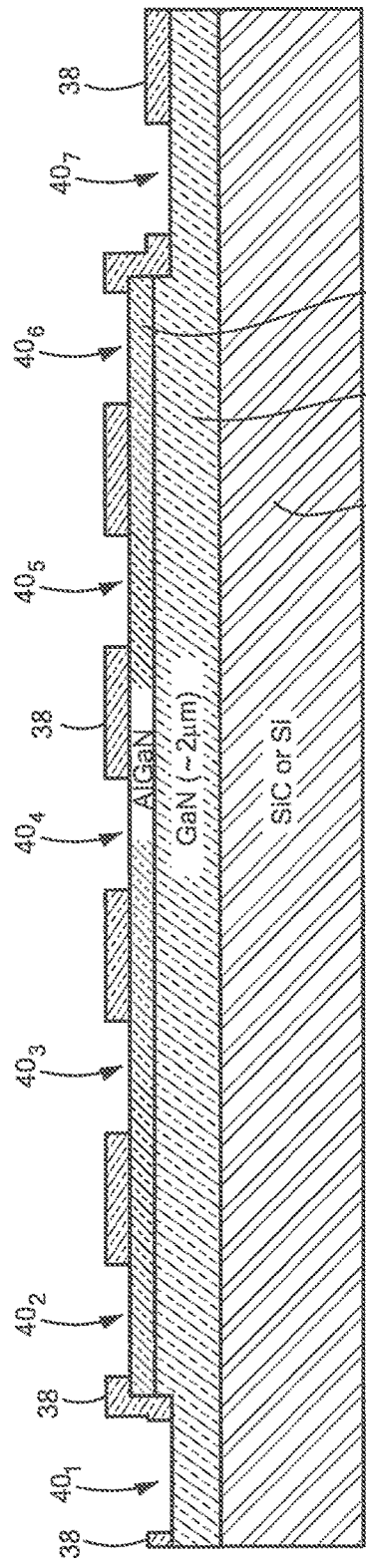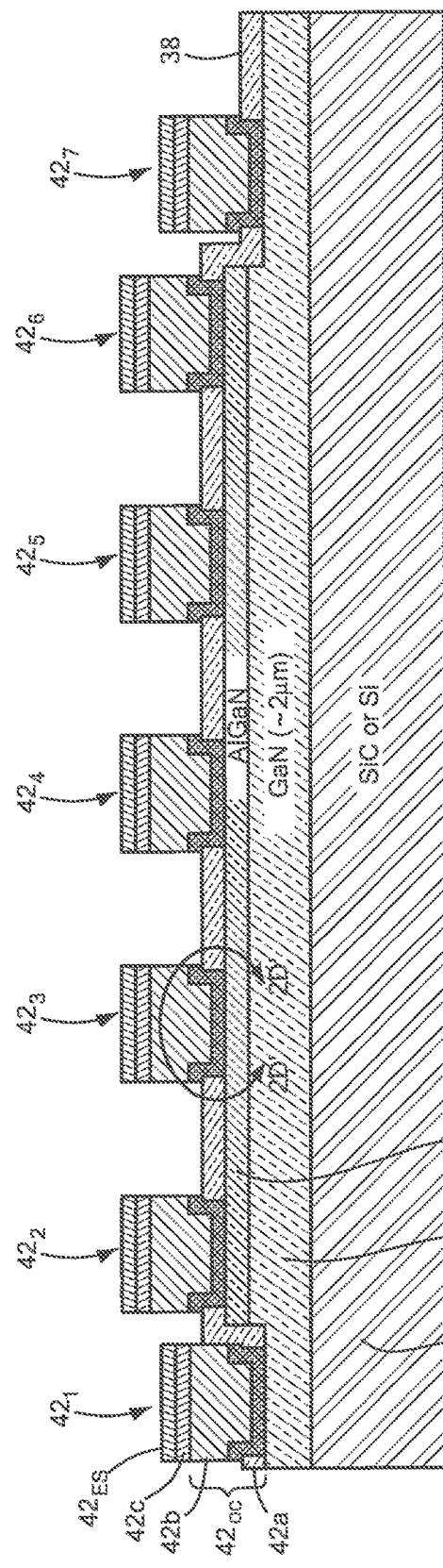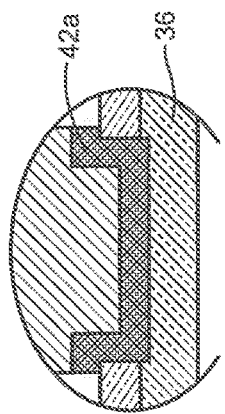
FIG. 2C
FIG. 2D
FIG. 2D'

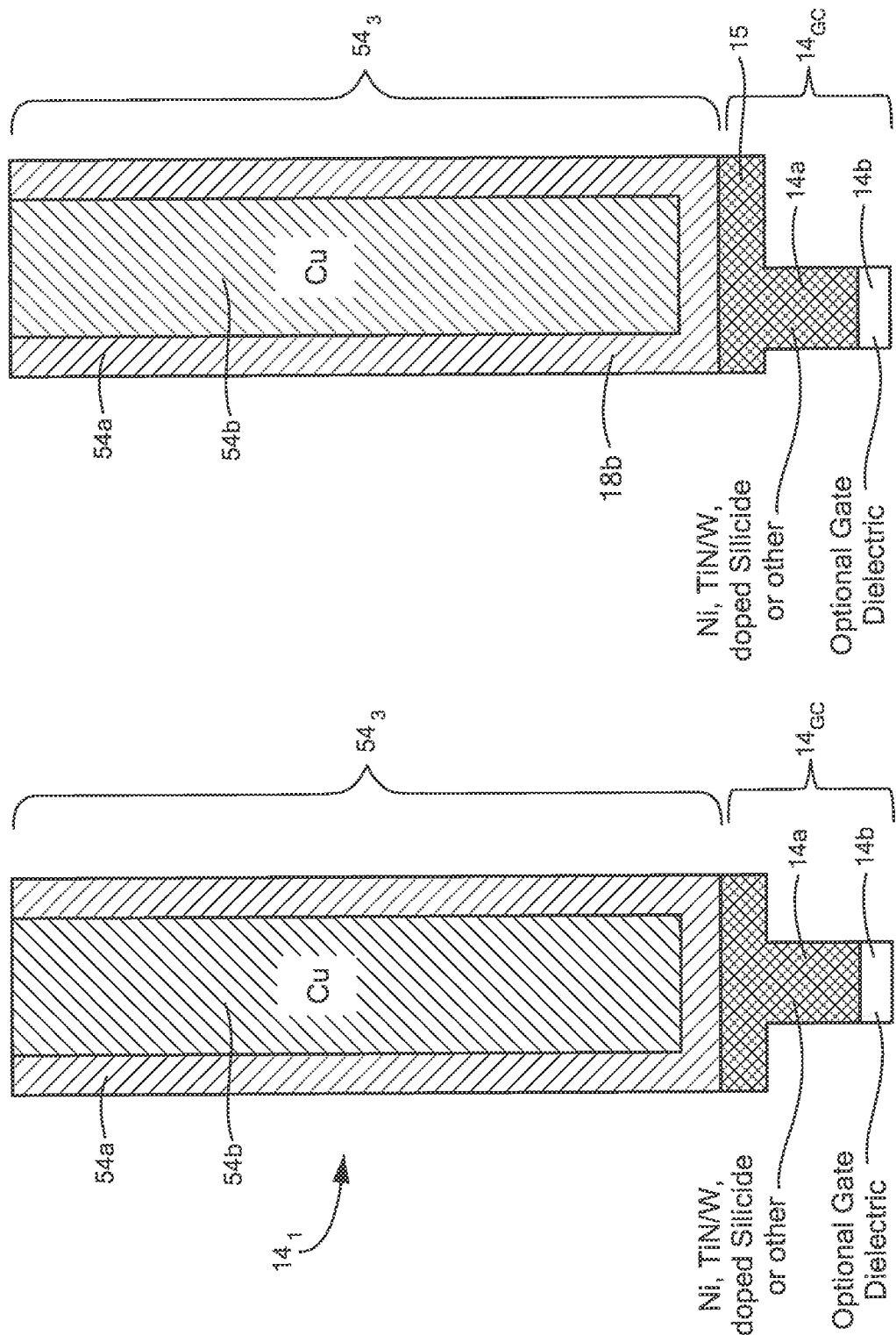

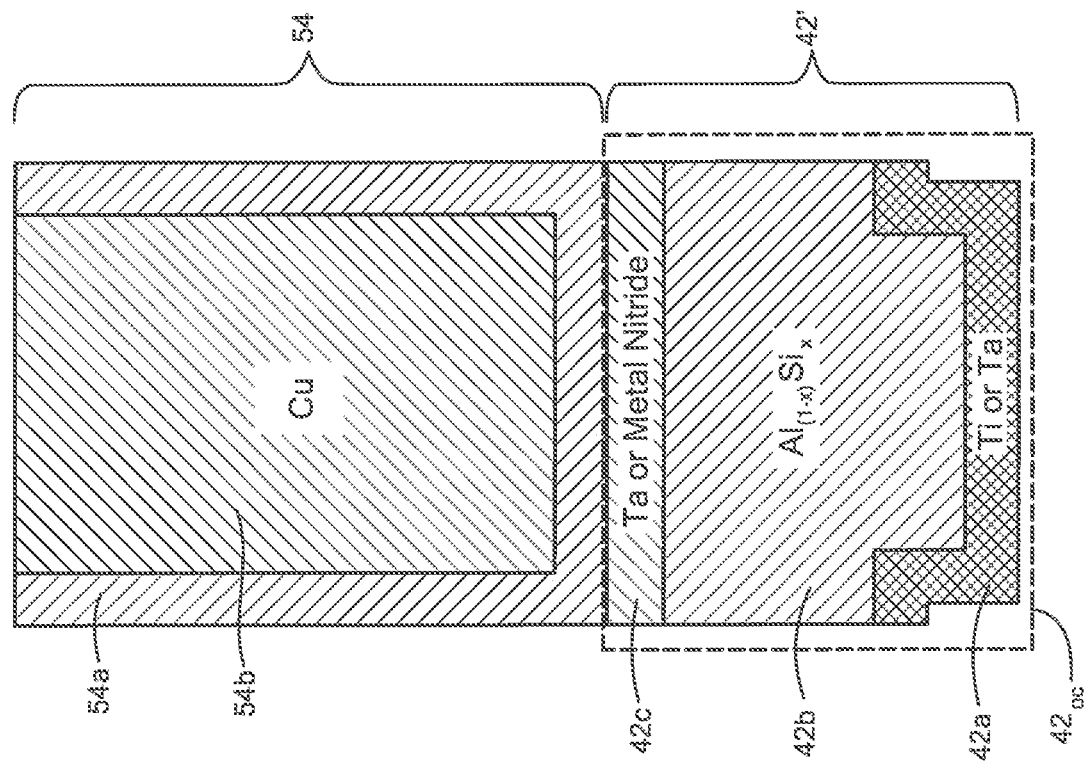
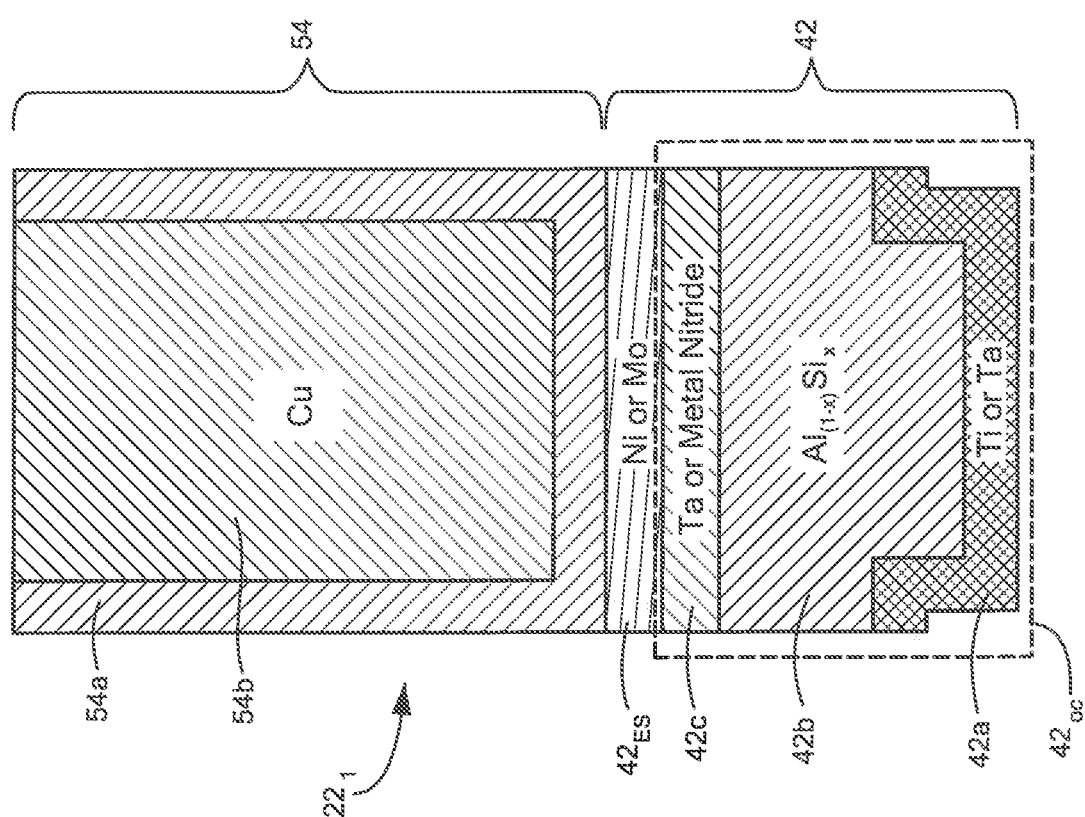
FIG. 3B
FIG. 3B'

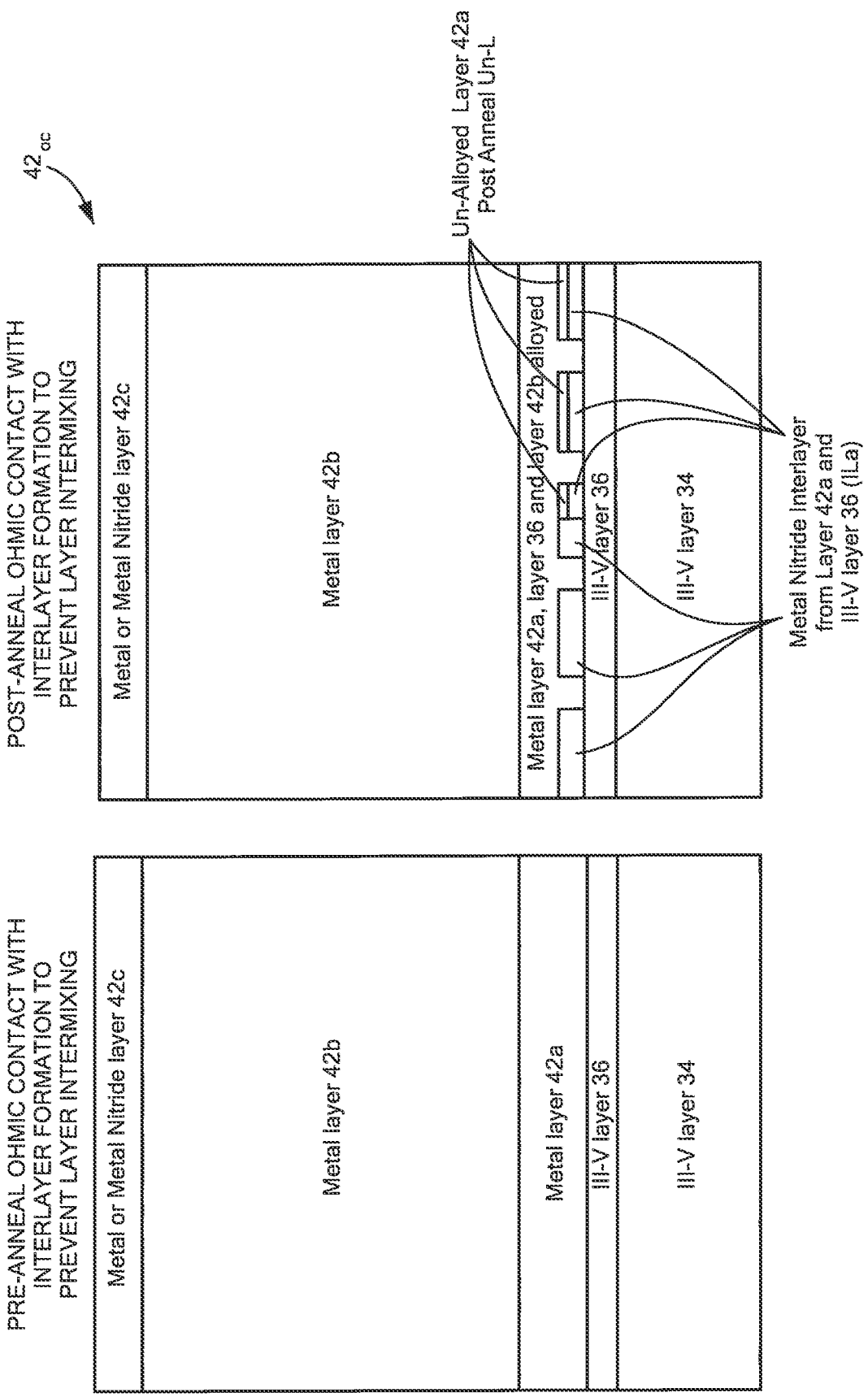

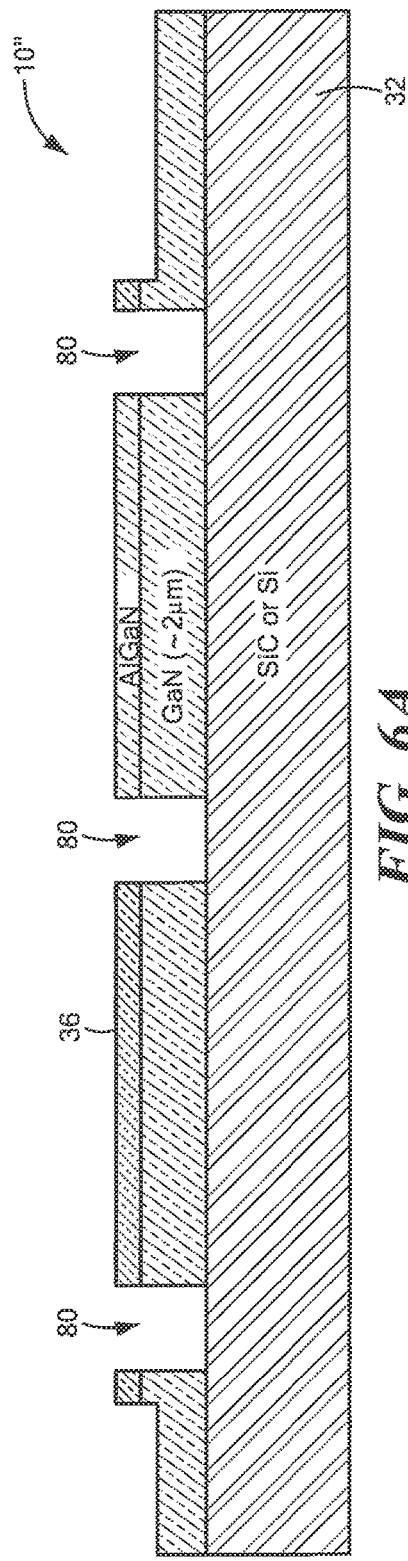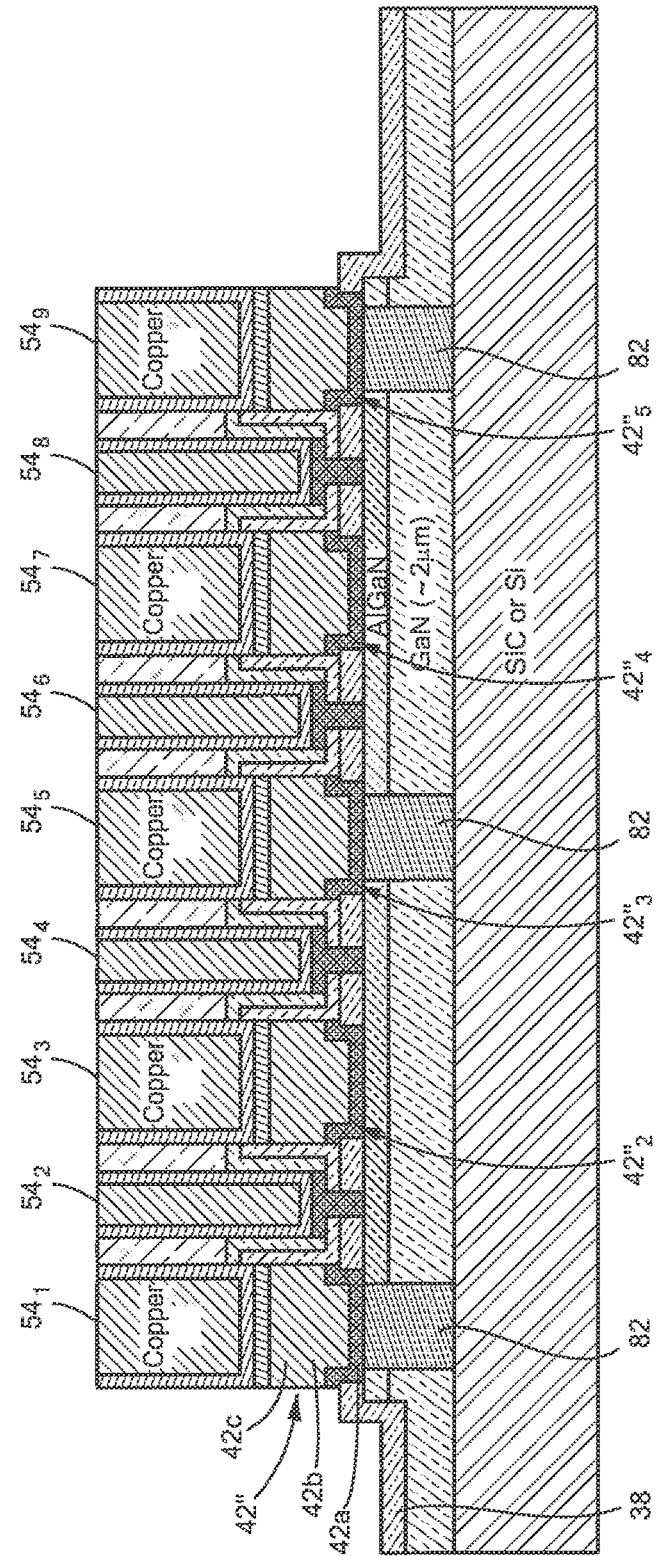

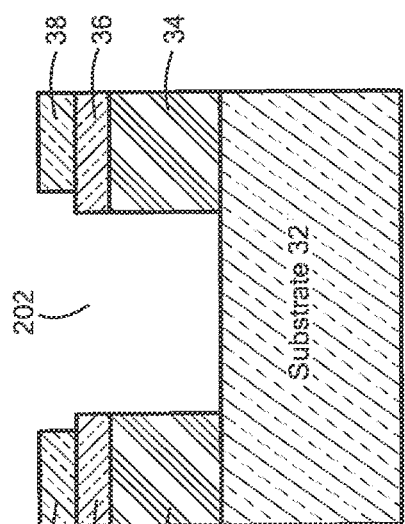
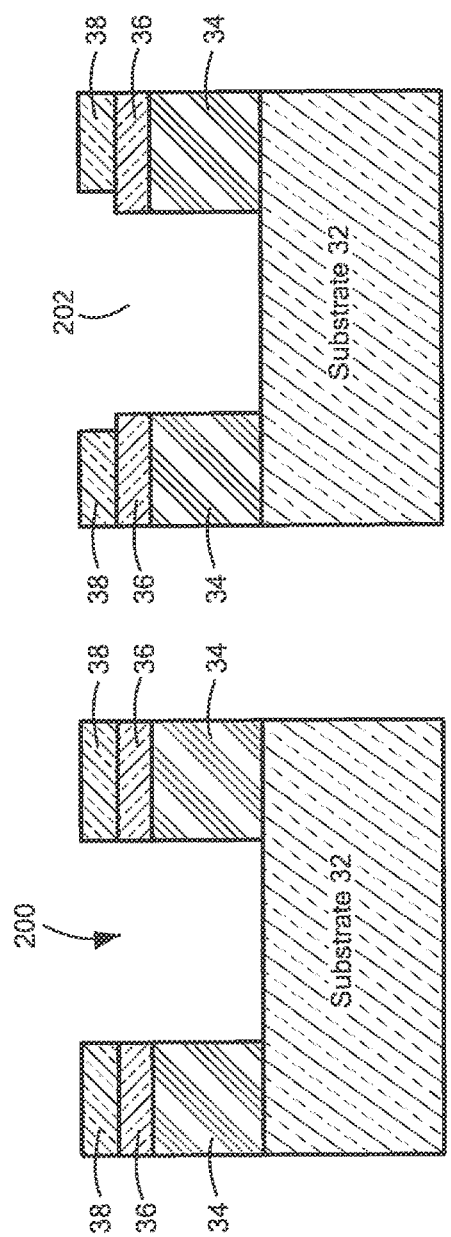
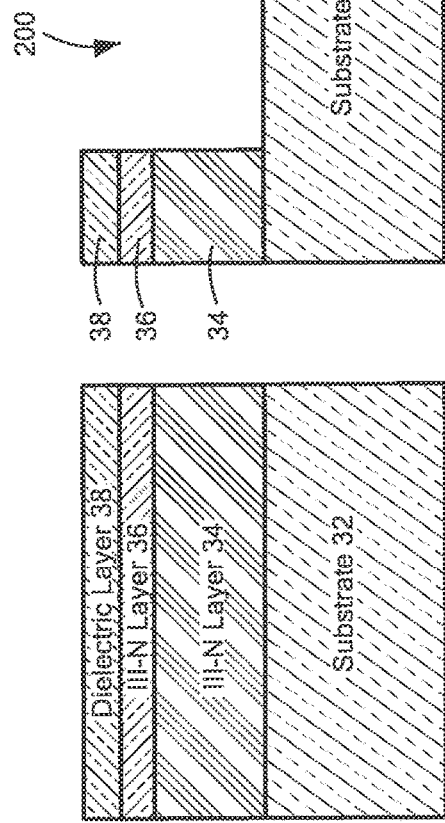
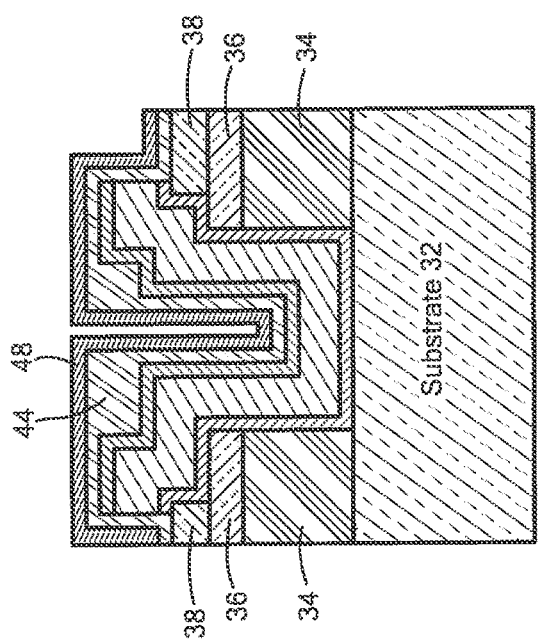
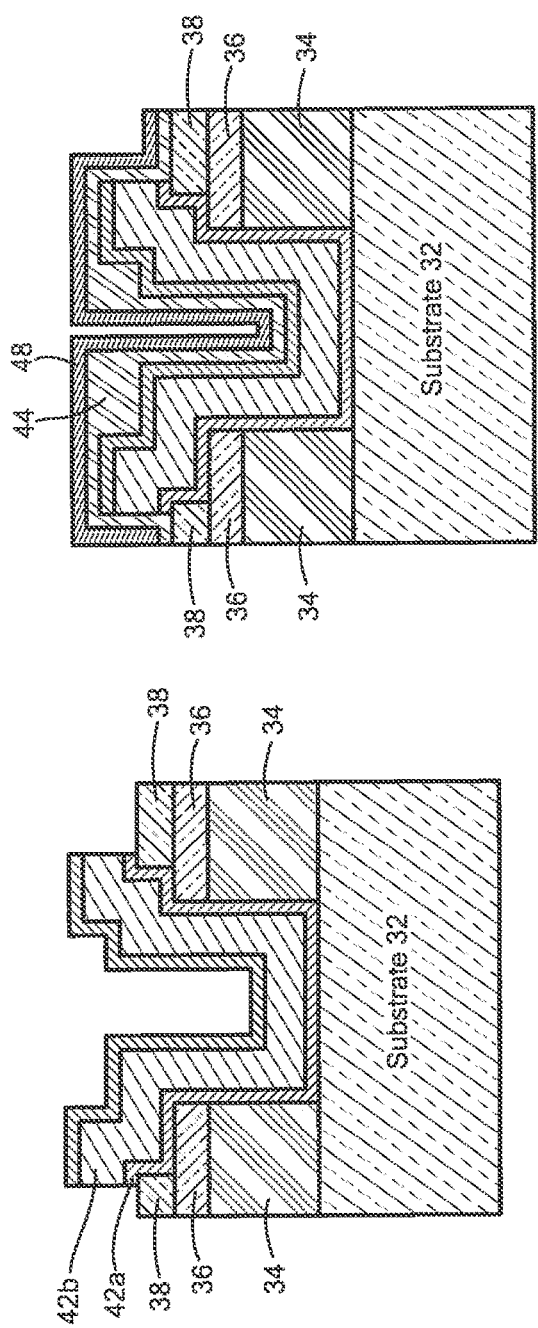

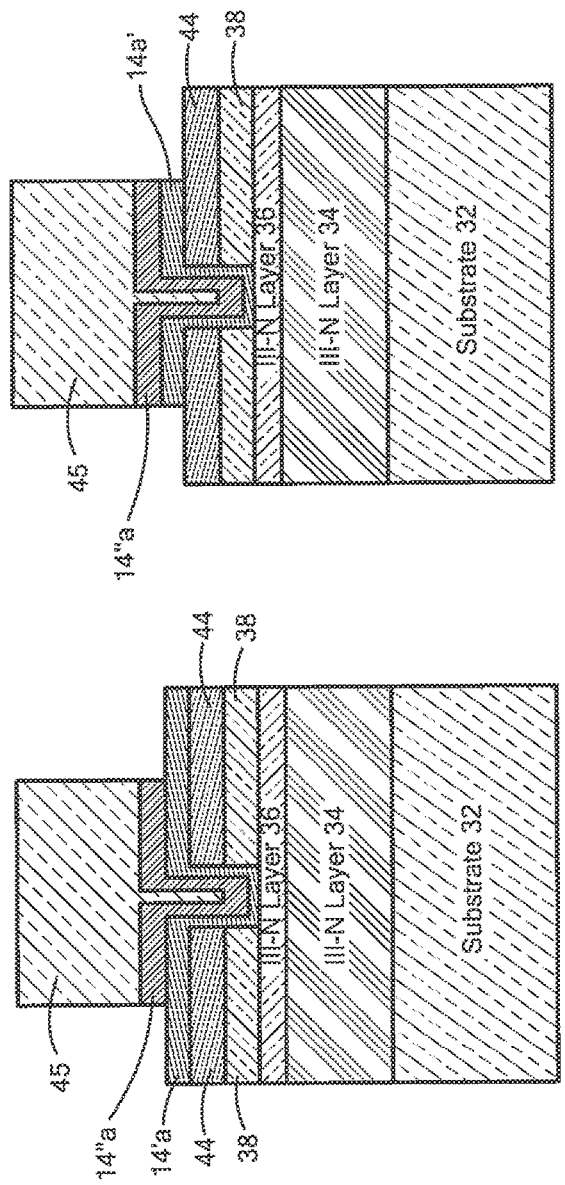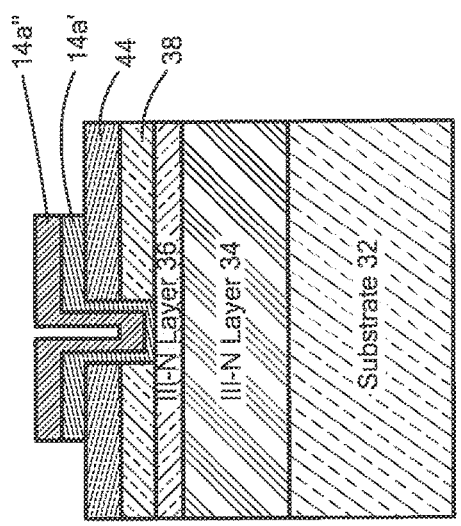
FIG. 10E
FIG. 10F
FIG. 10G

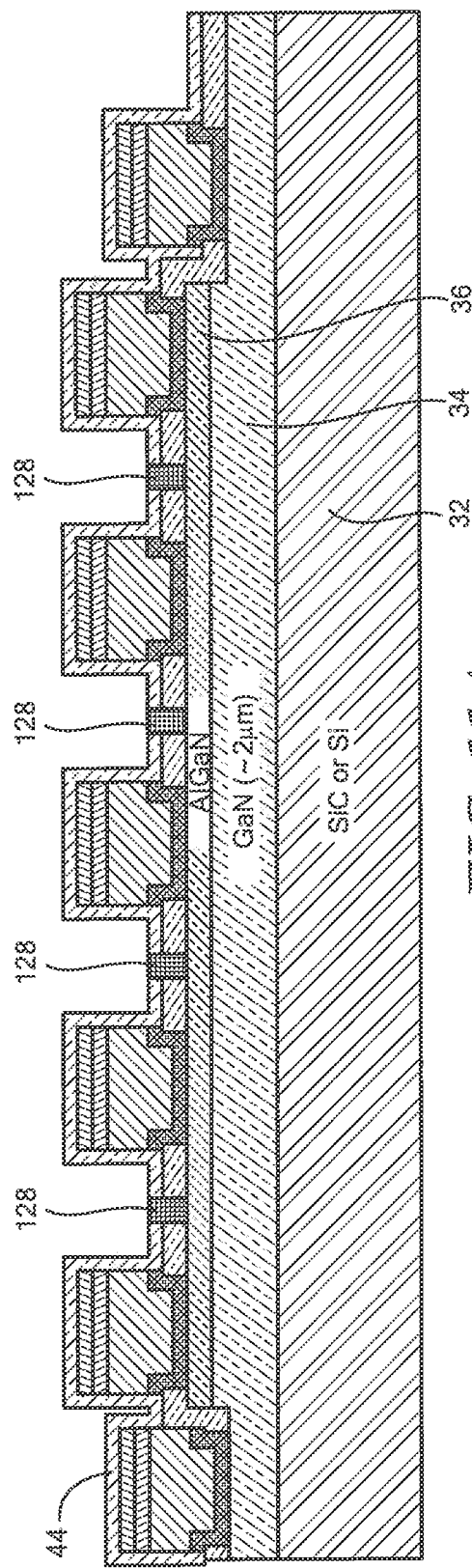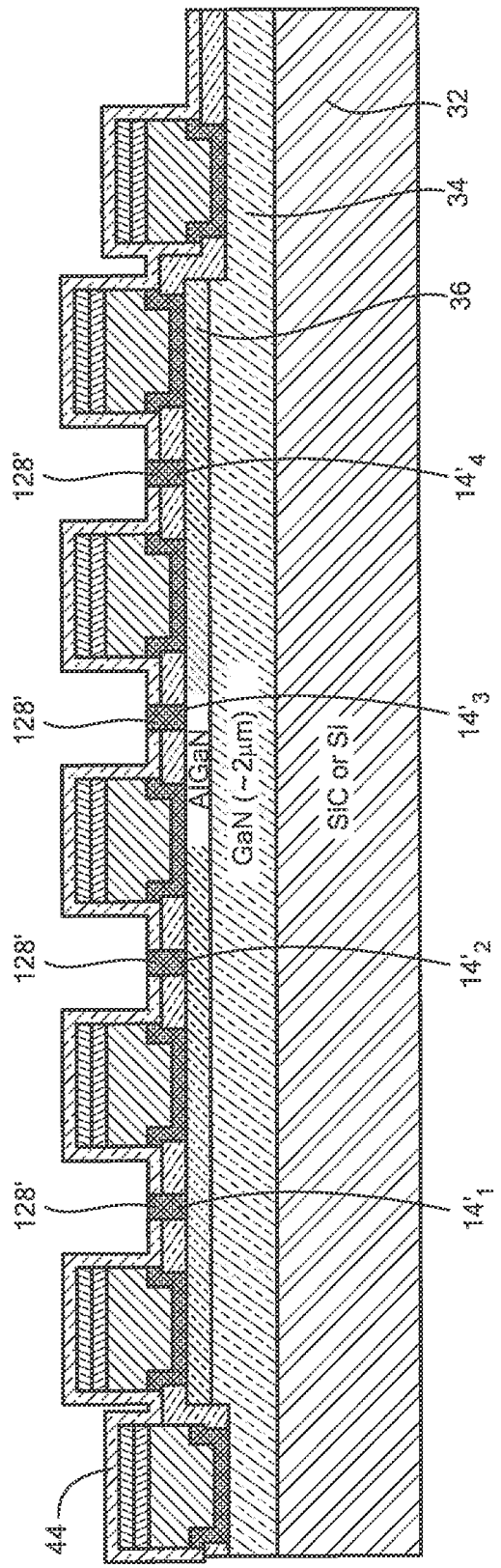

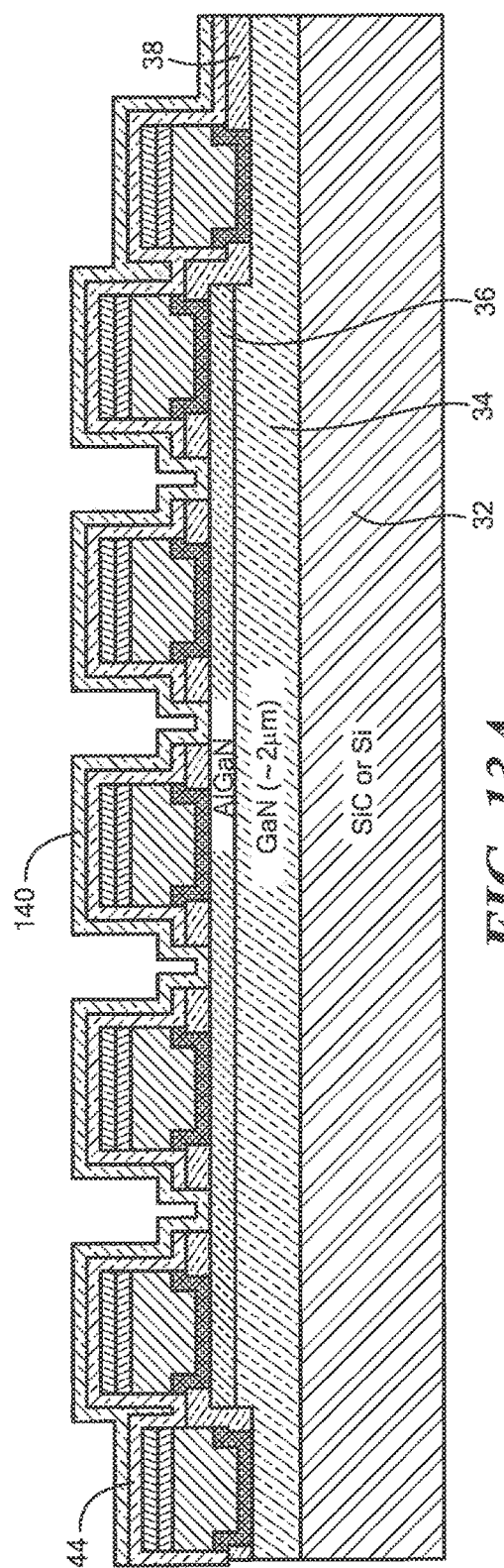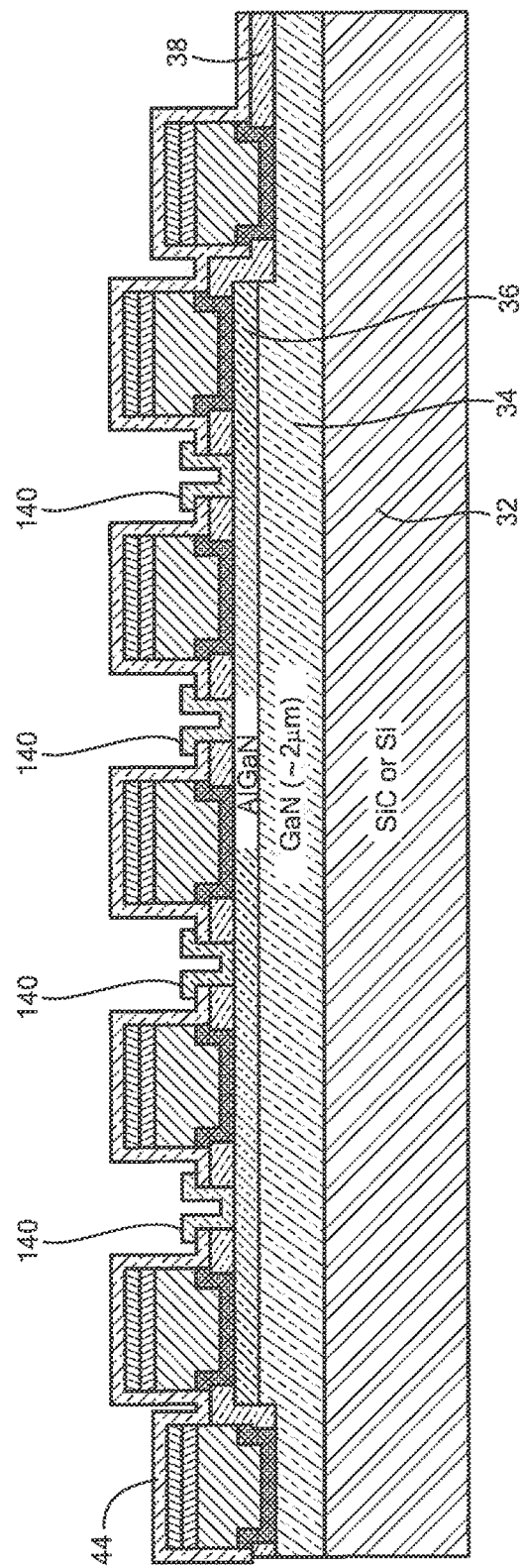
FIG. 13A
FIG. 13B

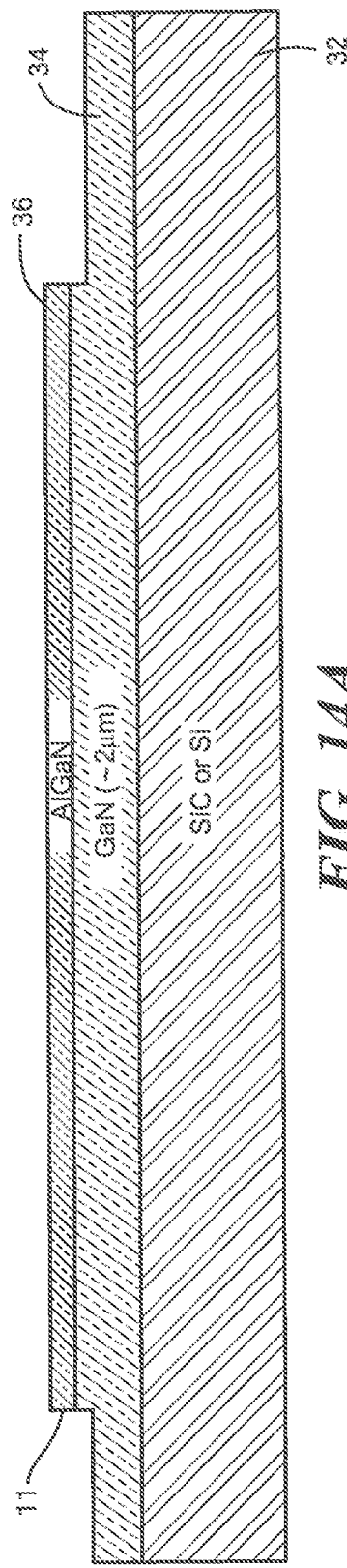
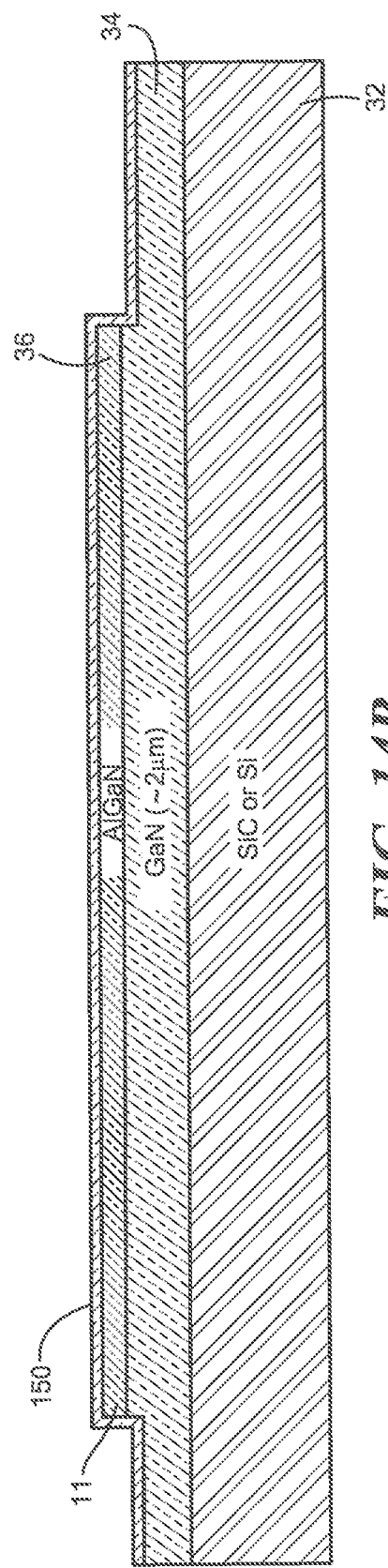
FIG. 14A
FIG. 14B

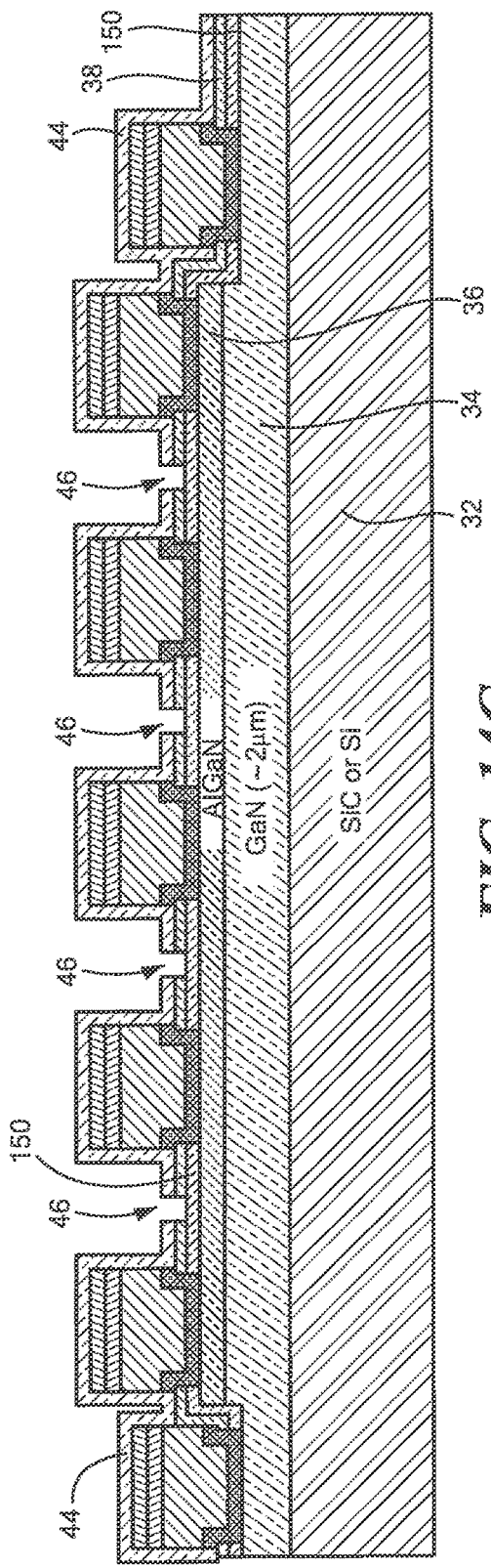
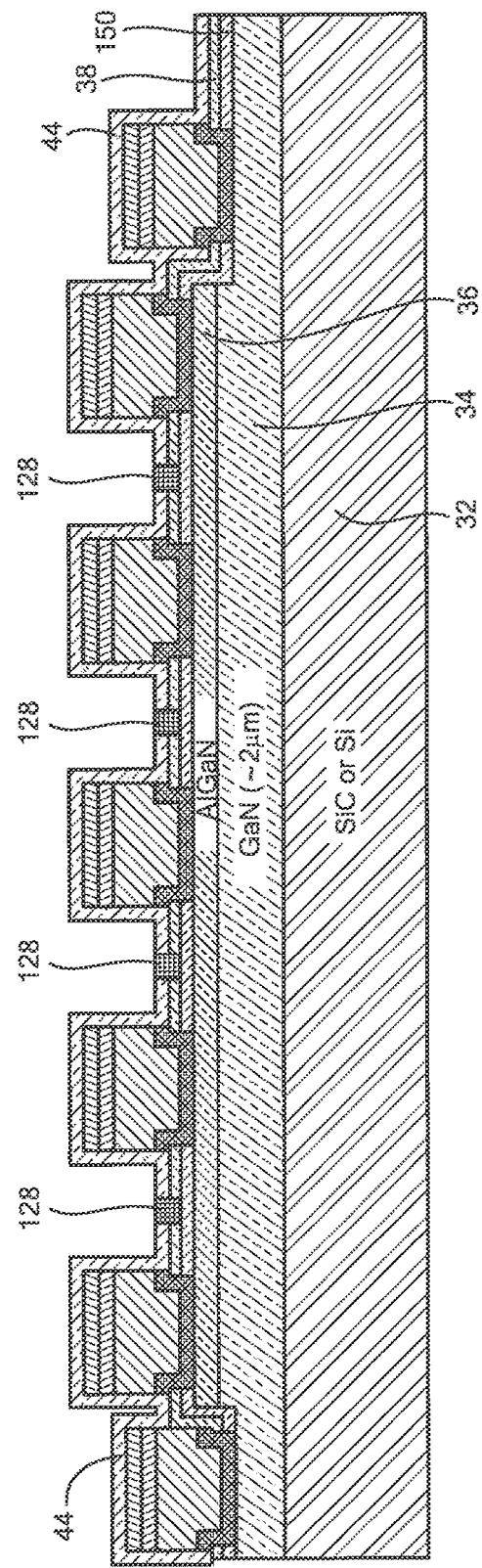
FIG. 14G
FIG. 14H

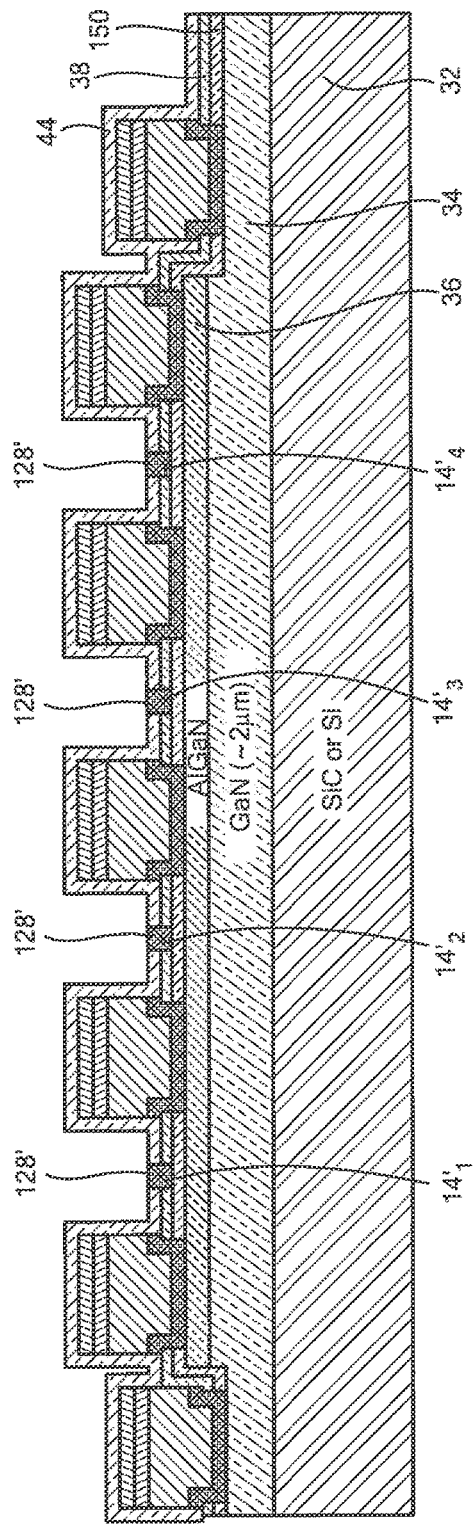
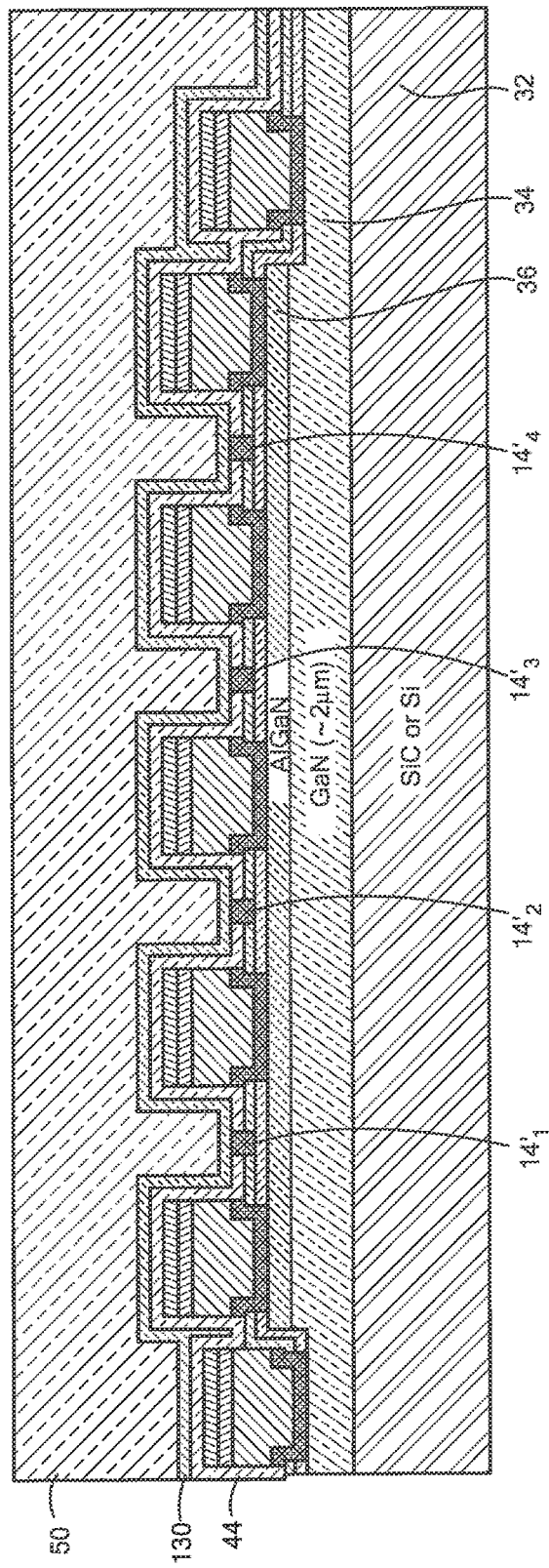
FIG. 14I
FIG. 14J

METHOD FOR FORMING GATE STRUCTURES FOR GROUP III-V FIELD EFFECT TRANSISTORS

TECHNICAL FIELD

This disclosure relates generally to methods for forming gate structures for Field Effect Transistors (FETs) and more particularly methods for forming gate strictures for Field Effect Transistors (FETs) without either subtractive or liftoff processing.

BACKGROUND

As is known in the art, many monolithic microwave integrated circuits (MMICs) having Group III-Nitride semiconductors, sometimes referred to as nitride semiconductors, such as for example, gallium nitride-based (AlGaN/GaN) high electron mobility transistors (HEMTs), are increasingly being used for high-frequency and high-power applications. Group III-Nitride are herein after sometimes also referred to as Group III-N which includes, for example, binaries InN, GaN, AlN, their ternary alloys such as $Al_xGa_{1-x}N$ (AlGaN) alloys and other nitrogen based alloys.

In order to realize the potential of these HEMT devices it is necessary to achieve low-resistance, good edge acuity and reliable metal to metal contacts, and metal to semiconductor Ohmic contacts and Schottky contacts (for gate formation). Most Group III-N foundry metal to metal and metal to semiconductor low resistance Ohmic contacts use gold (Au) to reduce sheet resistance (for transmission lines and Ohmic contacts) and to decrease oxidation during the high temperature anneal required to achieve the lowest metal to semiconductor Ohmic contact resistance to active devices. The preferred contact metal for Schottky gate contacts is Nickel, owing to its large work function ($\geq 5$ eV), As is also known, in many Monolithic Microwave Integrated Circuits (MMICs) and other integrated circuits (ICs), electrical connection is made to the bottom of the MMIC for both ground and electrical signals to mounted chips, these connections are made through electrically conductive vias passing through the substrate and/or a semiconductor epitaxial layer on at least a portion of the substrate to electrical contacts that connect the vias to a metallization on the wafer; sometimes referred to as a front-side metallization.

Traditionally, Group III-N HEMT MMICs and devices are fabricated by liftoff-based processing in III-V foundries. Recently, however, Group III-N HEMTs have begun to be fabricated using high yield silicon (Si) like, Au-free, subtractive processing techniques in Si CMOS foundry environments. More particularly, a "lift-off" process is where a mask has a window to expose a selected portion of a surface where a material is to be deposited. The material is deposited onto the mask with a portion of the material passing through the window onto the exposed selected portion of the surface. The mask is lifted off the surface with a solvent along with portion of the material on the mask (the unwanted portion of the deposited material) while leaving the desired portion of the material on the exposed selected portion of the surface. A "subtractive" process is where a material is first deposited over the entire surface. Then a mask is formed to cover only over a selected portion of the deposited material (the portion which is to remain after the processing); the unwanted portions of the deposited material being exposed. An etchant is then brought into contact with the mask thereby removing the exposed unwanted portion while the mask prevents the etchant from removing the covered desired portion of the material.

Relative to Si CMOS foundries, it is well known that the yield and cost of III-V compound semiconductor devices and circuits (processed in traditional III-V foundries) has long been limited by low wafer volumes, increased substrate handling during processing, the widespread use of liftoff-based processing techniques to define metal lines, and the use of time consuming electron beam lithography for sub 500 nm gate lithography. The Si CMOS foundry environment on the other hand has the benefit of high wafer volumes, large wafer diameters ($\geq 200$ mm), highly automated cassette to cassette wafer fabrication or processing tools, subtractive processing techniques, advanced optical lithography cluster tools and techniques (capable of defining sub 100 nm features), and the Moore's law paradigm that drives both equipment development and technology node development.

However, as noted previously, to take advantage of the benefits of the Si foundry infrastructure and background Si CMOS wafer volumes, the developed Group III-N processes have to be Au-free. Gold is a deep level trap dopant in Si. Therefore, Au is not allowed in the front end or back end of Si CMOS foundry fabrication lines as it is a serious contamination concern that can cause catastrophic yield problems.

Gold free processing of GaN (or other III-V) device wafers in Si foundry environments therefore requires the use of Si foundry back end of line (BEOL) compatible metallizations such as aluminum (Al) or copper (Cu). Copper is the most attractive of these metals to use as it has superior electrical conductivity and electro-migration resistance. However, because of the lack of volatile copper dry etch byproducts, copper cannot readily be subtractively patterned by the techniques of photolithography wherein photoresist masking and plasma etching have been used with great success with aluminum. To process copper, the Damascene process (which is also subtractive), was developed. In the Cu Damascene process, a host insulator material for the copper, typically an underlying insulating layer (usually silicon dioxide), is patterned with open trenches where the copper is to be formed. A thick coating of copper that significantly overfills the trenches is deposited on the insulating layer, and chemical-mechanical planarization (CMP) is used to remove the excess copper that extends above the top of the insulating layer. Cu filled within the trenches of the insulating layer is not removed and becomes the patterned conductive interconnect.

As is also known in the art, while Cu is manageable, it also poses its own contamination risk for Si foundries. Barrier layers should completely surround all copper interconnections, since diffusion of copper into surrounding materials would degrade their properties. Typically, the trenches are lined with thin tantalum (Ta) and/or tantalum nitride (TaN) metal layers (as part of the Ta/TaN/Cu plating seed metal stack) to act as diffusion barriers along the bottom and sides of the Cu metal interconnects. At post Cu CMP the top of the interconnect metal is coated with $SiN_x$ to act as the top interface diffusion barrier, to prevent oxidation during interlayer oxide deposition, and to act as a stop etch layer (during the trench etch of the silicon dioxide) for additional interconnect formation. Additional process complications arise, however, when back to front side metal interconnects are facilitated by through-wafer or through-semiconductor layer vias that require a chlorine—(or other oxidizer) based etches to form these vias. The chloridebased etch by-products are nonvolatile and the etch process results in a degraded Cu interfacial surface.

As is also known in the art, Field Effect Transistors (FETs) used in high frequency applications are typically Group III-V devices, such as Gallium Nitride (GaN) HEMT FETs. While today many of these GaN FETs are fabricated in foundries specifically designed to fabricate these GaN FETs, it would be desirable to also have these devices fabricated in foundries currently designed to fabricate Silicon (Si) devices.

SUMMARY

In accordance with the present disclosure, a method is provided for forming a gate structure for a Field Effect Transistor, comprising: providing a semiconductor; forming a dielectric layer over the semiconductor with an opening therein over a selected portion of the semiconductor; using a deposition process to selectively deposit a gate metal over the dielectric layer and into the opening, the gate metal being deposited being non-adherent to the dielectric layer by the gate metal deposition process.

In one embodiment, the gate metal being deposited being non-adherent to the dielectric layer by the gate metal deposition process and adherent to the semiconductor.

In one embodiment, an insulation layer is formed over the semiconductor, the opening exposes the insulating layer, and the gate metal being deposited is non-adherent to the dielectric layer by the gate metal deposition process and adherent to the insulating layer.

In one embodiment, the method includes chemically reducing the initial gate metal.

In one embodiment, the deposition process is Atomic Layer Deposition (ALD).

In one embodiment, a method is provided for forming a gate structure for a Field Effect Transistor. The method includes: providing a semiconductor; forming a dielectric layer over the semiconductor with an opening therein over a selected portion of the semiconductor; forming an initial gate metal into the opening.

In one embodiment, the method includes chemically reducing the initial gate metal into the gate structure.

In one embodiment, the chemically reducing comprises annealing the deposited initial gate metal in a reducing agent.

In one embodiment, the initial gate metal is an oxide.

In one embodiment, the initial gate metal is nickel oxide.

In one embodiment, the initial gate metal forming comprises Atomic Layer Deposition (ALD).

In one embodiment, a method is provided for forming a Nickel structure over a selected portion of a Group III-V semiconductor. The method includes: forming a dielectric layer over the semiconductor with an opening therein over a selected portion of the semiconductor; forming Nickel Oxide on a surface exposed by the opening; and annealing the Nickel Oxide in a reducing agent to convert the Nickel Oxide into Nickel.

In one embodiment, a method is provided for forming a gate structure for a Field Effect Transistor. The method includes: providing a semiconductor; forming a dielectric layer over the semiconductor with an opening therein over a selected portion of the semiconductor; and selectively depositing a gate metal oxide into the opening.

In one embodiment, the gate metal depositing comprises Atomic Layer Deposition (ALD).

In one embodiment, a method is provided for forming a gate structure for a Field Effect Transistor, comprising: providing a semiconductor; forming a non-oxide dielectric layer over a surface of the semiconductor, the non-oxide dielectric layer having an opening therein disposed over a selected portion of the surface of the semiconductor; subjecting the non-oxide dielectric layer and the exposed selected portion of the surface of the semiconductor to a gate metal deposition process wherein a gate metal being deposited is non-adherent to the non-oxide dielectric layer and is adherent to an oxide formed on the exposed selected portion of the surface of the semiconductor.

In one embodiment, the method includes forming an oxide insulation layer over the surface of the semiconductor, the opening exposing the oxide insulating layer, and wherein the gate metal is deposited is non-adherent to the non-oxide dielectric layer by the gate metal deposition process and adherent to the oxide insulating layer In one embodiment, a method is for forming a gate structure over a selected portion of a Group III-V semiconductor, comprising: forming a dielectric layer over the semiconductor with an opening therein over a selected portion of the semiconductor; forming Nickel Oxide on a surface exposed by the opening; annealing the Nickel Oxide in a reducing agent to convert the Nickel Oxide into Nickel.

In one embodiment, a method is provided for forming a gate structure for a Field Effect Transistor, comprising: providing a semiconductor; forming a dielectric layer over the semiconductor with an opening therein over a selected portion of the semiconductor; selectively depositing, by atomic layer deposition, a gate metal into the opening; chemically reducing the deposited gate metal.

The inventor has recognized that selective deposition of NiO for fabrication of Nickel based gates for GaN HEMTs overcomes the limitations of Ni based gate fabrication in both traditional liftoff based foundries and subtractive Silicon foundries. Liftoff based processing in III-V foundries may lead to unwanted photoresist residue that results in adverse effects on the FET that are one or more of the following: poor yield, degraded performance, and/or degraded reliability of the FET. On the other hand, subtractive processing of Ni based gates in Si foundries is challenging because the preferred gate structure metal Nickel (Ni) is difficult to dry etch (it is mostly a sputter/physical etch and not a chemical etch). As a result, the etching of the Ni is primarily a physical etch that is inherently nonselective and would typically use a sacrificial dielectric layer to form the gate structure of the FET. The use of a sacrificial dielectric layer in turn could negatively impact the ability to freely design gamma gate type structures with optimum gamma gate top to channel distances because one could inadvertently etch into the gate channel during the Nickel gate structure etch process. Additionally, for both gamma gate and T-gate structures the low volatility of Ni dry etch products often leads to re-deposition of Ni containing etch products which could in turn cause defects that impact yield and/or performance and/or reliability. Alternately, the use of wet etch to define subtractively processed nickel based gates may lead to undercut of gate metal features and in turn result in the following: poor dimensional control (resulting in increased performance variability and low yields), and degraded reliability.

The inventor has also recognized that a Nickel Oxide (NiO) gate metal layer is selectively deposited through an opening, here using ALD; and that the NiO layer will not adhere to the non-oxide layers such as SiNx but will adhere to a semiconductor layer such as an AlGaN layer that terminates in native oxides that are likely to form —OH groups during the NiO ALD deposition process thereby facilitating the ALD deposition. That is, NiO metal deposition on the non-oxide layer is suppressed because there is not a significant concentration of —OH groups (as there is on oxide layers such as $SiO_2$ or $Al_2O_3$) on the SiNx, non-oxide layer, to which the NiO will bond with whereas the AlGaN being a semiconductor will have some native oxide upon which the NiO will deposit during the ALD. This recognition by the inventor of the dependence on OH groups for deposition is the basis for selective gate metal deposition on deposited oxides (e.g. $SiO_2$ or $Al_2O_3$), native oxides, or oxygen plasma treated surfaces (e.g. oxidized AlGaN surfaces or SiNx surfaces).

Thus, the invention utilizes selective Selective Atomic Layer Deposition (ALD) of Nickle Oxide (NiO) for the formation of Ni based gates, which only deposits NiO where Ni (or NiO) is needed. As a result, there is no risk of trapped resist residue as in liftoff based processing (III-V foundries) and there is no need for subtractive wet or dry etching (Si Foundries). Further, the use of Atomic Layer Deposition (ALD) prevents damage to the device surface that may be caused by sputtering based deposition of Ni (as would be common in Si foundries). The NiO may itself comprise the gate (like Ni it has a work function ≥5 eV), or be (completely or partially) reduced to Ni in hydrogen for Ni gate formation. Finally, the ALD metal deposition avoids physical bombardment induced surface damage that may be imparted by physical vapor deposition techniques.

The details of one or more embodiments of the disclosure are set forth in the accompanying drawings and the description below. Other features, objects, and advantages of the disclosure will be apparent from the description and drawings, and from the claims.

BRIEF DESCRIPTION OF DRAWINGS

FIG. 3A is a diagrammatical, cross-sectional sketch of an exemplary one of a plurality of gate electrode structures used in the structure of FIGS. 2A through 2T according to the disclosure;

FIG. 3A' is a diagrammatical, cross-sectional sketch of another embodiment of an exemplary one of a plurality of gate electrode structures which may be used in the structure of FIGS. 2A through 2T;

FIG. 3B is a diagrammatical, cross-sectional sketch of an exemplary one of a plurality of electrodes used as source and drain electrode structures in the structure of FIGS. 2A through 2U according to the disclosure;

FIG. 3B' is a diagrammatical, cross-sectional sketch of an exemplary one of a plurality of electrode structures used as source and drain electrode structures in the structure of FIGS. 2A through 2U according to another embodiment of the disclosure;

FIGS. 4A and 4A' is a pair of diagrammatical cross sectional sketches useful in understanding a low temperature anneal process used in forming the semiconductor structure according to the disclosure;

FIG. 5B' is a diagrammatical, cross-sectional sketch showing an enlarged portion of FIG. 5B, such portion being encircled by the arrow 5B'-5B' in FIG. 5B;

FIG. 5A' is a diagrammatical, cross-sectional sketch of a semiconductor structure according to another embodiment of the disclosure;

FIGS. 6A-6D are diagrammatical, cross-sectional sketches at various stages in the fabrication of a semiconductor structure according to another embodiment of the disclosure;

FIG. 6C' is a diagrammatical, cross-sectional sketch showing and enlarged portion of FIG. 6C, such portion being encircled by the arrow 6C-6C' in FIG. 6C;

FIG. 6D' is a diagrammatical, cross-sectional sketch of an enlarged portion of the semiconductor structure according to another embodiment of the disclosure;

FIGS. 9A-9E are diagrammatical, cross-sectional sketches at various stages in the fabrication of a semiconductor structure according to another embodiment of the disclosure; and FIGS. 10A-10G are diagrammatical, cross-sectional sketches at various stages in the fabrication of a gate electrode structure used in the semiconductor structure of FIGS. 2A-2U at various stages in the fabrication thereof according to the disclosure.

FIGS. 11A-11E are diagrammatical cross sectional sketches of steps used to fabricate a HEMT FET in accordance with the disclosure;

FIGS. 13A-13C' are diagrammatical cross sectional sketches of steps used to fabricate a HEMT FET in accordance with the still another embodiment of the disclosure;

FIGS. 14A-14K are diagrammatical cross sectional sketches of steps used to fabricate a MISFET in accordance with the still another embodiment of the disclosure.

Like reference symbols in the various drawings indicate like elements.

DETAILED DESCRIPTION

Figure 1A:
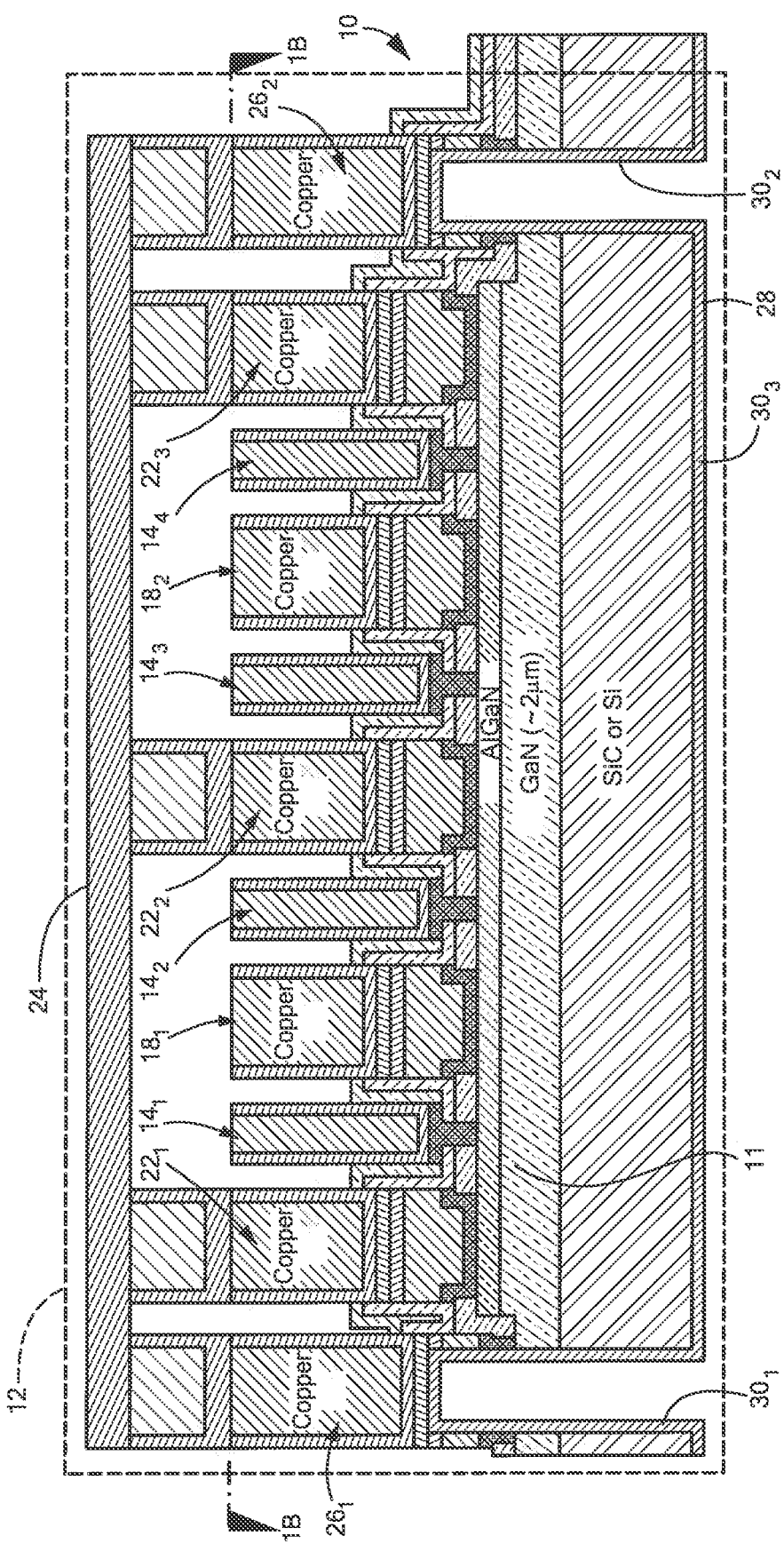
FIG. 1A is a simplified cross-sectional sketch of a Field Effect Transistor (FET), here a high electron mobility transistor (HEMT), according to the disclosure.
Figure 1B:
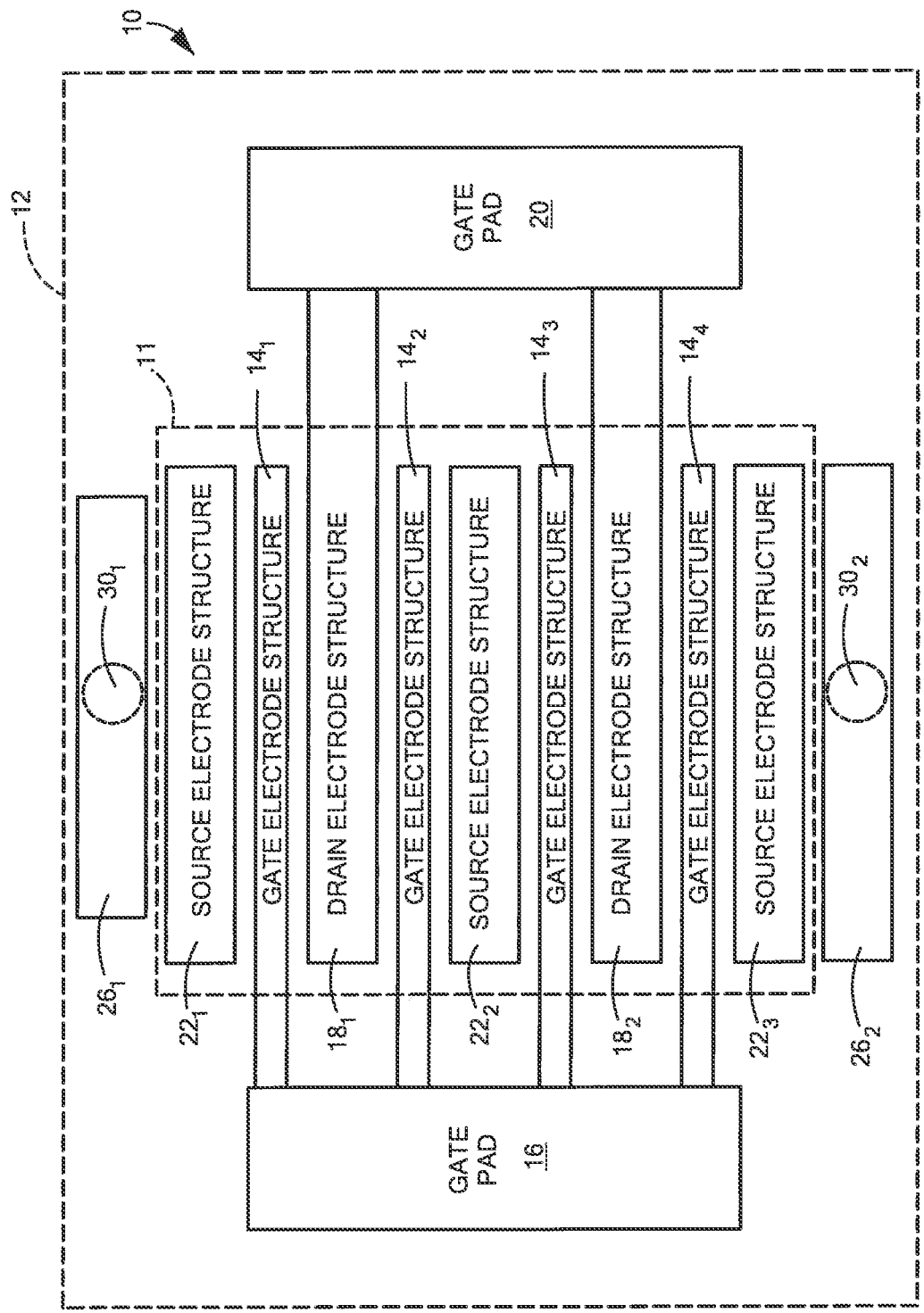
FIG. 1B is a simplified plan view of a portion of the FET of FIG. 1A, such plan view being taken along line 1B-1B of FIG. 1A.

Referring now to FIGS. 1A and 1B, a semiconductor structure 10 is shown having formed therein a multi-gate Field Effect Transistor (FET) 12, here a HEMT. The FET 12 includes a plurality of, here, for example four, gold-free, finger-like gate electrode contacts structures $14_1$-$14_4$ interconnected to a gold-free, gate pad 16; a plurality of, here for example, two, gold-free, finger-like drain electrode structures $18_1$-$18_2$ interconnected to a gold-free, drain pad 20; and a plurality of, here for example three, gold-free, source electrode structures $22_1$-$22_3$ interconnected by a gold-free, conductive interconnect structure 24, as shown in FIG. 1A. It should be understood that the number of gate electrode structures $14_1$-$14_4$, source electrode structures $22_1$-$22_3$ and drain electrode structures $18_1$-$18_2$ may be more (or less) than that shown. In any event, each one of the gate electrode structures $14_1$-$14_4$ is disposed between a corresponding one of the drain electrode structure $18_1$-$18_2$ and a corresponding one of the source electrode structures $22_1$-$22_3$ to control a flow of carriers in the semiconductor structure 10 between the corresponding one of the source electrode structures $22_1$-$22_3$ and the corresponding one of the drain electrode structures $18_1$-$18_2$. Further, two pads $26_1$, $26_2$ are provided and are connected to the ends of the conductive interconnect structure 24, as shown. These pads $26_1$, $26_2$ and connected to a conductive layer 28 formed over the bottom of semiconductor structure 10 by conductive vias $30_1$, $30_2$, respectively, passing through the semiconductor structure 10. As will be described in more detail in connection with FIGS. 2A-2T, the front or top side of the structure 10 is processed in a silicon foundry to form the multi-gate FET 12.

Figure 2A:
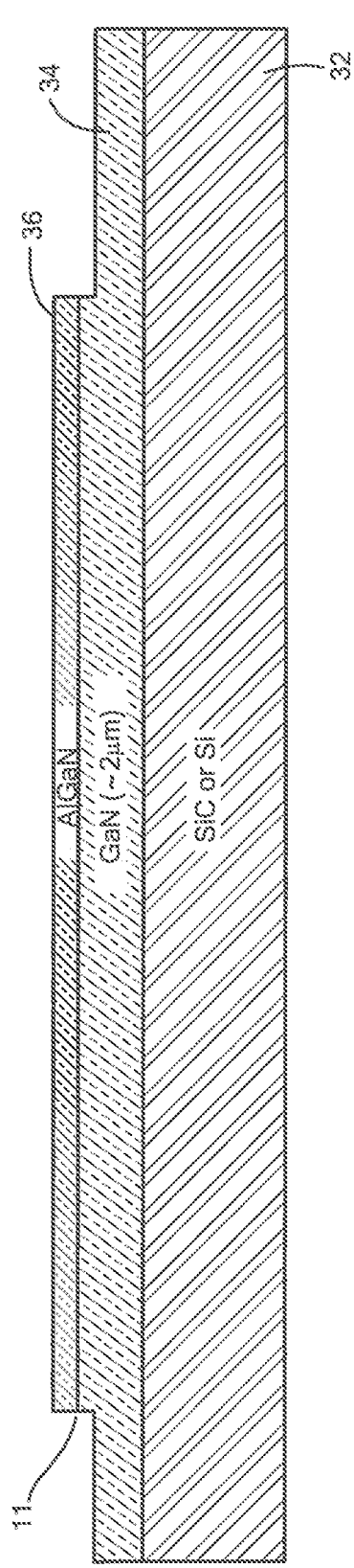
FIGS. 2A-2U are diagrammatical, cross-sectional sketches at various stages in the fabrication of a semiconductor structure at various stages in the fabrication thereof according to the disclosure, where FIG. 2U' is an exploded diagrammatical cross-sectional view of a portion of FIG. 2U indicated by the arrow 2U'-2U'.

More particularly, referring to FIG. 2A, the semiconductor structure 10 is shown in more detail to include: a substrate 32 here for example, silicon (Si), silicon carbide (SiC), or silicon on insulator (SOI). A layer of a Group III-N semiconductor layer 34 on an upper portion of the substrate 32, here for example, having a thickness of approximately ~1-5 microns over the upper surface of the substrate 32 followed by a second Group III-N semiconductor layer 36, here aluminum gallium nitride ($Al_xGa_{1-x}N$, where x is $0<x\le1$) for example having a thickness of approximately 5-30 nm, on the upper surface of the Group III-N layer 34. It should be understood that the layer 34 is here a GaN buffer structure, which also includes nucleation and strain relief layers, not shown; typically aluminum nitride (AlN) and aluminum gallium nitride ($Al_xGa_{1-x}N$, where x is $0<x\le1$). Conventional silicon (Si) foundry compatible, subtractive patterning (lithography and etching) techniques is used to remove portion of the Group III-N semiconductor layer 34 and Group III-N semiconductor layer 36 to form the mesa structure shown in FIG. 1A. It is noted, however, that the electrical isolation provided by the etched mesa structure in FIG. 1A could also be provided by ion implantation (instead of etching), here for example nitrogen, of the same masked layer. This would result in a planar structure. As will be described below, the structure 10 will be processed to form a multi-gate FET 12 shown above in FIGS. 1A and 1B. It is noted that while the finger-like gate electrode structures $14_1$-$14_4$, the drain electrode structures $18_1$-$18_2$, and the source electrode structures $22_1$-$22_3$ are on the mesa 11, the gate pad 16, drain pad 20, and two pads $26_1$, $26_2$ are off of the mesa 11.

Figure 2B:
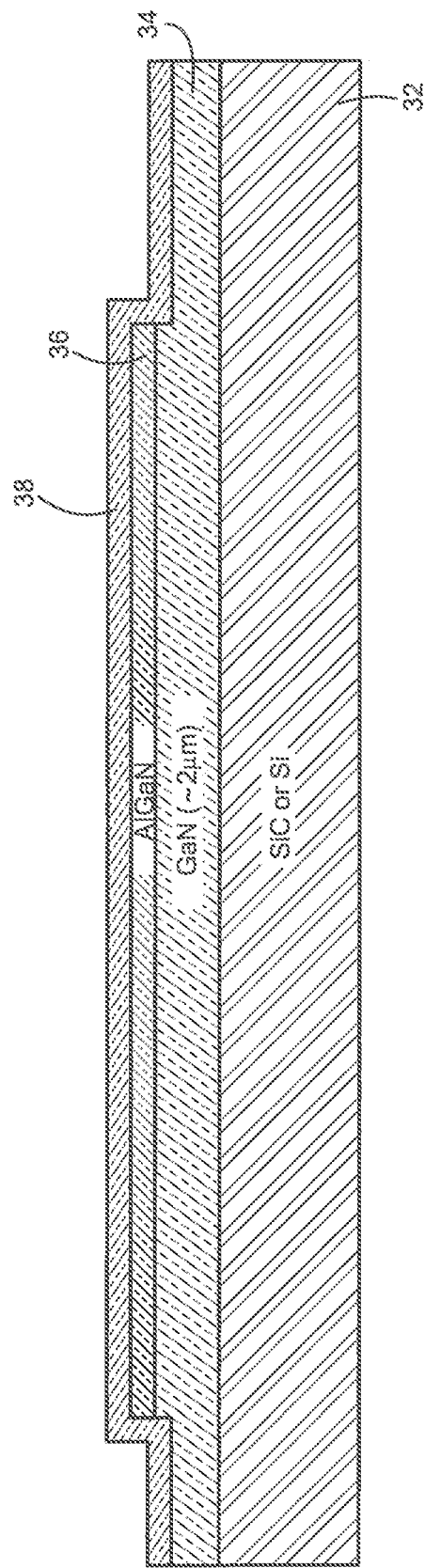
FIG. 2D' is an enlarged portion of FIG. 2D, such enlarged portion being encircled by an arrow in FIG. 2D.

Referring now to FIG. 2B the front or top side of the structure shown in FIG. 2A is coated with a passivation layer 38, here for example, silicon nitride $SiN_x$. Layer 38 is processed using conventional silicon (Si) foundry compatible subtractive patterning (lithography and etching) techniques to form windows or openings $40_1$-$40_7$ through selected portions of layer 38 with windows $40_1$ and $40_7$ thereby exposing underlying surface portions of the GaN layer 34 wherein the pads $26_1$, $26_2$, gate pad 16 and drain pad 20 (FIGS. 1A and 1B) are to be formed and windows $40_2$-$40_6$ exposing underlying portions of the AlGaN layer 36 where the source electrode structures $22_1$-$22_3$ and drain electrode structures $18_1$-$18_2$ (FIGS. 1A and 1B) are to be formed, as shown in FIG. 2C.

Referring now to FIG. 2D, electrical contact structures $42_1$ through $42_7$ are identical in construction, an exemplary one thereof, here electrical contact structures $42_1$, is shown in more detail in FIG. 3B to include: (A) a gold-free Ohmic contact structure $42_{OC}$ having: a bottom layer $42a$ of titanium (Ti) or tantalum (Ta); a layer $42b$ for example, aluminum or Si doped aluminum ($Al_{1-x}Si_x$), where the Si doping, x, is typically $\le0.05$) on the layer $42a$; and a layer $42c$, for example tantalum (Ta) or a metal nitride, here for example titanium nitride (TiN); (B) a gold-free, electrically conductive etch stop layer $42_{ES}$, here for example, nickel or molybdenum or platinum, disposed on the Ohmic contact structure $42_{OC}$; and, (C) a gold-free electrode contact, here a copper Damascene electrode contact, to be described in connection with FIG. 2K. It is noted that an etch stop layer etches at a rate at less than one half ($\le\frac{1}{2}$) the rate to a particular etchant than the rate such etchant etches through material being etched prior to reaching the etch stop layer. The layers $42a$, $42b$, $42c$ and $42_{ES}$ are disposed over the surface of the structure shown in FIG. 2C and through the openings $40_1$-$40_7$; it being noted that electrical contact structures $42_1$ and $42_7$ are disposed over, and are electrically connected to the two pads $26_1$, $26_2$ (FIG. 1B); electrical contact structures $42_2$, $42_4$, and $42_6$ are disposed over, and are electrically connected to source electrode structures $22_1$-$22_3$; electrical contact structures $42_3$ and $42_5$ are disposed over, and electronically connected to drain electrode structures $18_1$ and $18_2$, electrical contact structures $42_1$ and $42_7$ are being formed in contact with the GaN layer 34. After deposition the layers $42a$, $42b$, and $42c$ of the Ohmic contact structures $42_{OC}$ are formed using conventional silicon (Si) foundry compatible subtractive patterning (lithography and etching) techniques (specifically the Ohmic contact structures $42_{OC}$ are dry etched using a chlorine-based dry etch chemistry). The electrical contact structures $42_2$ through $42_6$ are then formed in Ohmic contact with the Group III-N semiconductor layer 36, here the AlGaN layer during an anneal process to be described. Here, for example, the electrical contact structures $42_1$ through $42_7$, is greater than 60 nm thick.

More particularly, each one of the Ohmic contact structures $42_{OC}$ is a tri-metal stack and includes: (a) the bottom layer $42a$ of Ti or Ta (which may be recessed into the upper surface portions of the Group III-N semiconductor layer 36 for structures $42_2$-$42_6$ (as shown in FIG. 2D') by chlorine plasma-based dry etching into layer 36 prior to depositing layer $42a$); (b) the aluminum-based layer $42b$, here for example, aluminum or Si doped aluminum $Al_{1-x}Si_x$ layer $42b$ (where x is less than 1; here, x is typically $\le0.05$); and (c) the top metal layer $42c$, for example tantalum or a metal nitride layer $42c$, here for example titanium nitride (TiN) on the aluminum-based layer $42b$ layer. A typical thickness for layer $42a$ and layer $42c$ is 5-30 nm, while the layer $42b$ can range from 50-350 nm depending on the metal layers chosen for the Ohmic contact three-layer structure $42_{OC}$ stack.

More particularly, in order to maintain optimum contact morphology and for contamination control, the anneal of the Ohmic contact structure $42_{OC}$ to form a semiconductor Ohmic contact is kept below the melting point of aluminum ($\le660°$ C.). Such low temperature anneals typically take longer than five ($\ge5$) minutes in a nitrogen ambient at a steady state temperature. More particularly, a first metal element of the metal to semiconductor Ohmic contact structure $42_{OC}$, here for example Ti or Ta layer $42a$, is deposited directly on or disposed in contact with the Group III-N surface here for example $Al_xGa_{1-x}N$ layer 36 and forms a metal nitride by reacting with the Group V element nitrogen in the Group III-N material interface layer 36 during the temperature ramp from ambient temperature to a steady state anneal temperature during the Ohmic contact formation anneal (also herein referred to as Ohmic anneal) of the Ohmic contact structure $42_{OC}$. It is noted that the temperature ramp is typically ≤15° C./sec when a linear temperature ramp is used, however stepped temperature ramp profiles, and mixed step and linear ramp profiles all may be used in order to optimize first metal layer 42a interaction with the Group III-N surface layer 36 in the formation of the metal nitride. Next, a second lower resistance metal, here for example aluminum layer 42b, diffuses into the first metal (here layer 42a), the formed metal nitride, and into the surface of the Group III-N material (here layer 36) during the steady state anneal process of ≤660° C. for ≥5 minutes to provide the lowest resistance Ohmic contact. Finally, in order to maximize the amount of interaction between the first and second metals, here layers 42a and 42b of the metal to semiconductor Ohmic contact structure $42_{OC}$ that forms the Ohmic contact, and the Group III-N material layer 36 at ≤600° C. temperatures, it is necessary to prevent intermixing with any third metal layer (a metal nitride or metal, here layer 42c) disposed above the two layers (here layers 42a and 42b) and in contact with the upper layer of the two (here layer 42b).

Figure 4B:
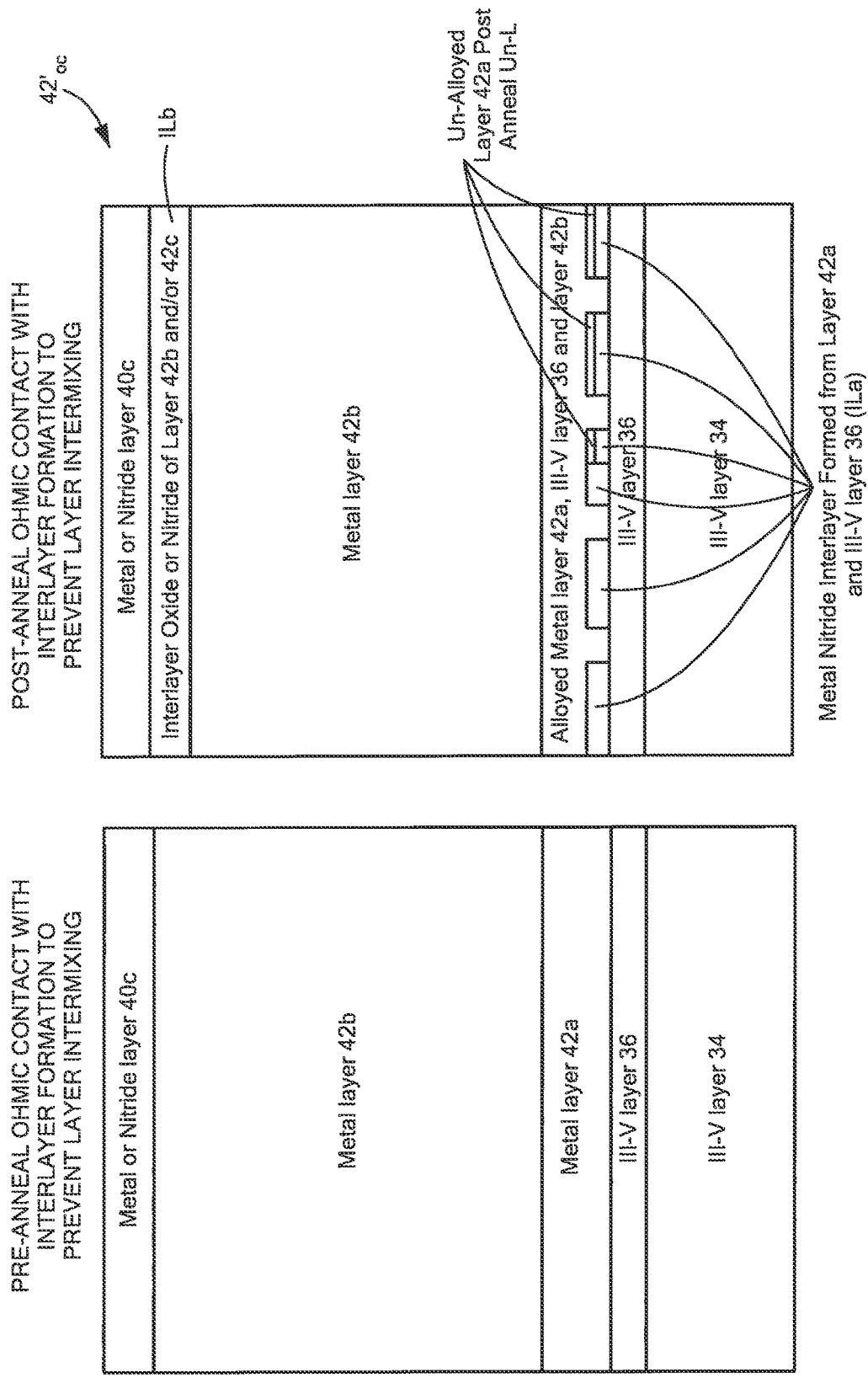
FIGS. 4B and 4B' is a pair of diagrammatical cross sectional sketches useful in understanding a another low temperature anneal process used in forming the semiconductor structure according to the disclosure.

The prevention of intermixing of the first two layers of the Ohmic contact structure $42_{OC}$ (here layers 42a and 42b) with the third (here layer 42c) can be accomplished in several ways: First, it may be accomplished by depositing the Ohmic contact structure $42_{OC}$ and annealing the Ohmic contact structure $42_{OC}$ as a two-layer stack of the first and second metals (layers 42a and 42b) with a subsequent removal of any oxidized interface (by dry etching, wet etching, or in-situ dry sputter removal of the oxidized interface) prior to third metal deposition (here layer 42c); Second, when all three metals layers 42a, 42b and 42c of the Ohmic contact structure $42_{OC}$ are deposited prior to Ohmic anneal of the Ohmic contact structure $42_{OC}$, one of the following two methods may be used to form a low temperature (≤660° C.) Ohmic contact between the Ohmic contact structure $42_{OC}$ and the Group III-N semiconductor layer 36: In the first method, and referring to FIG. 4A, a metal nitride layer (such as TiN, or TaN, here layer 42c) of the Ohmic contact structure $42_{OC}$ is disposed in contact with the second aluminum layer (42b) and resists intermixing with layer 42b during the anneal at ≤660° C., and metal layer 42a is alloyed with Group III-N layer 36 and metal layer 42b with a metal nitride Interlayer a, ILa, being formed between layer 42a and Group III-N layer 36, as shown in FIG. 4A' (it is noted that there may be some Un-alloyed portions, Un-L of layer 42a after the anneal and that the metal nitride interlayer may be discontinuous) forming a post-anneal Ohmic contact structure $42_{OC}$; In the second method, (and referring to FIG. 4B) a thin (~1-10 nm thick) partially oxidized second metal (here Aluminum layer 42b) or third metal (here Ta, TiN, or TaN layer 42c) or combination thereof, an InterLayer b, ILb, is formed by reaction with oxygen that is either present in the gases used in, or intentionally introduced into, the deposition and/or anneal apparatus during the Ohmic contact structure $42_{OC}$ deposition process or Ohmic anneal of the Ohmic contact structure $42_{OC}$. This partially oxidized metal interlayer ILb is formed between the second metal layer (here aluminum layer 42b) and the third metal or metal nitride layer (here Ta, TiN, or TaN layer 42c) or in contact with the second aluminum layer (42b) which resists intermixing during the anneal at ≤660° C. forming post anneal Ohmic contact structure $42_{OC}'$, as shown in FIG. 4B'. To put it another way, in the second method (FIGS. 4B and 4B'), the third metal layer 42c (a metal nitride or metal) is prevented from intermixing with layer 42b during annealing by the formation of an oxide interlayer ILb during the metal deposition and/or the anneal process, and the oxide interlayer ILb is formed between layer 42b and layer 42c, and metal layer 42a is alloyed with Group III-N Layer 36 and metal layer 42b, and metal nitride interlayer ILa is formed between layer 42a and Group III-N layer 36 (it is noted that there may be some un-alloyed portions Un-L of layer 42a after the anneal). Thus, in one embodiment (FIGS. 4B and 4B') the intermixing is prevented by forming a partially oxidized interlayer ILb between the second and third metals of the Ohmic contact structure $42_{OC}$ during the electrical contact structure metal deposition and/or Ohmic anneal process. In the first method (FIGS. 4A and 4A'), the intermixing is prevented by forming a metal or metal nitride layer as layer 42c.

Further optimization of the metal to semiconductor Ohmic contact resistance may also be achieved by adding a small amount of Silicon dopant to the Ohmic contact structure as noted above. Silicon may be deposited by multiple methods such as electron beam deposition and sputtering. Silicon can be deposited as a separate layer within the Ohmic contact structure $42_{OC}$ (by sputtering of a Silicon sputtering target or by electron beam deposition) or by mixing Silicon into another layer by co-sputtering pure targets (here for example silicon and aluminum) or by sputtering a Si doped target (here for example Si doped aluminum $Al_{1-x}Si_x$ layer 42b where the Si doping, x, is typically ≤0.05).

Thus, the Ohmic contact formation anneal at the low temperature may be summarized as follows: forming a metal nitride with a first metal of the Ohmic contact structure $42_{OC}$, here layer 42a, during a temperature ramping phase of an anneal process from ambient temperature to a steady state temperature; wherein a second metal of the electrical contact structure here layer 42h diffuses into the first metal and to an upper surface of the Group III-N semiconductor layer here layer 36 to reduce resistance of the Ohmic contact formed at the interface of Group III-N layer 36 and Ohmic contact structure $42_{OC}$; and wherein the first metal, in contact with the Group III-N semiconductor layer 36, and the second metal of the Ohmic contact layer 42b are prevented from intermixing with a third metal (or metal nitride) of the Ohmic contact layer 42c during the Ohmic anneal process; and wherein the first metal and the second metal and third metal (metal nitride or metal) are maintained below their melting points during the Ohmic contact formation anneal process. The prevention of intermixing of the first two metals (layers 42a and 42b) with the third metal (layer 42c) indirectly enhances the interaction of the first two metals with the Group III-N interface at low temperatures, thereby facilitating lower contact resistance. After the anneal process described above the electrically conductive etch stop layer $42_{ES}$, here for example, nickel, molybdenum or platinum is disposed on layer 42c, as shown in FIG. 3B.

Figure 2E:
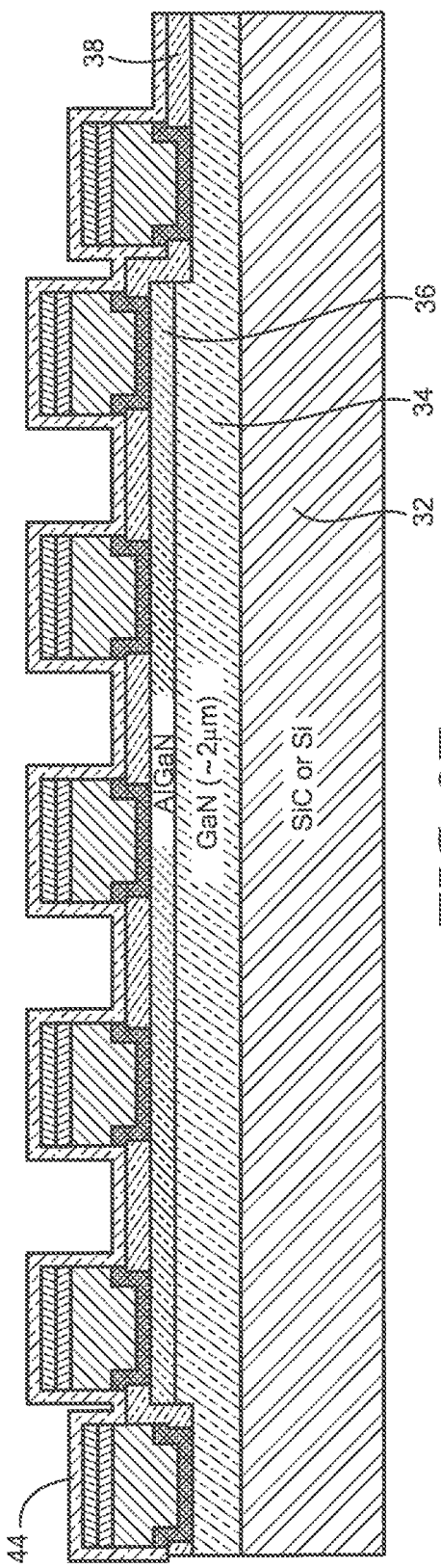

Referring now to FIG. 2E, the surface of the structure shown in FIG. 2D is coated with a dielectric layer 44, here also $SiN_x$, as shown.

Figure 2F:
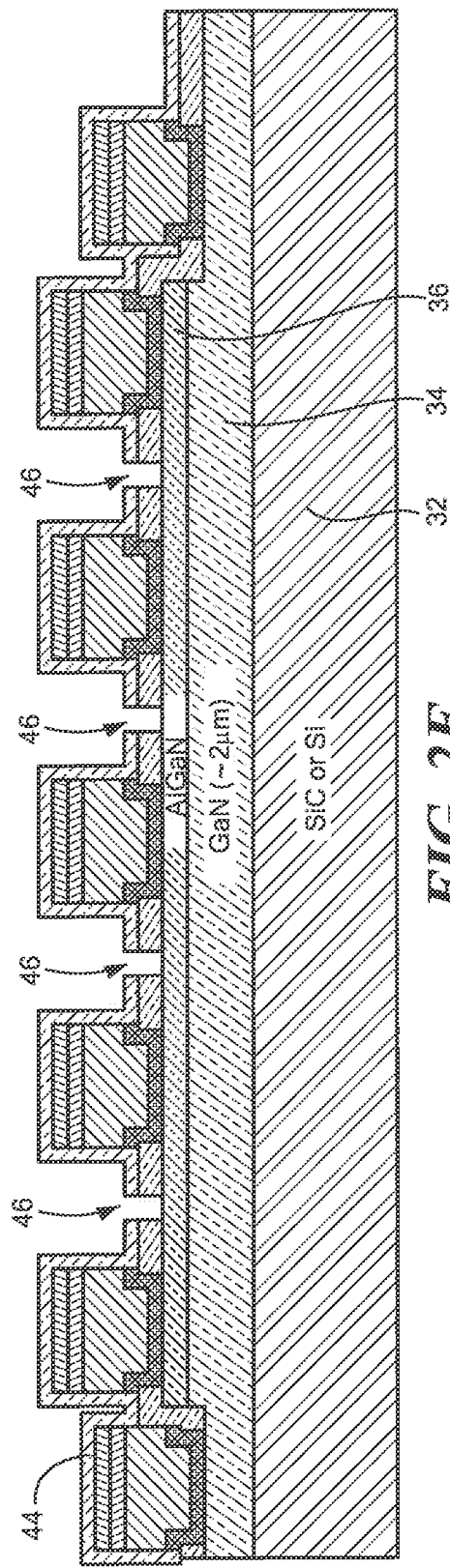

Referring now to FIG. 2F, openings or windows 46 are formed in layer 44, as shown using any conventional silicon (Si) foundry compatible lithography and etch processing techniques to expose portion of the Group III-N semiconductor layer 36 where the finger-like gate electrode structures $14_1$-$14_4$ (FIGS. 1A and 1B) are to be formed, here in this embodiment, in Schottky contact with the Group III-N semiconductor layer 36, here the AlGaN layer.

Figure 2G:
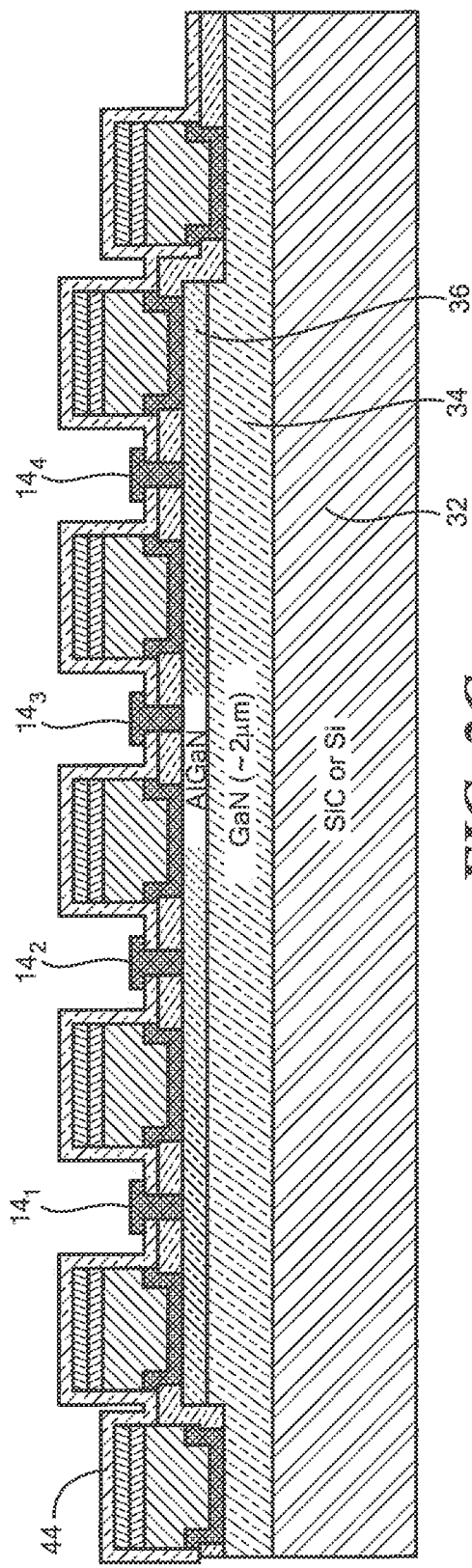

Referring now to FIG. 2G, the finger-like gate electrode structures $14_1$-$14_4$ (FIGS. 1A and 1B), to be described in more detail in FIG. 3A, are formed through the openings or windows 46 using silicon (Si) foundry compatible lithography and etch processes, as shown. More particularly, and each one of the gate electrode structures $14_1$-$14_4$ is identical in construction, an exemplary one thereof, here gate electrode structures $14_1$, is shown in detail in FIG. 3A to include: (A) gate electrical contact structure $146_{OC}$ having a gate metal layer 14a, here a single material or plurality of materials for example nickel (Ni), titanium nitride (TiN), nickel/tantalum nitride (Ni/TaN), nickel/tantalum (Ni/Ta), nickel/tantalum/tantalum nitride (Ni/Ta/TaN), nickel/molybdenum, (Ni/Mo), titanium nitride/tungsten (TiN/W), or doped suicide in Schottky contact with the AlGaN semiconductor layer 36; and (B) gold-free electrode contact, here a copper Damascene electrode contact, to be described in connection with FIG. 2K. The gate metal layer 14a, formed using conventional silicon (Si) foundry compatible, subtractive patterning techniques, here is a Schottky contact metal that forms the Schottky contact with the Group III-N semiconductor layer 36; it is noted that the gate electrical contact structure $14_{OC}$ may have a thin (typically ~2-10 nm) dielectric layer 14b, for example aluminum oxide ($Al_2O_3$), disposed between the gate metal layer 14a and the Group III-N semiconductor layer 36, as indicated in FIG. 3A to form an metal insulated gate HEMT (MISHEMT). It should be noted that the gate metal layer 14a may be T-shaped, as shown, or gamma-shaped (Γ-shaped), as shown in FIG. 3A', to form a field plate structure having an overhang portion 15 pointing in the direction of the adjacent drain electrode structure.

It is noted that the dry etches for the metals or metal nitrides comprising Schottky gate metal layer 14a will typically be chlorine-based (to etch, for example, Ni and TiN) or fluorine-based (to etch, for example, Mo, TiN, W, Ta, and TaN) or a combination thereof (to etch for example for TiN, W, Ta, and TaN). However, when Ni is used in Schottky gate metal layer 14a it can be quite difficult to dry etch due to lack of volatile etch byproducts. Therefore, nickel dry etches, here for example chlorine ($Cl_2$) and argon (Ar) gas mixtures, are primarily physical etches (sputtering) and not chemical-based etches. Since, predominately physical dry etches have poor etch selectivity to underlying layers, dry etching a Ni including Schottky layer 14a may result in unacceptable over etch into passivation layer 38 in some circumstances here for example when the thickness of the Ni in Schottky gate metal layer 14a and the dielectric in passivation layer 38 are about the same. In such cases a sacrificial dielectric layer (not shown) here for example silicon dioxide ($SiO_2$) may need to be deposited between passivation layer 38 and the overhang portion 15 of the Schottky gate metal layer 14a.

An alternative method of etching a Schottky gate metal layer 14a comprised of Ni is to employ a dry etch for a top metal (here for example TaN, Ta, Mo or a combination thereof), if present, and a wet etch (here for example HF, $H_3PO_4$, $HNO_3$, or $H_2SO_4$-based or a combination thereof) for the Ni layer. It is important to choose the Ni wet etchant of Schottky metal layer 14a such that it is highly selective to the top metal layer (if used the bottom Schottky metal layer becomes 14a' and the top Schottky layer becomes 14a" as in the description of FIGS. 10C-10G below). Additionally, the unintended removal of the nickel underneath the masked Schottky gate metal layer 14a features (herein also referred to as undercut) should be minimized so that the gate dimensions resulting from the process are repeatable and that the gate functions as intended. As a result, as the total width of the feature size masked by Schottky metal layer 14a shrinks, the thickness of the nickel layer in Schottky gate metal layer 14a will shrink as well to minimize undercut. For feature sizes less than one micron (≤1 μm) as defined by Schottky gate metal 14a the thickness of the deposited Ni of Schottky contact gate metal layer 14a is here for example likely to be ≤100 nm.

Figure 10B:
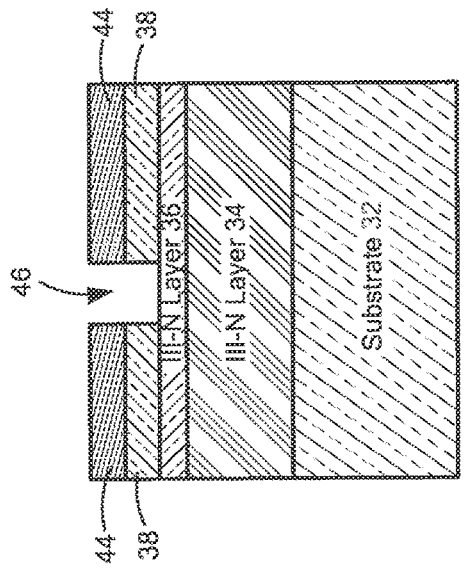
Figure 10D:
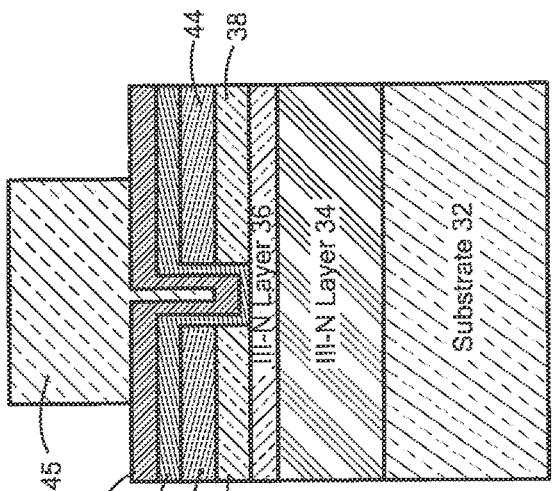
Figure 10A:
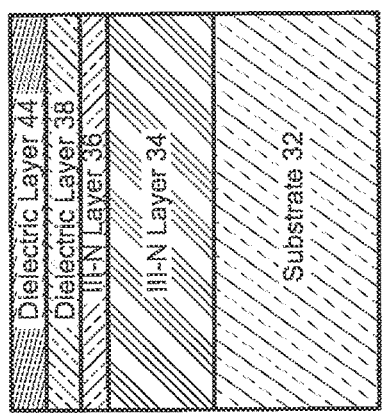
Figure 10C:
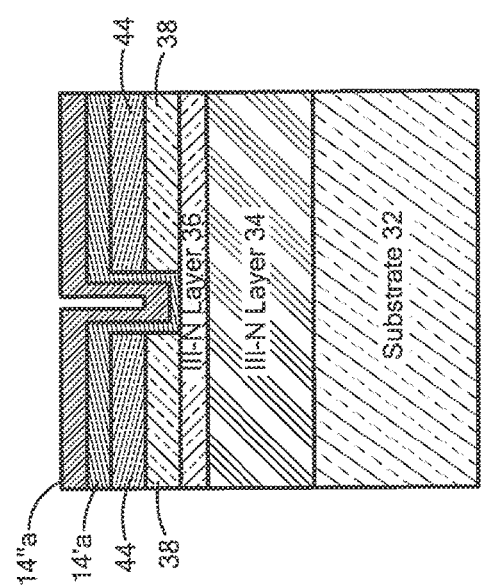

The formation of the gate electrode structures $14_1$-$14_4$ is shown in more detail in connection with FIGS. 10A-10G. Thus, after forming dielectric layer 44, here also $SiN_x$, as shown in FIG. 10A and the openings or windows 46 in layer 44, as shown in FIG. 10B, as described above in connection with FIGS. 2E and 2F, a first gate metal or Schottky contact metal layer 14'a, here for example Ni or TiN is deposited over the dielectric layer 44 and through the window 46 onto the exposed portion of the AlGaN layer 36 as shown in FIG. 10C. Next, a second gate metal layer 14"a is deposited over the first gate metal or Schottky contact layer, here TaN, Ta, Mo, or W, for example, as shown in FIG. 10C.

Next, either a photoresist or hard mask 45 is formed over a portion of the surface of the second gate contact metal 14"a in registration with the window 46, as shown in FIG. 10D. The portion of the second gate contact metal 14"a exposed by the mask is removed using a dry etch, as shown in FIG. 10E. Next, using the same mask 45, a dry or wet etch is used to remove the exposed portions of the first gate contact or Schottky contact metal 14'a, as shown in FIG. 10F. The mask 45 is then removed as shown in FIG. 10G.

Figure 2H:
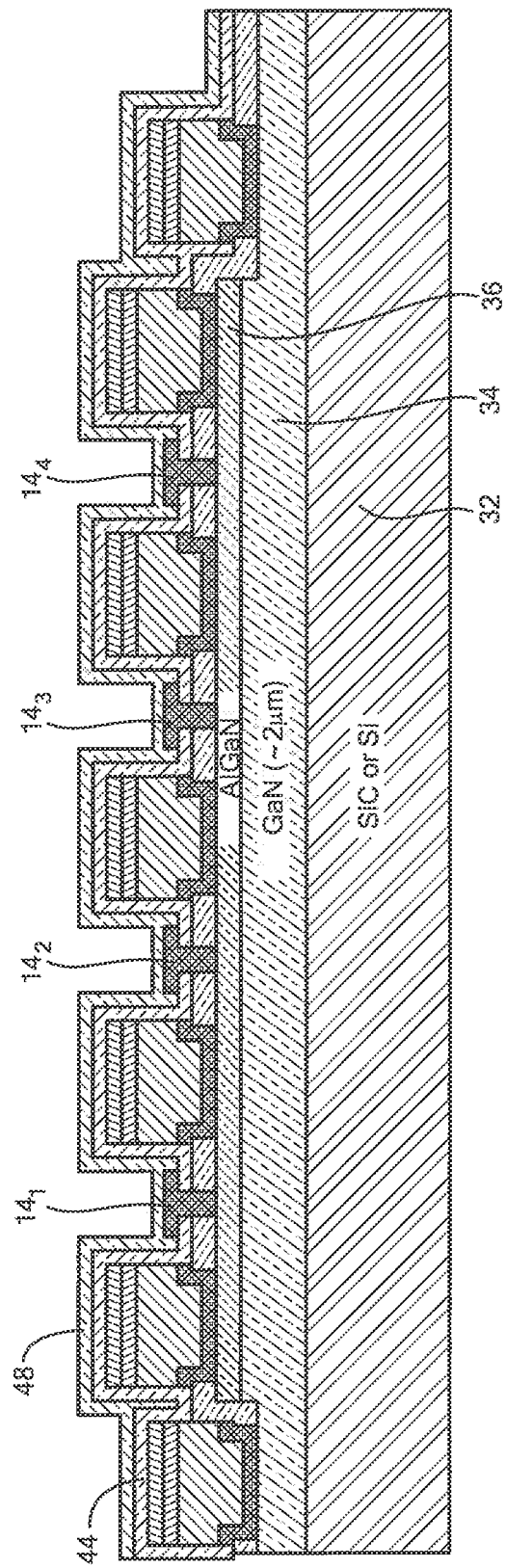
Figure 2I:
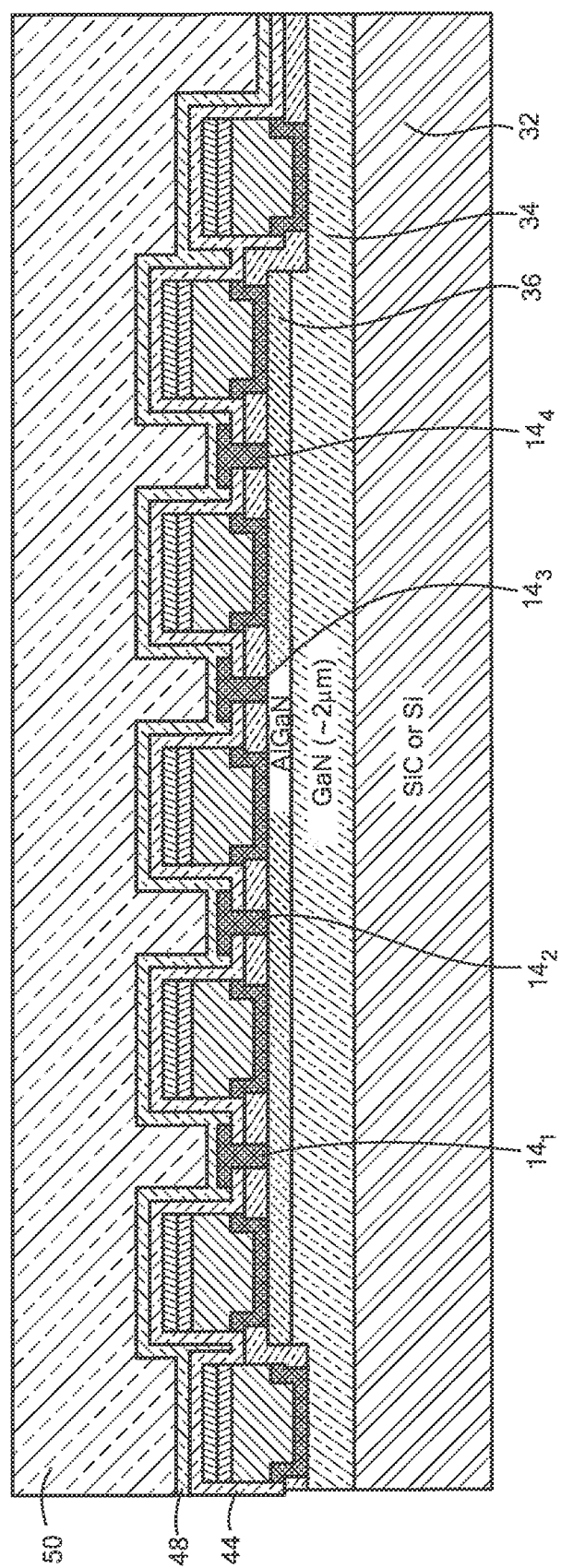
Figure 2J:
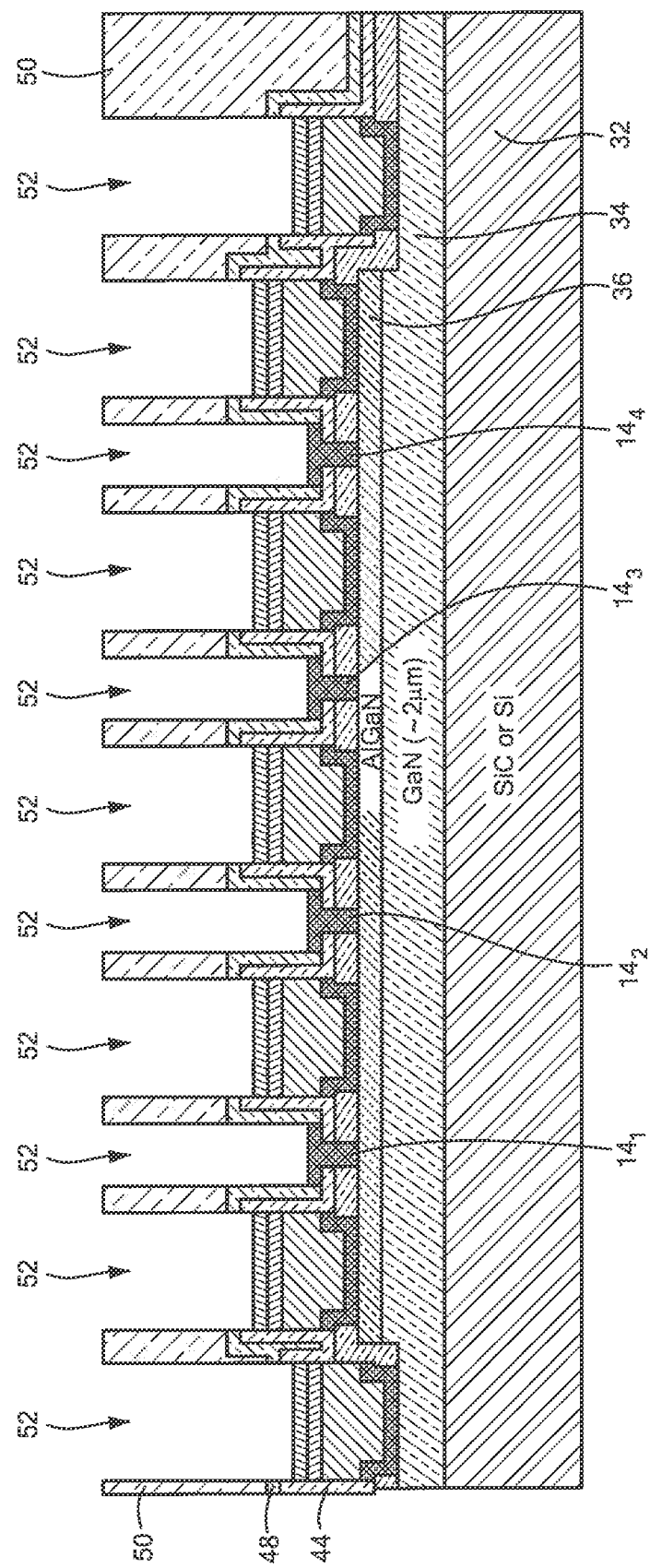
Figure 2K:
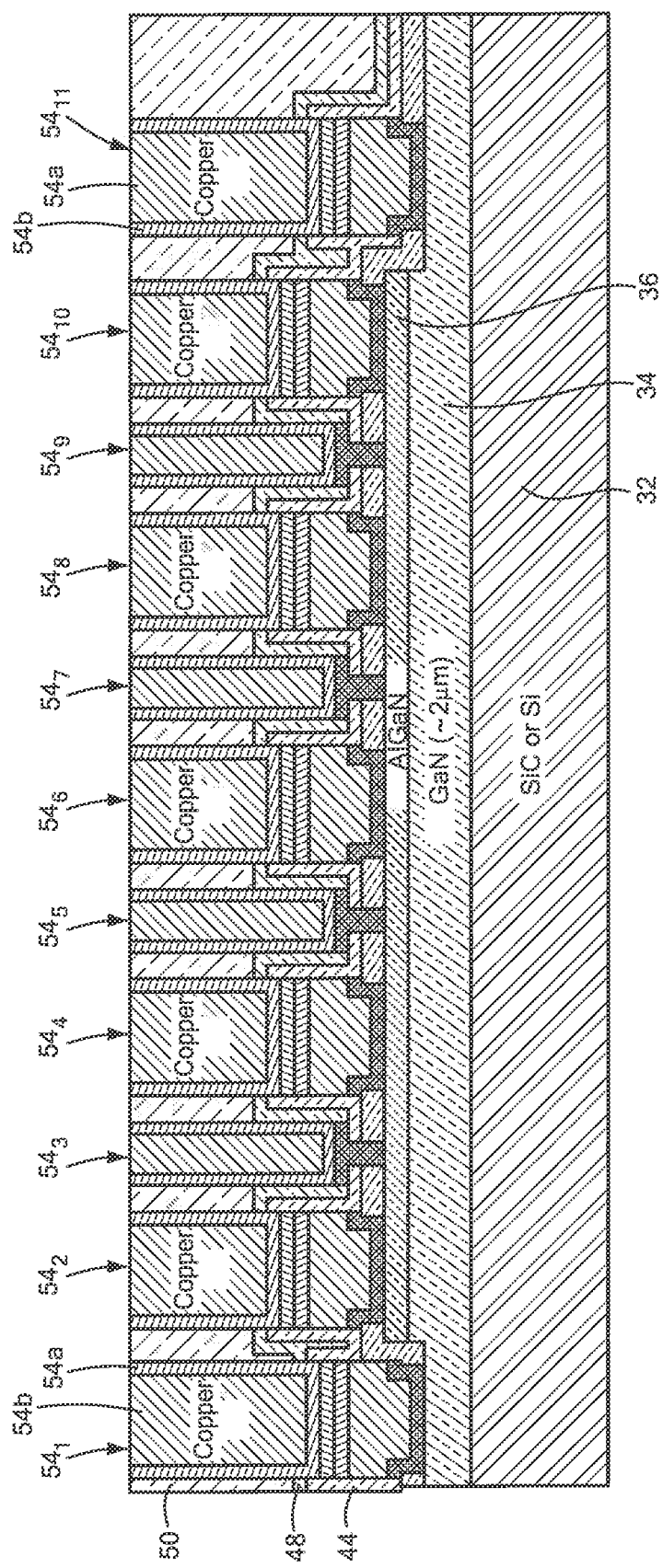

After Schottky gate metal layer 14a formation, processing continues with the formation of the aforementioned electrode contacts, here copper Damascene electrode contacts $54_1$-$54_{11}$, as shown in FIG. 2K; an exemplary one thereof, here electrodes $54_2$ being shown in detail in FIG. 3A. It is noted that the formation of each copper Damascene electrode contacts $54_1$-$54_{11}$ occurs with the deposition of two dielectric layers (here $SiN_x$ layer 48 and $SiO_2$ layer 50) as shown in FIG. 2I. The first layer 48, here $SiN_x$, functions as a diffusion barrier (when copper is disposed beneath it) and an etch stop. The second layer, here $SiO_2$ layer 50, is etched selectively to the first layer 48, here $SiN_x$, which is then etched to reveal gate metal layer 14a thereby forming the trenches into which a (sold-free material, here copper, is subsequently deposited.

Typically, copper Damascene electrode contacts $54_1$-$54_{11}$, are formed by first sputtering a thin metal seed layer (typically Ta/Cu, Ta/TaN, or TaN/Cu and ≤100 nm) to facilitate copper plating into trenches formed in the second dielectric layer. It is noted that the seed layer also functions as a copper diffusion barrier and as an adhesion layer to the dielectric. The excess copper overfill of the trenches is then removed with chemical mechanical polishing (CMP), which defines the metal interconnects by leaving only metal disposed in the trenches behind. As other copper Damascene layers are added, this process repeats as will be discussed below. Thus, the Damascene electrode contacts $54_1$-$54_{11}$, have co-planar upper surfaces.

Beginning the Damascene process described in the previous paragraph and referring now to FIG. 2H, the dielectric layer 48, here for example, SiNx, is deposited over the surface of the structure shown in FIG. 2G. Referring now to FIG. 2I, the second dielectric layer 50, here for example $SiO_2$ is deposited over layer 48 and patterned using conventional silicon (Si) foundry compatible lithography and etching techniques to form windows 52 through selected portions of layer 50 and layer 48 and thereby expose the top surfaces of the electrical contact structures $42_1$ through $42_7$ and the finger-like gate electrode structures $14_1$-$14_4$, as shown in FIG. 2J for simultaneous formation of source, drain and gate electrodes $54_1$-$54_{11}$ thereby completing the gate electrode structures $14_1$-$14_4$, drain electrode structures $18_1$-$18_2$, and drain electrode structures $22_1$-$22_3$, described above in connection with FIG. 1A.

Referring now to FIG. 2K, after the excess metal, here Cu, has been removed by CMP in the Damascene process as described above, the electrode contacts $54_1$-$54_{11}$ are formed on the exposed top surfaces of the electrical contact structures $42_1$ through $42_7$ and the finger-like gate electrode structures $14_1$-$14_4$, as shown. Each one of the electrode contacts $54_1$-$54_{11}$ is identical in construction; an exemplary one of the electrode contacts $54_1$-$54_{11}$, here an electrode contact $54_2$ for an exemplary one of the source or drain electrode structures $18_1$-$18_2$, $22_1$-$22_3$, respectively, here source electrode structure $22_1$ being shown in FIG. 3B and an exemplary one of the gate electrode contacts, here gate electrode structure $14_1$ being shown in FIG. 3A. Thus, as shown more clearly in FIGS. 3A and 3B, each electrode contacts $54_1$-$54_{11}$ includes in this example an upper layer $54b$ of copper having the bottom and sides lined with an adhesion and copper diffusion barrier layer $54a$, here for example, tantalum or tantalum nitride or a combination thereof.

Thus, each one of the drain electrode structures $18_1$-$18_2$ and each one of the source electrode structures $22_1$-$22_3$ is a multi-layer, electrical contact structure in contact with the Group III-N semiconductor layer 26 and includes: a gold-free contact layer $42_{OC}$ in Ohmic contact with the Group III-N semiconductor layer 26; a gold-free electrically conductive etch stop layer $42_{ES}$ electrically connected to the gold-free contact layer $42_{OC}$; and, one of the gold-free Damascene electrode contacts $54_2$, $54_4$, $54_6$, $54_8$ and $54_{10}$. Further, each one of the gate electrode structures $14_1$-$14_4$ includes a gold-free gate electrical contact and one of the gold-free Damascene electrode contacts $54_3$, $54_5$, and $54_7$. Further, each one of the Damascene electrode contacts $54_2$-$54_{10}$ are identical in construction and all eight Damascene electrode contacts $54_2$-$54_{10}$ are formed simultaneously.

Figure 2L:
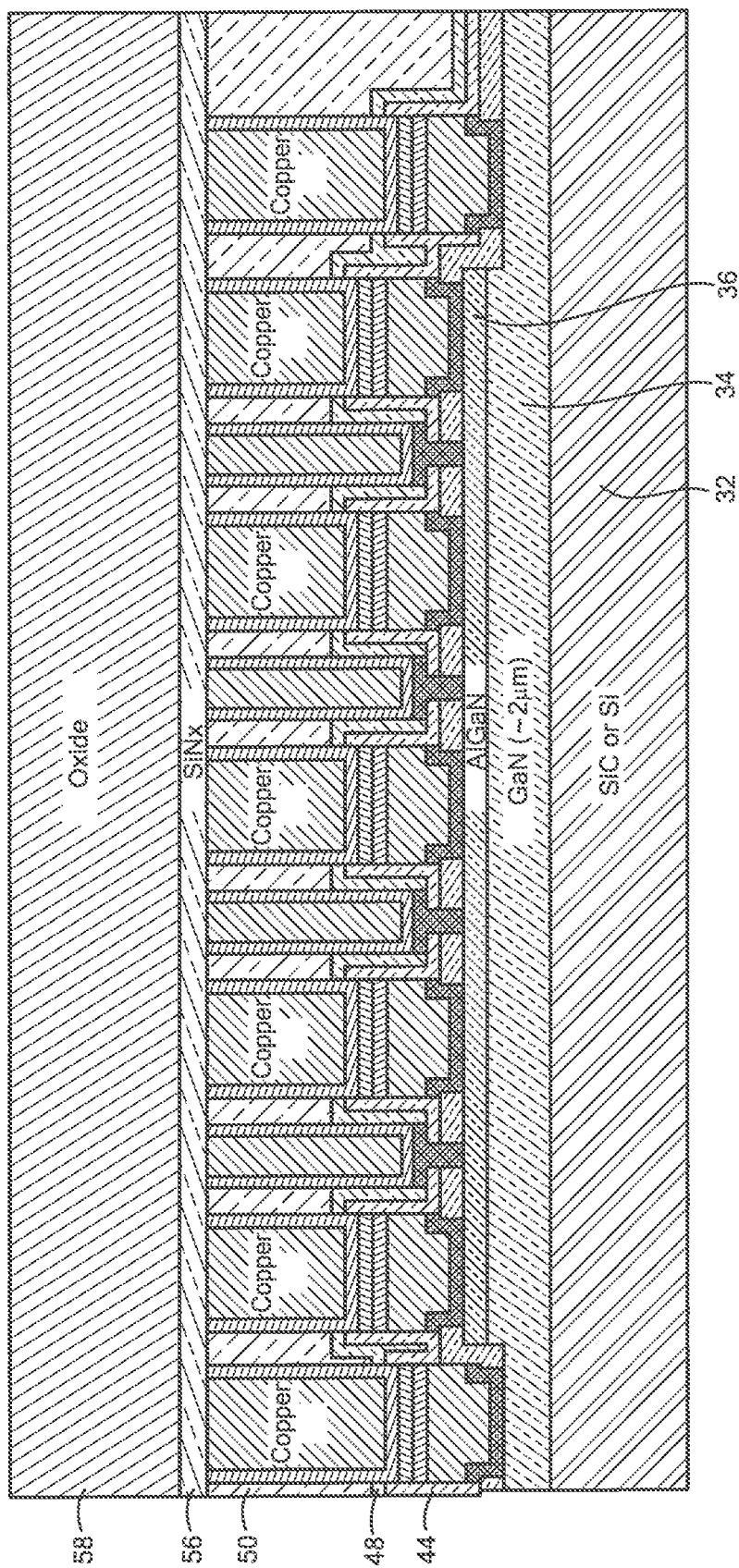

Referring now to FIG. 2L, after CMP, a dielectric layer 56, here silicon nitride (SiNx) is deposited over the surface and then layer 56 is covered with a second dielectric layer 58, here an oxide layer 58, here for example silicon dioxide.

Figure 2M:
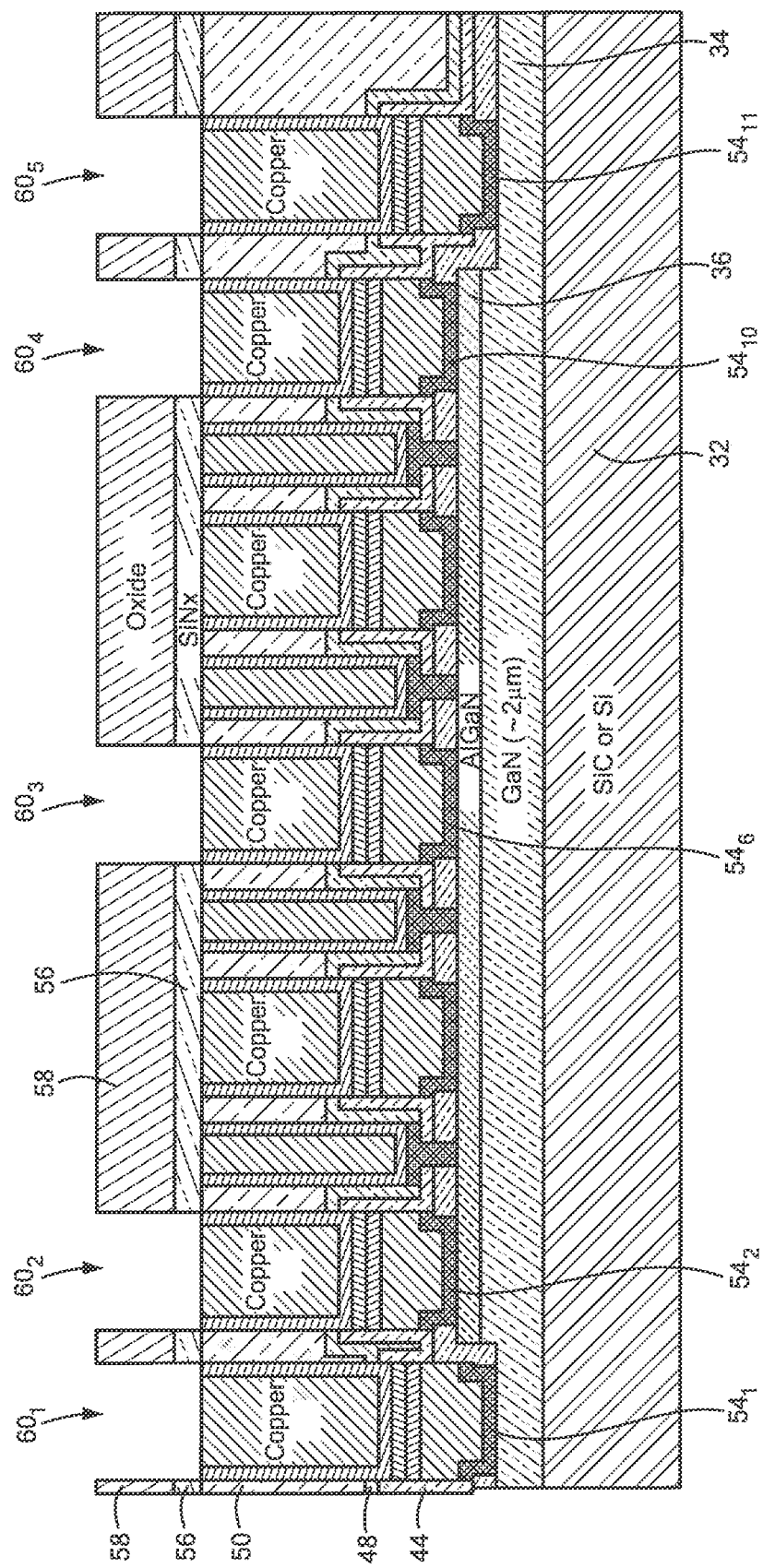

Referring now to FIG. 2M, the layers 56 and 58 are patterned using conventional silicon foundry compatible lithography and etch processing techniques to have openings or windows $60_1$-$60_5$ formed there-through over the source electrode structures $22_1$-$22_3$ (FIG. 1B) and pads $26_1$ and $26_2$ (FIG. 1B) and thereby expose the tops of the electrode contacts e $54_1$, $54_2$, $54_6$, $54_{10}$ and $54_{11}$, as shown.

Figure 2N:
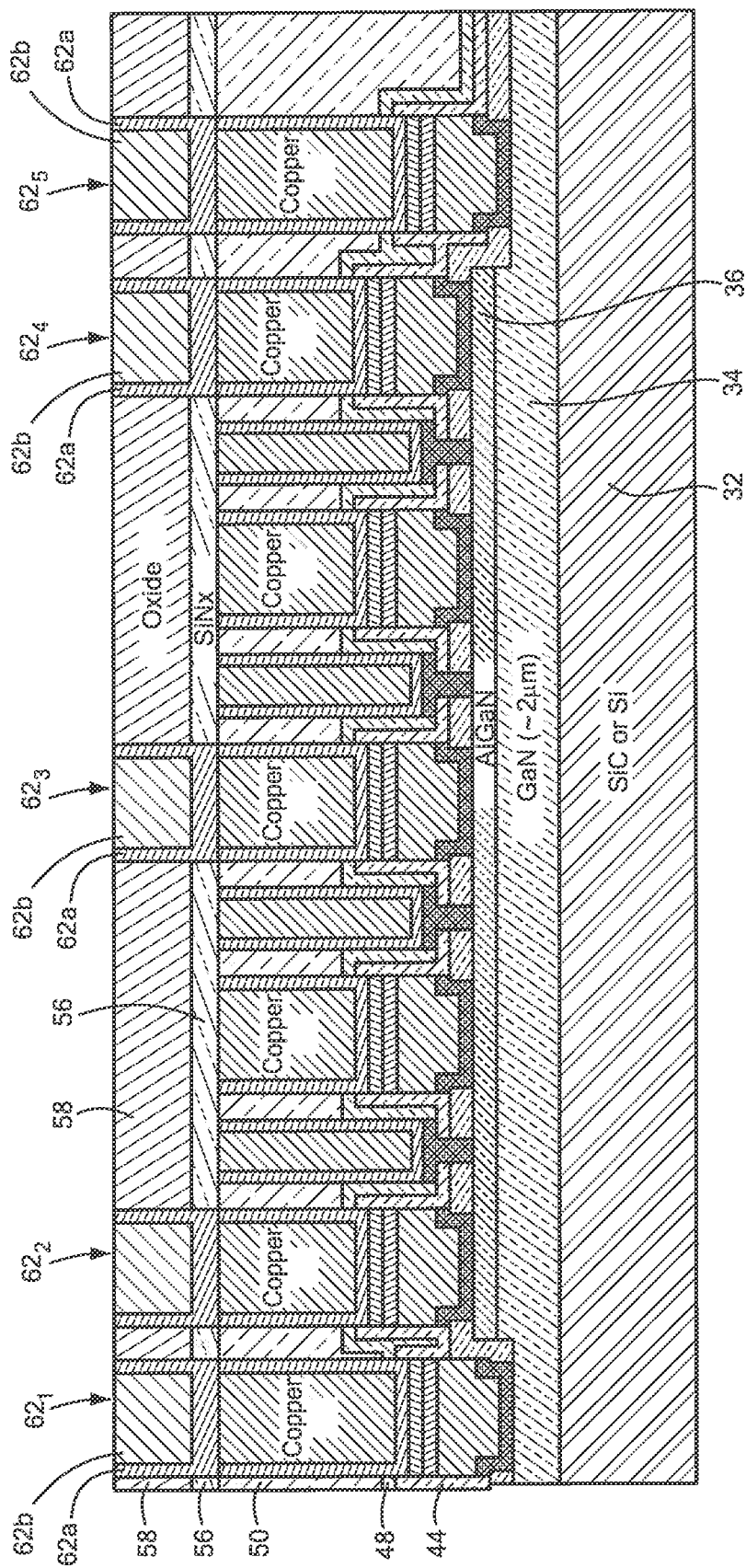
Figure 20:
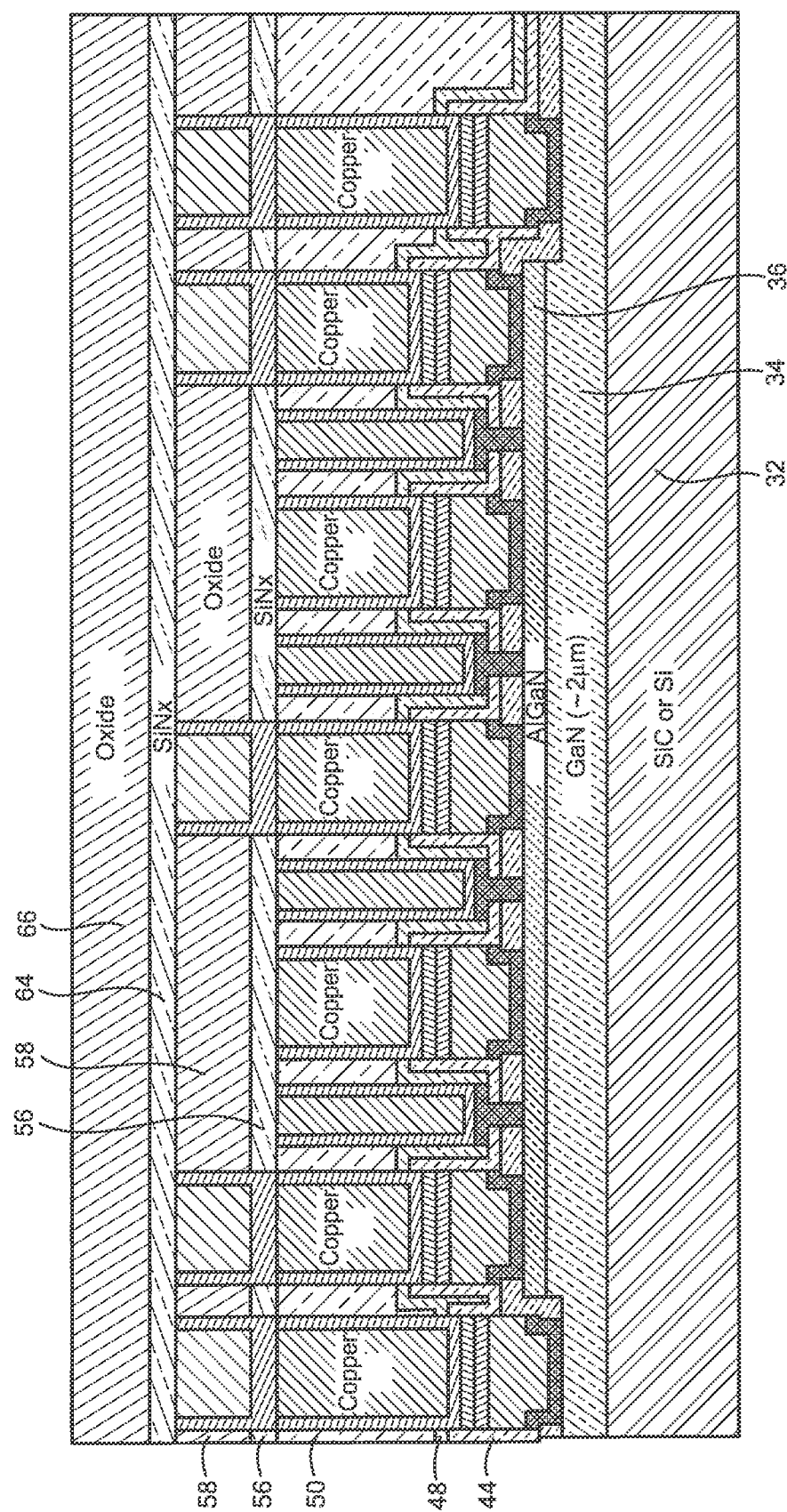

Referring now to FIG. 2N, upper electrical interconnects $62_1$-$62_5$ are formed in the windows $60_1$-$60_5$ respectively using conventional silicon foundry compatible processing techniques thereby making electrical connection to electrode contacts $54_1$-$54_{11}$, $54_1$, $54_2$, $54_6$, $54_{10}$ and $54_{11}$, respectively, and hence to the source electrode structures $22_1$-$22_3$ (FIG. 1B) and pads $26_1$ and $26_2$ (FIG. 1B). Each one of the upper electrical interconnects $62_1$-$62_5$ is constructed the same as each one of the electrode contacts 541, $54_2$, $54_6$, $54_{10}$ and $54_{11}$ and includes an upper layer $62b$ of copper having the bottom and sides lined with an adhesion and copper diffusion barrier layer $62a$, here for example, tantalum (Ta) or tantalum nitride (TaN) or a combination thereof.

Referring now to FIG. 2O, a dielectric layer 64, here SiNx is formed over the structure shown in FIG. 2M followed by a dielectric layer 66 of silicon dioxide.

Figure 2P:
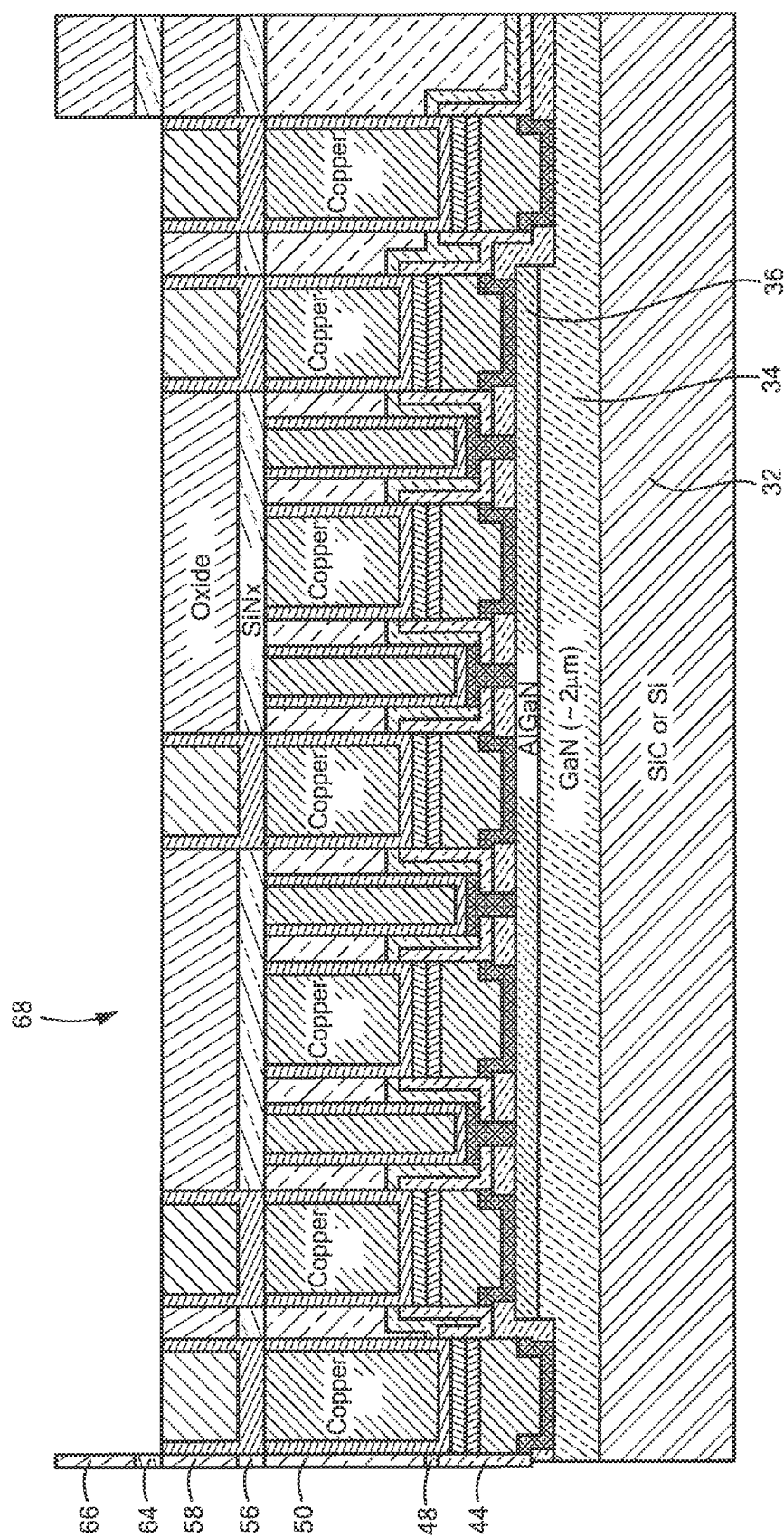

Referring to FIG. 2P, a window 68 is formed through a selected portion of the layers 64, 66 to expose the tops of upper electrical interconnects $62_1$-$62_5$.

Figure 2Q:
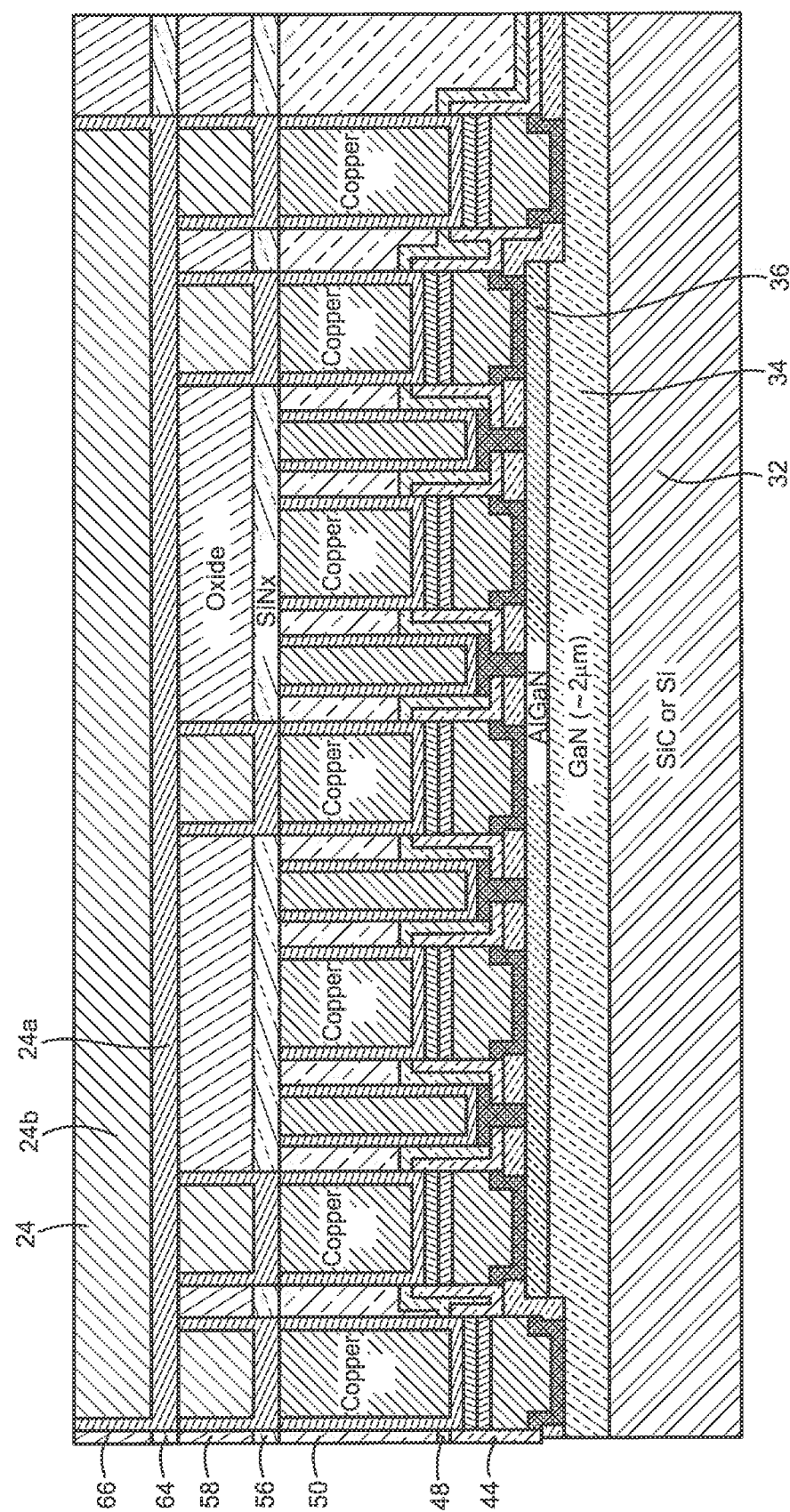

Referring now to FIG. 2Q, the conductive interconnect structure 24 (FIGS. 1A, 1B) is formed like the upper electrical interconnects $62_1$-$62_5$ includes an upper layer $24b$ of copper having the bottom and sides lined with an adhesion and copper diffusion barrier layer $24a$, here for example, tantalum or tantalum nitride or a combination thereof.

Figure 2R:
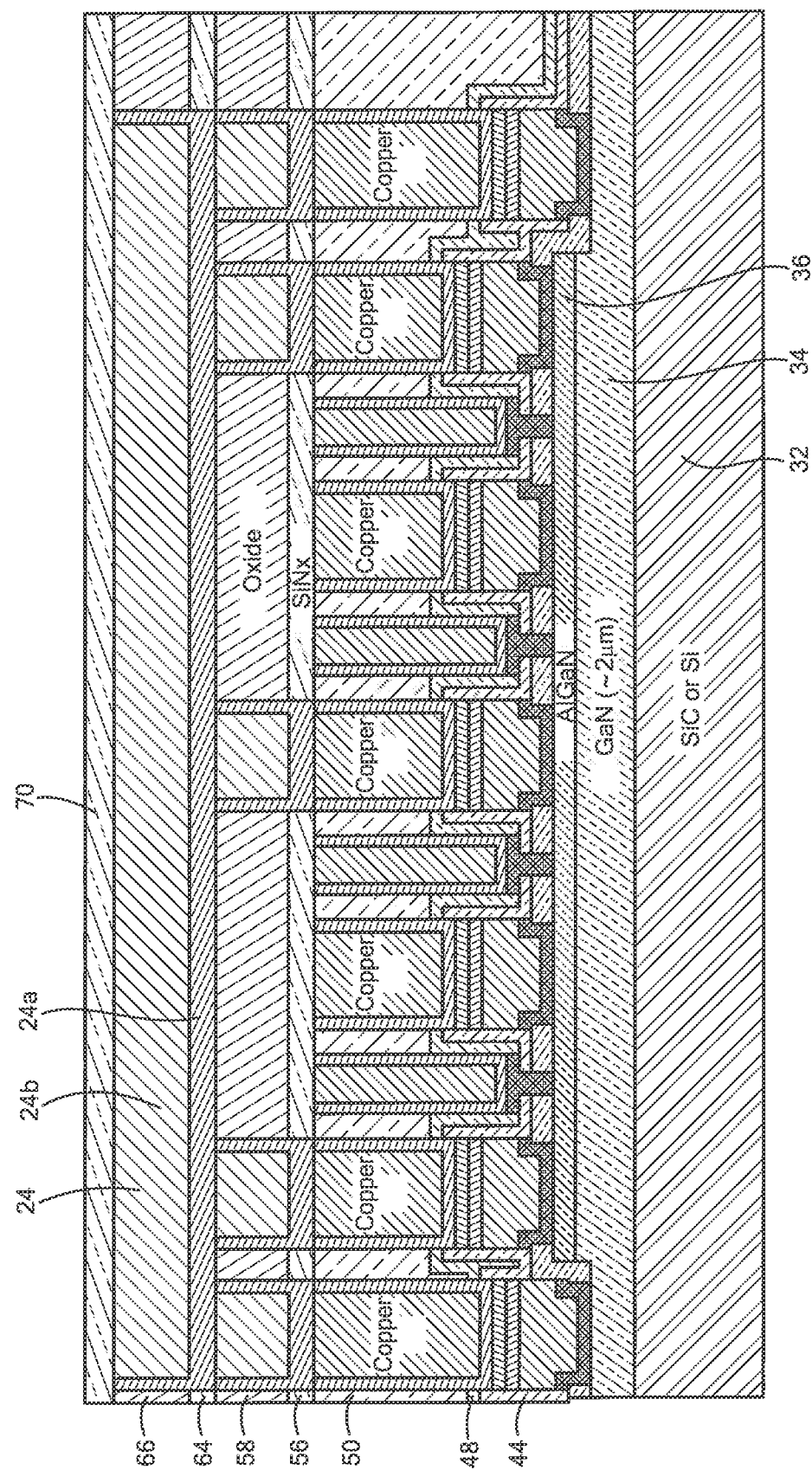

Referring to FIG. 2R, a dielectric layer 70, here $SiN_x$ is formed over the surface of the structure shown in FIG. 2Q. It should be noted that additional Cu-based interconnect layers, if needed, may be added in a manner identical to the Cu interconnect layers described above. After the addition of the final interconnect layer, a test pad layer or Input/Output pads (not shown) may be added for facilitate final testing or connection to other circuits (not shown), respectively. At this point front-side processing is complete.

Figure 2S:
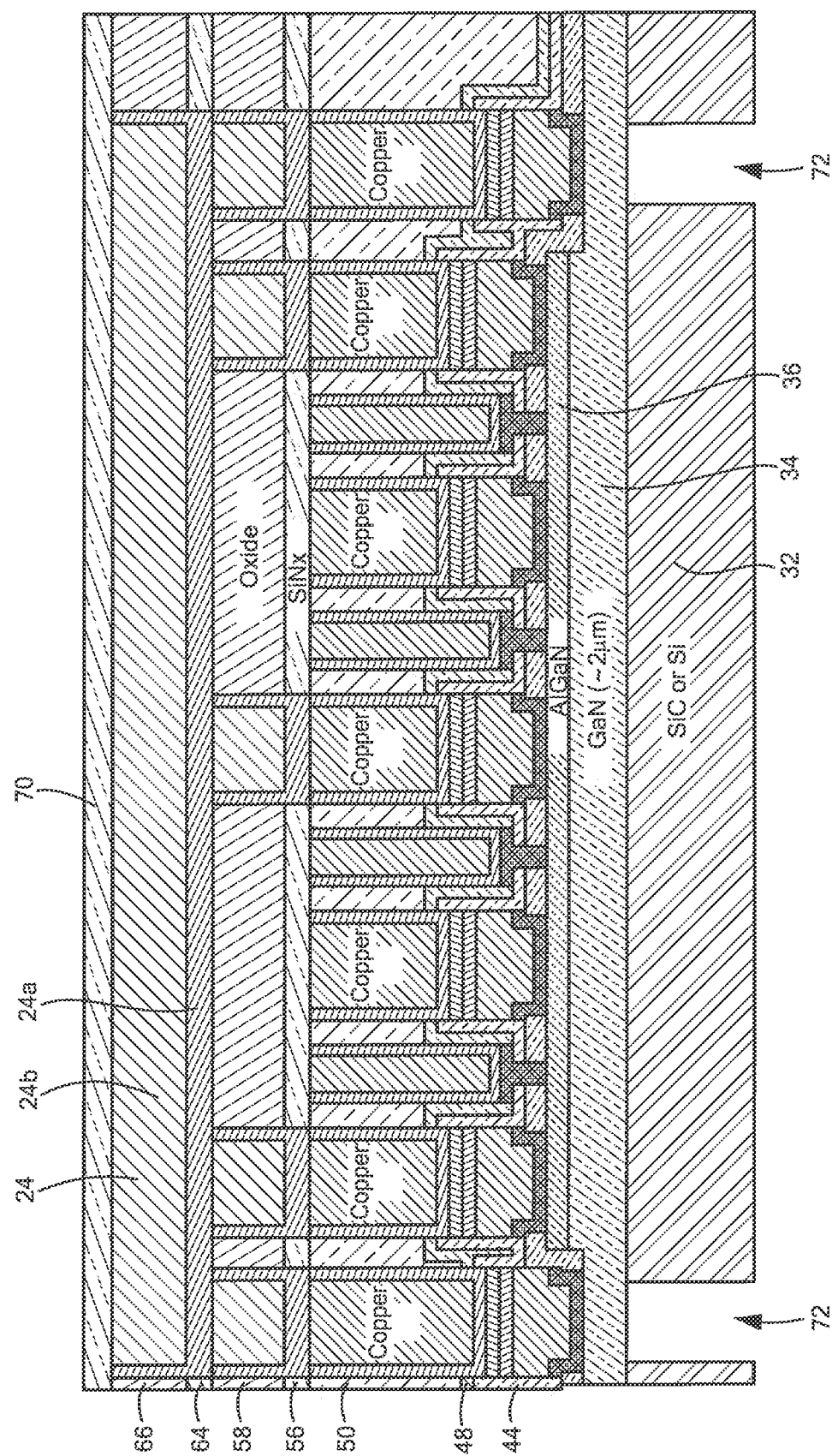

After the completion of front-side processing, and referring now to FIG. 2S, the back-side processing begins. More particularly the wafer is mounted face down on a temporary carrier, not shown, the wafer is then thinned, here for example to 50 or 100 microns. The exposed bottom surface of such structure is masked to expose portions of the bottom of the substrate 32 under the electrode contacts $54_1$ and $54_{11}$. Next, via boles 72 are formed in the exposed portions by etching from the bottom of the SiC or Si substrate 32 using a dry fluorine-based etch, here, for example sulfur hexafluoride ($SF_6$).

Figure 2T:
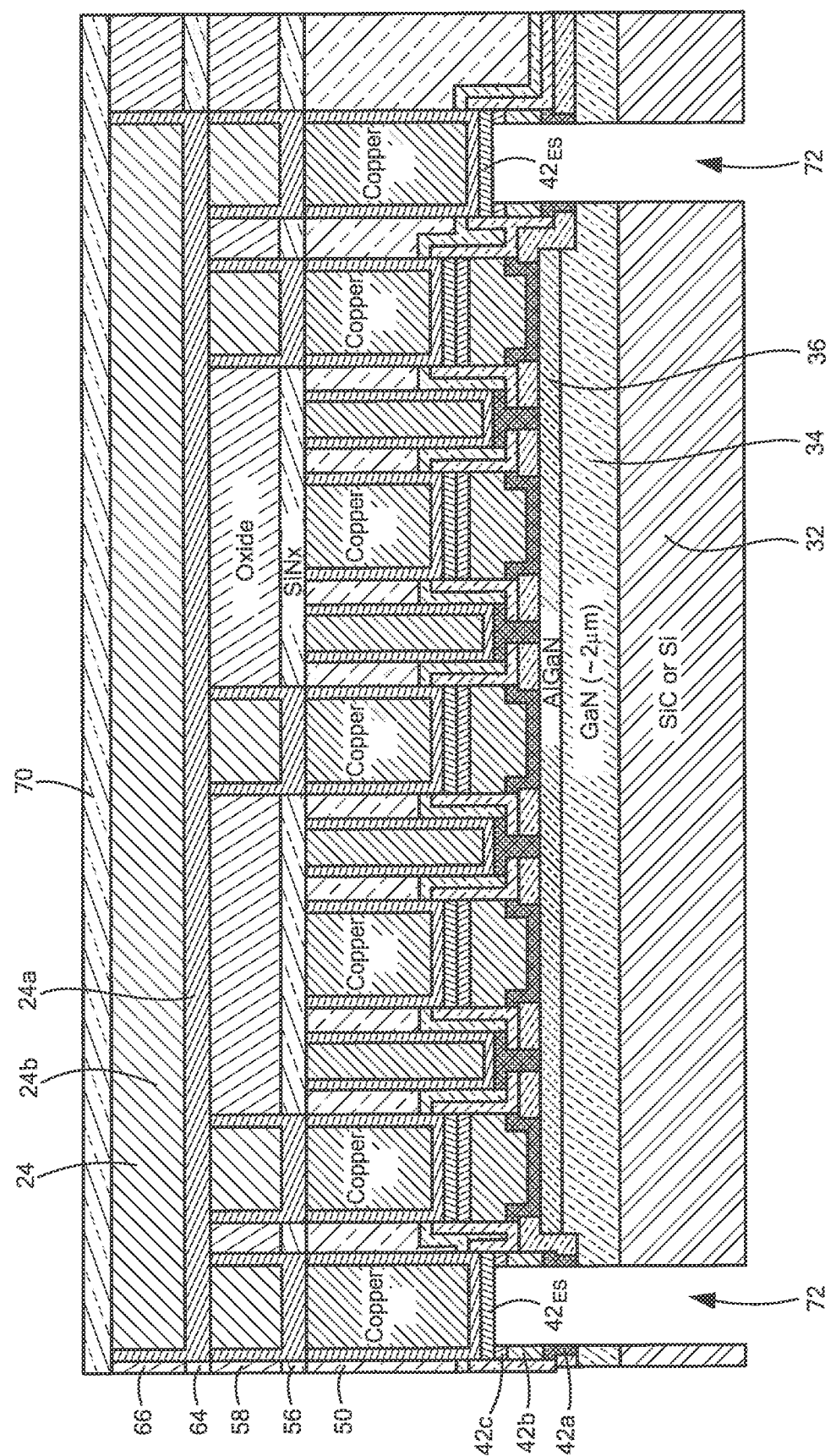

Referring now to FIG. 2T, the bottom surface of substrate 32 is exposed to a dry chlorine-based etch, here for example a combination of boron tri-chloride ($BCl_3$) and chlorine ($Cl_2$), to continue the depth of via holes 72 (as indicated by the arrows 74) by etching through the exposed portions of the Group III-N layer 34 and then through exposed inner portions of the Ti or Ta layer $42a$, then through inner portions of the aluminum-based layer $42b$, then through exposed inner portions of the metal nitride layer $42c$ of the Ohmic contact structures $42_{OC}$ of the electrode contacts $54_1$ and $54_{11}$; the etching then stopping at the etch stop layer $42_{ES}$ on the electrical contact structures 42 under the electrode contacts $54_1$ and $54_{11}$, as indicated.

Figure 2U:
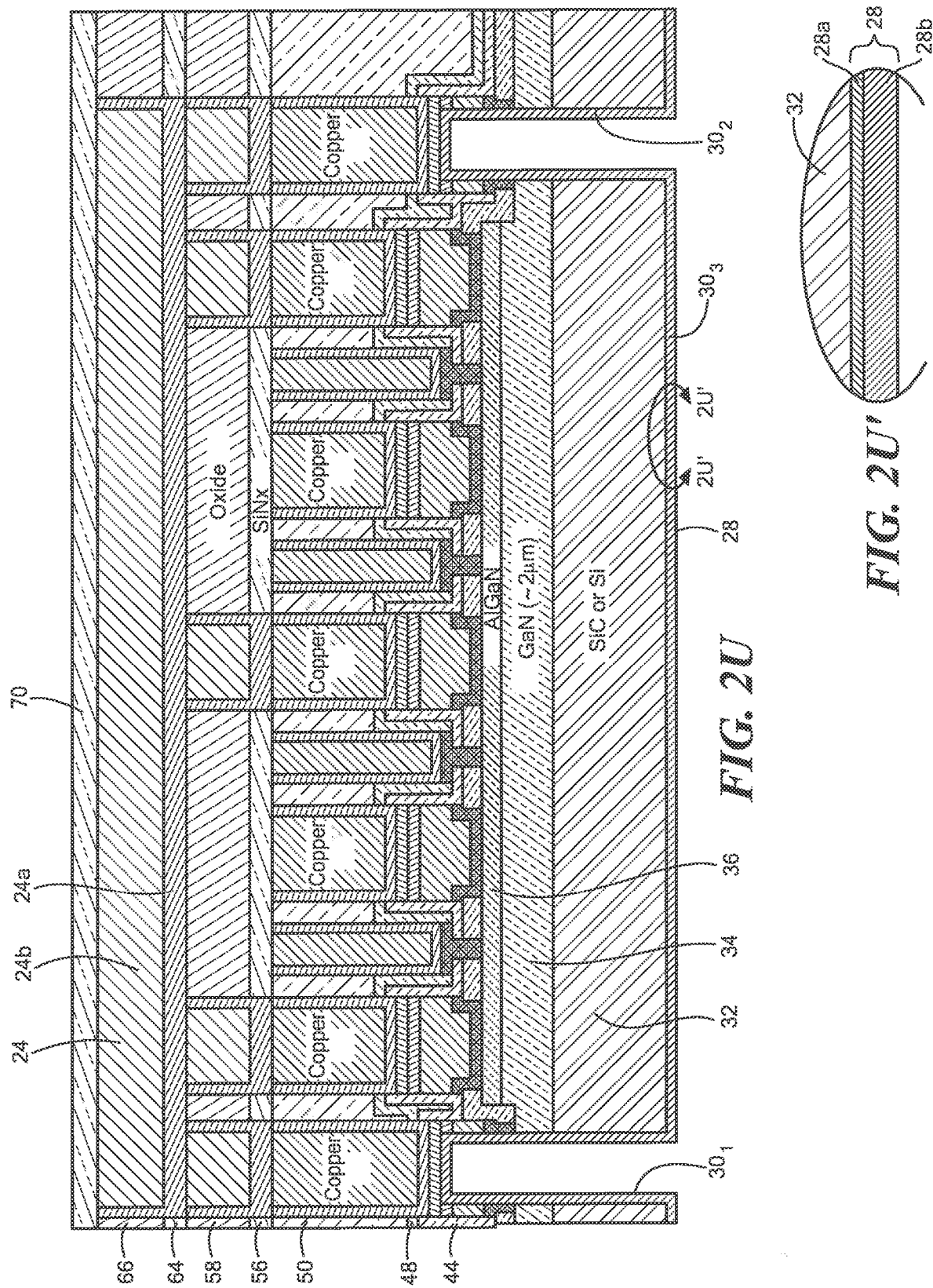

Next, referring to FIG. 2U, the bottom of the structure of FIG. 2T has the conductive layer 28 (FIG. 1A) disposed on the bottom of substrate 32 and into via hole, 72. Here, for example, the layer $28b$ is copper with an adhesion and copper diffusion barrier layer $28a$, here for example, tantalum or tantalum nitride or a combination thereof (as shown in FIG. 2U') to form the conductive vias $30_1$ and $30_2$ (FIG. 1A) and a ground plane conductor $30_3$. The conductive vias $30_1$ and $30_2$ electrically interconnect the ground plane conductor $30_3$ to the front side metallization layers and ultimately to the interconnect source electrode structures $22_1$-$22_3$ through etch stop layer $42_{ES}$ to bottom of electrode contacts $54_1$ and $54_{11}$ (FIGS. 1A and 1B). It should be understood that the conductive vias $30_1$ and $30_2$ and ground plane $30_3$ can have layer 28 comprised of alternate metals here, for example a gold (Au) layer $28b$, and a titanium (Ti) car titanium/platinum (Ti/Pt) layer $28a$. In this case, the back-side processing would be performed in an area where gold would not present any contamination problems.

Thus, here, in the embodiment described above in connection with FIGS. 2A through 2U, after front-side processing and back-side wafer thinning, a back-side via hole 72 is formed using chemical dry etching with a two-step etch process that terminates on the electrically conductive etch stop layer $42_{ES}$. In the first step of the via hole etch process, via holes are formed in exposed portions of the bottom of the SiC or Si substrate layer 32 using a dry fluorine-based etch for example, sulfur hexafluoride ($SF_6$). This fluorine-based etch stops selectively on Group III-N layer 34 such as gallium nitride (GaN) and aluminum nitride (AlN). In the second step, the bottom surface of the exposed Group III-N layer in the via hole 72 is exposed to a dry chlorine-based etch, for example a combination of boron tri-chloride ($BCl_3$) and chlorine ($Cl_2$). This chlorine-based back-side via hole 72 dry etch continues the via hole etching through the Group III-N layers 34 and 36 (in the example shown in FIG. 2, "off" mesa etches only need to etch through Group III-N layer 34 after etching through substrate layer 32) and the metal to semiconductor electrical contact structure and terminates on the conductive etch stop layer $42_{ES}$ here for example nickel or molybdenum or platinum.

Figure 5A:
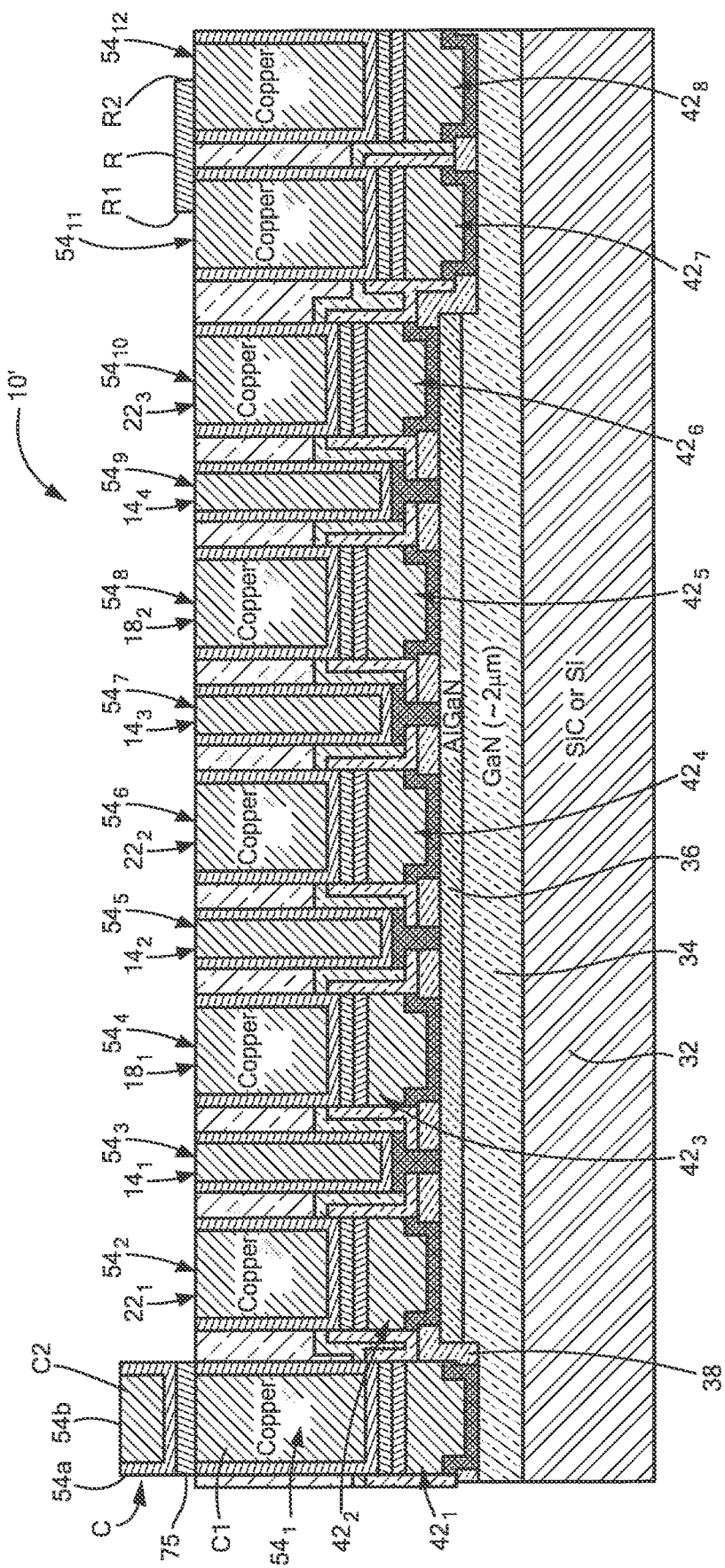
FIGS. 5A-5C are diagrammatical, cross-sectional sketches at various stages in the fabrication of a semiconductor structure according to another embodiment of the disclosure.
Figure 54A:
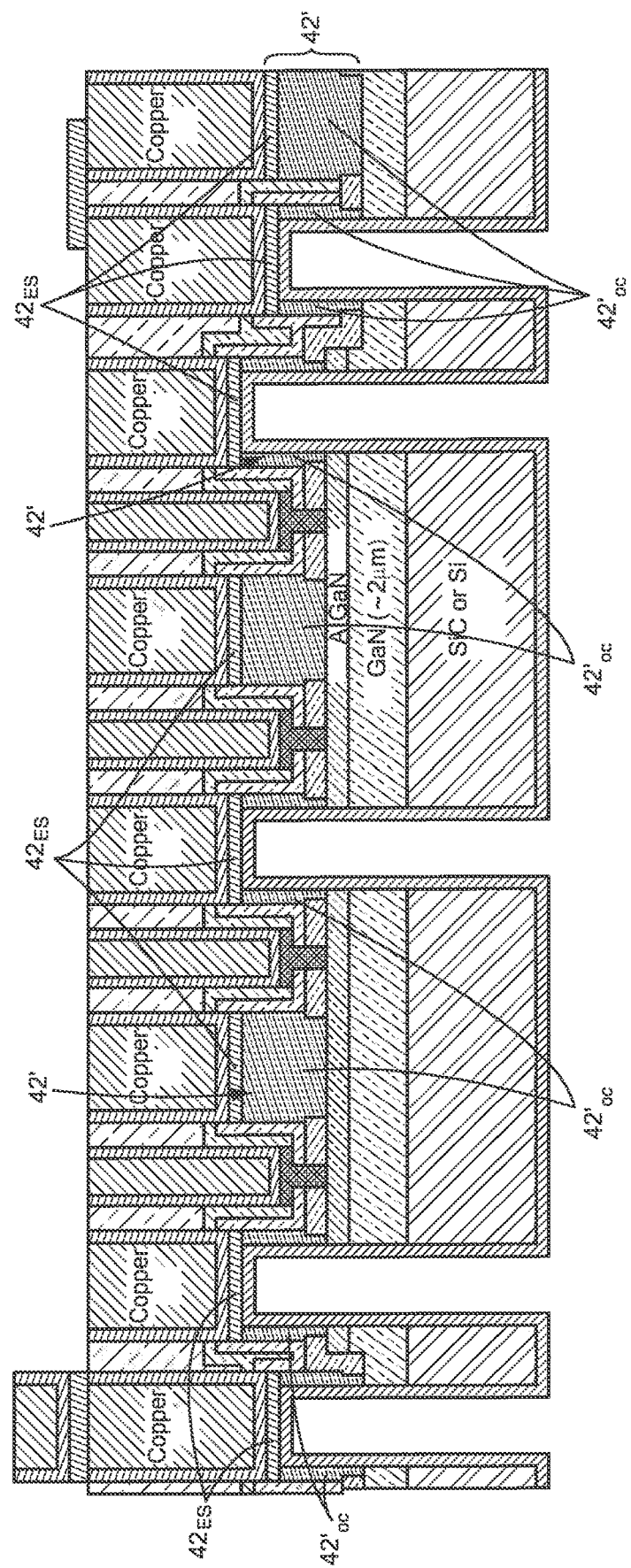
Figure 5B:
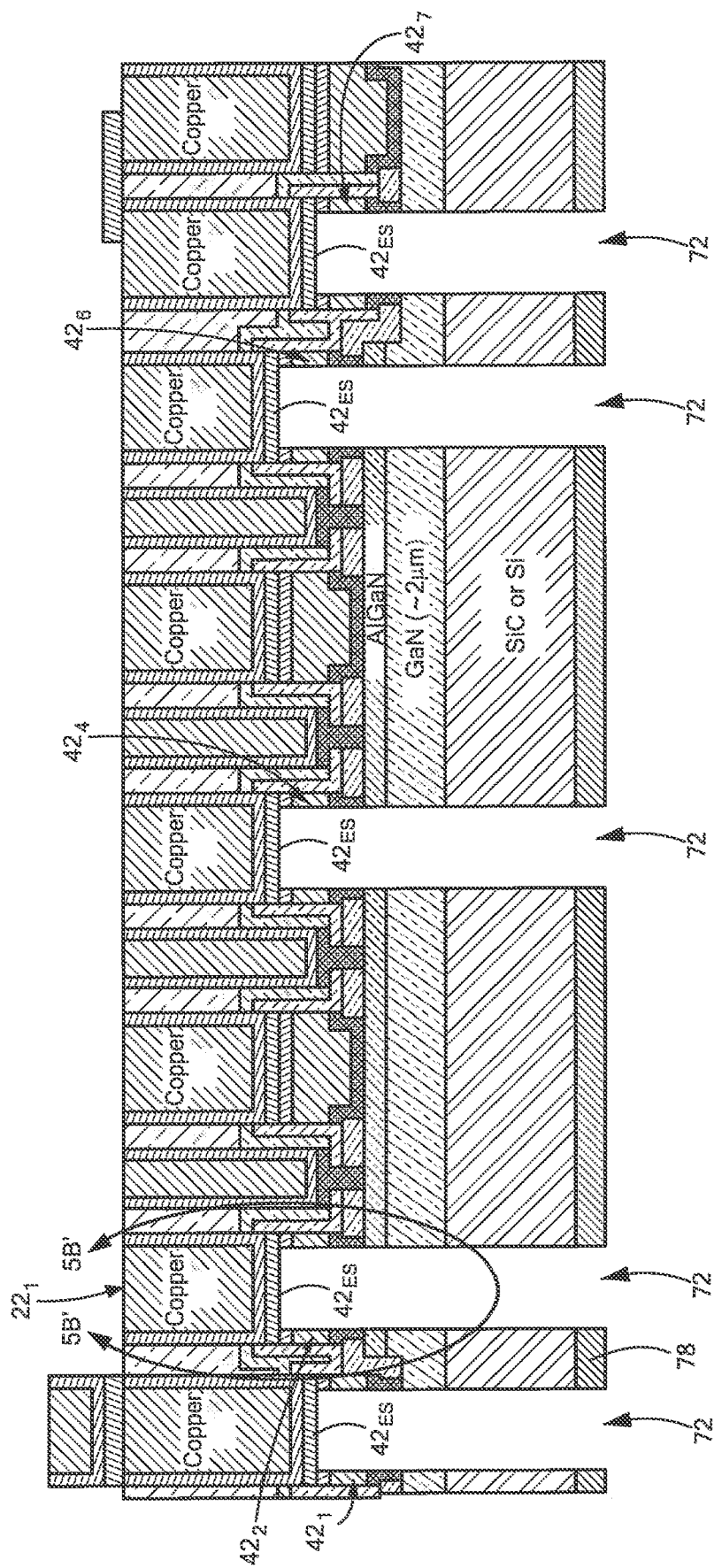
Figure 5B:
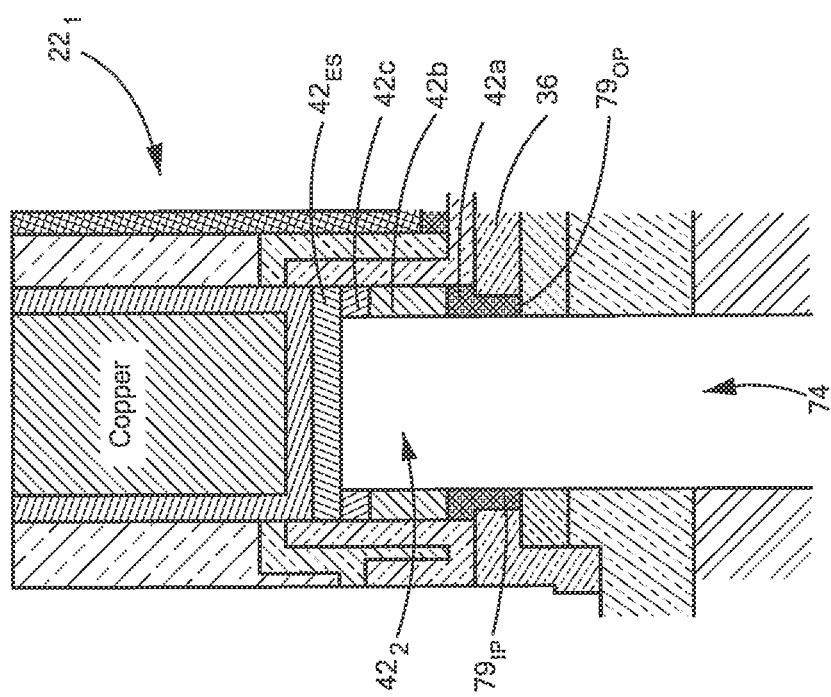
Figure 5C:
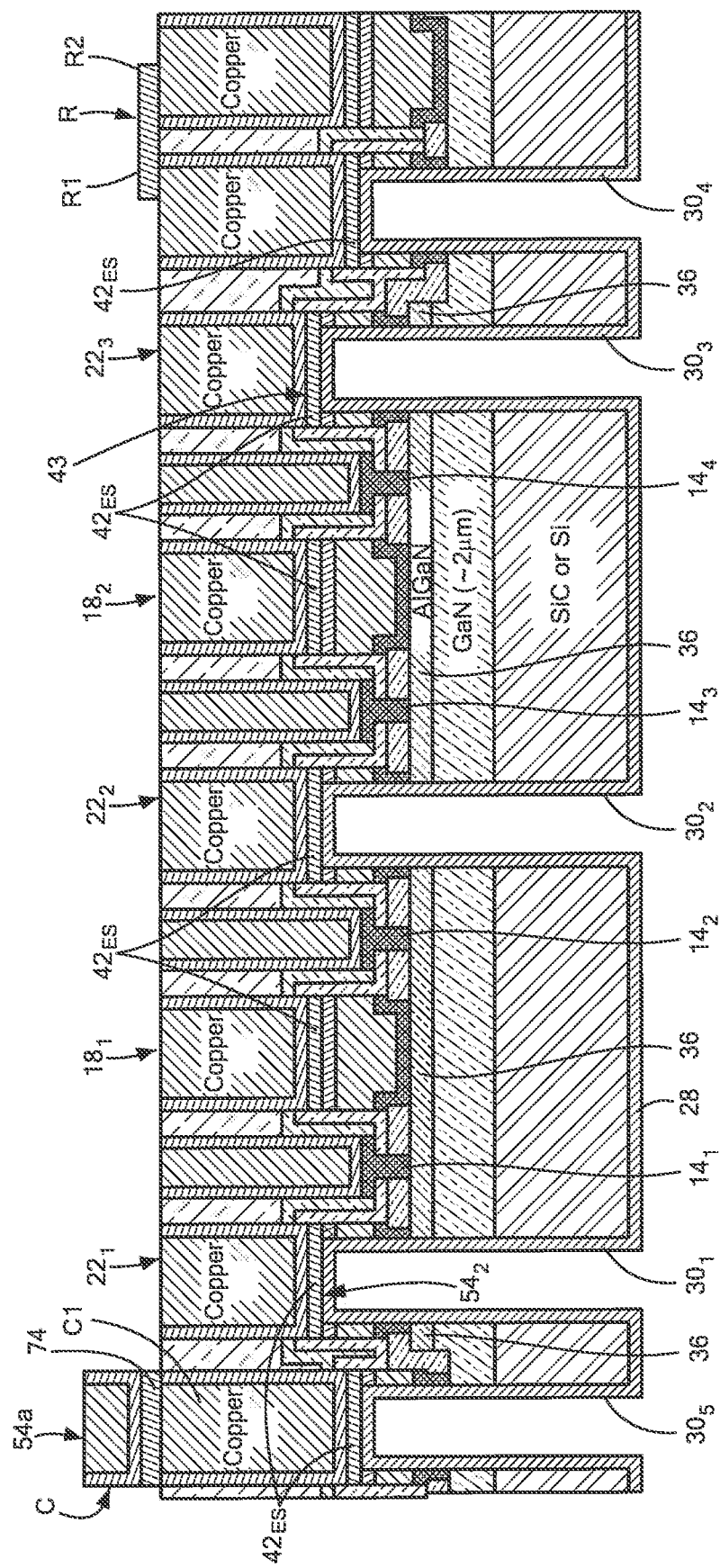

Referring now to FIG. 5A through 5C, here an embodiment is described of a portion of a MMIC structure 10', here for example having, as shown in more detail in FIG. 5A, a multi-gate HEMT FET, having: electrode contacts $54_2$, $54_6$ and $54_{10}$ disposed on electrical contact structures $42_2$, $42_4$ and $42_6$, respectively, as shown to provide gold-free source electrode structures $22_1$-$22_3$ in Ohmic contact with Group III-N semiconductor layer 36 and interconnected with gold-free conductive vias $30_1$-$30_3$ (FIG. 5C) passing through the substrate 32, the Group III-N layer 34, and the Group III-N semiconductor layer 36 to the conductive layer 28 formed on the bottom of the structure 10'; electrode contacts $54_4$, and $54_8$ disposed over electrical contact structures $42_3$, and $42_5$, respectively, as shown to provide gold-free drain electrodes structures $18_3$, $18_2$ in Ohmic contact with Group III-N semiconductor layer 36 and interconnected to the gold-free drain pad 20 (FIG. 1B) and electrode contacts $54_3$, $54_5$, $54_7$ and $54_9$ disposed over gold-free gate electrode structures $14_1$-$14_4$, respectively in Schottky contact with the Group III-N, semiconductor layer 36 and connected to gate pad 16 (FIG. 1B). The structure 10' includes: a resistor R, here for example tantalum nitride (TaN), having a pair of electrodes (the opposing ends of the resistor R) R1 and R2; one of the electrodes, R1, being connected to electrode contact $54_{11}$, electrical contact $42_7$ and then to the conductive layer 28 by a conductive via $30_4$ (FIG. 5C) passing through passing through the substrate 32, and the Group III-N layer 34 to the gold-free conductive layer 28 formed on the bottom of the structure 10', and the other electrode R2 being disposed on electrode $54_{12}$, which is disposed on electrical contact $42_8$, which is disposed on Group III-N layer 34; and a capacitor C having a bottom plate C1 formed by electrode contact $54_1$ and electrical contact structure $42_1$ (FIG. 5A) and interconnected to a conductive via $30_5$ passing through the substrate 32, and the Group III-N layer 34 to the gold-free conductive layer 28 formed on the bottom of the structure 10'; an upper plate C2, here an electrical interconnect 54a having a copper layer 54b lined with layer 54a, here for example, tantalum or tantalum nitride or a combination thereof; and a dielectric 75, here for example silicon nitride, disposed between the upper plate C2 and the bottom plate C1, as shown. Finally, it should be noted that in many circuit designs, the capacitor C and resistor R need not be connected to conductive vias 30.

It is noted that the thickness of the copper forming the lower plate C1 of the capacitor C and used for the resistor R is thicker than that used for the source electrode structures $22_1$, $22_2$ and $22_3$ and drain electrode structures $18_1$ and $18_2$ for two reasons: First, the trenches td formed during Damascene processing have to be deeper (unless ion implantation isolation instead a mesa as noted above, which is not shown, is used to enable planar structures) to enable "off" mesa 11 (FIGS. 1B and 2A) vertical interconnects to "on" mesa 11 electrical contact structures 42. Second, all contacts formed during metal layer deposition terminate at the same level on the upper surface of the layer due to the CMP process.

It is also noted that the electrical contact structures $42_1$-$42_8$, described above, are formed in the same manner described above in connection with FIGS. 2A-2T. Thus, the source electrode structures $22_1$, $22_2$ and $22_3$ and drain electrode structures $18_1$ and $18_2$ are in Ohmic contact with the Group III-N semiconductor layer 36 and the gate electrode structures $14_1$, $14_2$ and $14_3$ are in Schottky contact with the Group III-N semiconductor layer 36.

Next, the back-side processing proceeds as in FIGS. 2S and 2T. More particularly, the wafer is mounted face down on a temporary carrier, not shown, the wafer is thinned, here for example to 50 or 100 microns. The exposed bottom surface of such structure is masked with mask 78 and processed using conventional silicon compatible processing techniques to expose portions of the bottom of the substrate 32 disposed under the central or inner surface portions of the electrical contact structures $42_1$, $42_2$, $42_4$, $42_6$ and $42_7$, as shown, followed by, first a dry fluorine-based etch, here, for example $SF_6$, as described above in connection with FIG. 2S to etch via holes 72 through exposed portions of the substrate 32 and then a dry chlorine-based etch, here for example a combination of boron tri-chloride ($BCl_3$) and chlorine ($Cl_2$), to continue the depth of via holes 72 by etching through the exposed portions of Group III-N layers 34 and 36, then through the central or inner portions $79_{IP}$, as shown for an exemplary one of the electrical contact structures, here electrical contact structure $42_2$ (FIG. 5B') of the bottom surface of the electrical contact structures $42_1$, $42_2$, $42_4$, $42_6$ and $42_7$ and stopping at the etch stop layer $42_{ES}$ (here for example nickel or molybdenum or platinum) of structures, as described above in connection with FIG. 2T. It is noted that outer portions $79_{OP}$ of the bottom surface of the electrical contact structures $42_2$, $42_4$, $42_6$ remain un-etched and therefore remain in ohmic contact with the Group III-N layer 36.

Next, referring to FIG. 5C, the mask 78 is removed and the back-side process is performed as described in connection with FIG. 2U. Thus, the bottom of the structure of FIG. 5B has conductive layer 28 formed over it and over the sides and bottom surface of then extended via holes 72, as described above in connection with FIG. 2U' to form conductive vias $30_1$-$30_5$ over the exposed electrically conductive etch stop layers $42_{ES}$ to electrically interconnect the source electrode structures $22_1$-$22_3$, the bottom plate C1 of capacitor C and the electrode R1 of resistor, as shown.

It is noted that here the electrical contact structures 42' could be a single Ohmic contact layer $42'_{OC}$, here a silicide layer, here for example nickel silicide (NiSi) or cobalt silicide ($CoSi_2$), as shown in FIG. 5A'. Further, the silicide layer Ohmic contact structure $42'_{OC}$ may also be doped to further improve contact resistance. In the case of NiSi, for example it could be doped with phosphorus (P), arsenic (As), antimony (Sb) or a combination thereof. In order to form the Ohmic contact structure $42'_{OC}$, Si and Ni or Co is deposited, etched back and then alloyed. In the case of NiSi the alloy temp here for example is ~450° C. In the case of CoSi$_2$ a two-step anneal, here for example ~550° C. followed by ~700° C., is used. In order to facilitate better Ohmic contact to the Group III-N layer 36, the silicide layer, Ohmic contact structure 42'$_{OC}$ may be recessed into the Group III-N semiconductor layer 36 so that the bottom surface of silicide layer Ohmic contact structure 42'$_{OC}$ is 2-20 nm from the bottom surface of the Group III-N layer 36. It is noted that the etch stop layer 42$_{ES}$ is disposed on the Ohmic contact structure 42'$_{OC}$, as shown. Here the electrical contact structure includes an Ohmic contact structure 42'$_{OC}$ having an etch stop layer 42$_{ES}$ on the Ohmic contact structure 42'$_{OC}$.

Figure 6C:
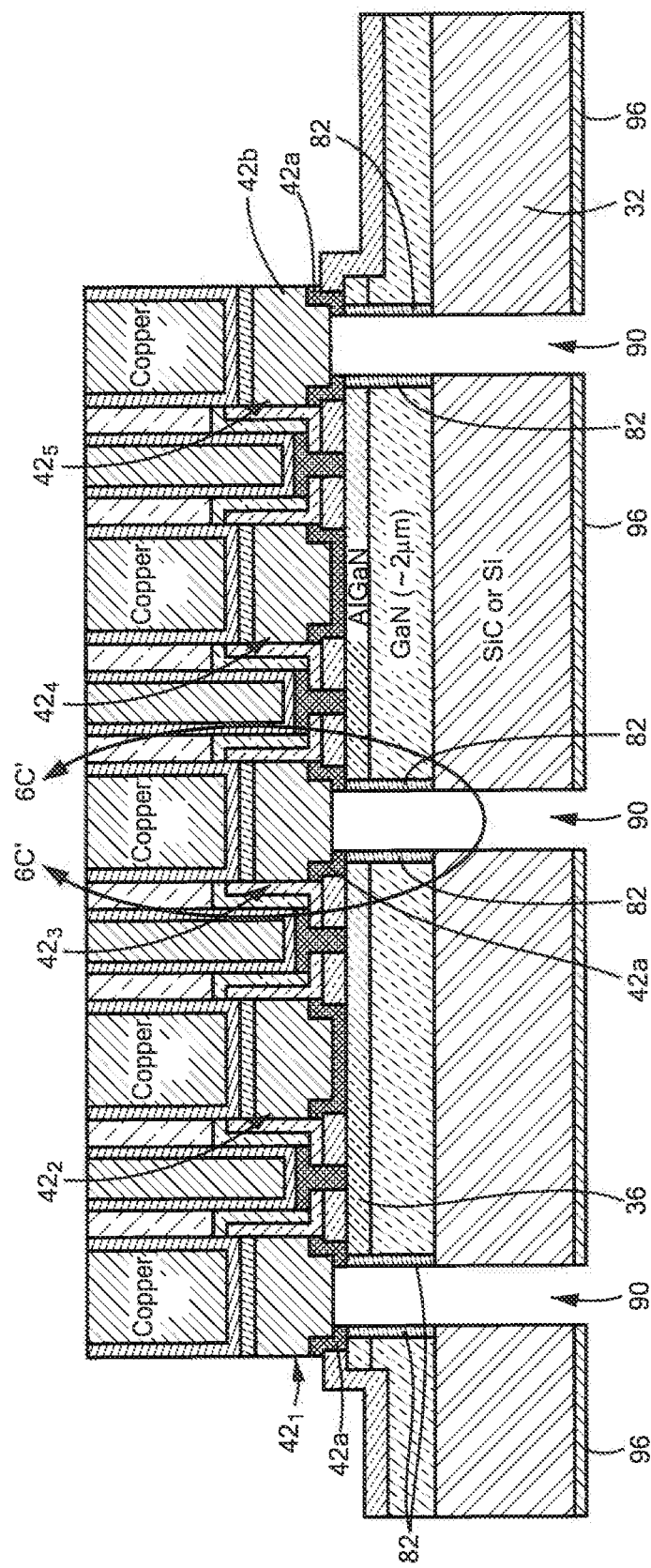
Figure 6C:
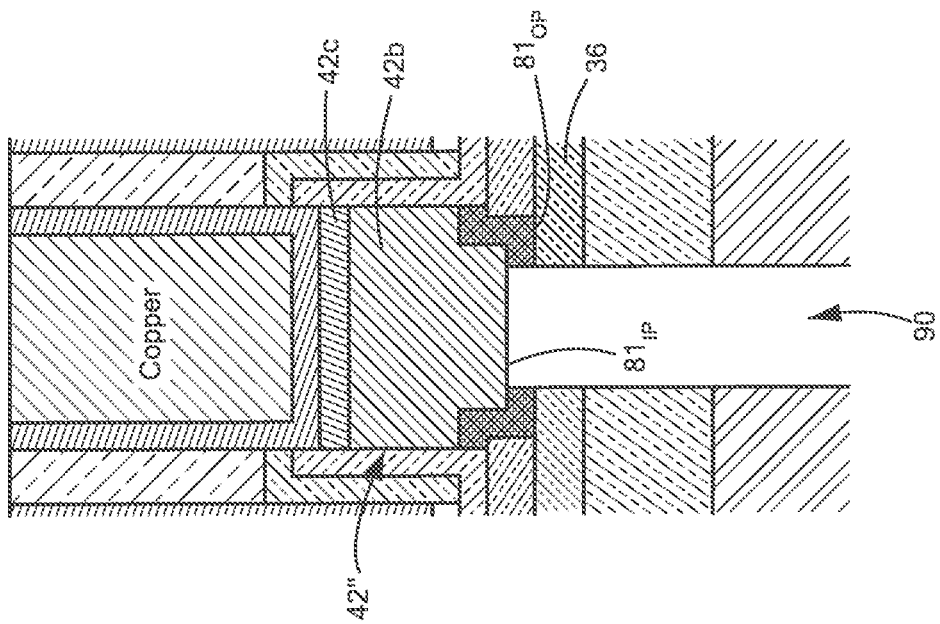

Referring now to FIGS. 6A-6D another embodiment is described. Here, again, as in FIG. 6A, a structure 10" is shown having substrate 32 here for example, Si or SiC; a mesa shaped (defined by etching or implant isolation, as noted above), Group III-N semiconductor layer 34 on an upper portion of the substrate 32, here Group III-N layer 32 is, for example, a layer of gallium nitride (GaN) having a thickness of approximately 1-5 microns over the upper surface of the substrate 32, as shown, and a Group III-N semiconductor layer 36, here Al$_x$Ga$_{1-x}$N, for example having a thickness of approximately 5-30 nm, on the upper surface of Group III-N layer 34. As will be described below, the structure 10" will be processed to form a multi-gate HEMI. Here, however, apertures 80 are etched, using conventional silicon foundry compatible subtractive patterning (lithography and etching) techniques and here, for example a combination of boron tri-chloride (BCl$_3$) and chlorine (Cl$_2$) dry etching, in portions of the Group III-N layers 34 and 36 where electrically conductive vias 90, to be described in connection with FIGS. 6B and 6C, are to be formed to electrically interconnect the sources electrode structures 22$_1$-22$_3$ (FIG. 1B).

Referring to FIG. 6B, the apertures 80 are filled with a semiconductor or dielectric or metal material 82 that can be dry etched in fluorine containing gasses, here for example SiNx, SiO$_2$, molybdenum or polysilicon or a combination thereof. The structure is processed as described above in connection with FIGS. 2B-2K to form electrical contact structures 42"$_1$-42"$_5$; it being noted that here the electrical contact structures 42"$_1$-42"$_5$ do not include a separate etch stop layer, such a etch stop layer 42$_{ES}$ as described above in connection with FIGS. 2A-2U; rather, in this embodiment the aluminum or Si doped aluminum Al$_{1-x}$Si$_x$ layer 42$b$ (where the Si doping, x, is typically ≤0.05) layer of the Ohmic contact structure 42"$_{OC}$ of the electrical contact structures 42"$_1$-42"$_5$ functions, as will be described in connection with FIG. 6B, as an etch stop layer. Electrode contacts 54$_1$, 54$_3$, 54$_5$, 54$_7$ and 54$_9$, respectively are disposed on the top of Ohmic contact structures 42$_{OC1}$-42$_{OC5}$, respectively, as indicated. Electrical contact structures 42"$_1$, 42"$_3$ and 42"$_5$ are for the source electrode structures 22$_1$-22$_3$ and electrical contact structures 42"$_2$ and 42"$_4$ are drain electrode structures 18$_1$, 18$_2$ (FIG. 1B). It is noted that the bottom surface of the electrical contact structures 42"$_1$, 42"$_3$ and 42"$_5$ are larger in surface area than the surface area of the semiconductor or dielectric or metal material 82, with the outer surface portions of the electrical contact structures 42"$_1$, 42"$_3$ and 42"$_5$ being in Ohmic contact with the Group III-N semiconductor layer 36, as shown. Gate electrode structures 14$_1$-14$_4$ are in Schottky contact with the Group III-N semiconductor layer 36, as shown, and have thereon electrode contacts 54$_2$, 54$_4$, 54$_6$, and 54$_8$, as shown.

The Ohmic contact structure layers 42$a$, 42$b$, and 42$c$ of the electrical contact structures 42"$_1$-42"$_5$ and the electrode contacts have been described above in connection with FIG. 3B with the Ohmic contact structure 42$_{OC1}$-42$_{OC5}$ having: a bottom layer 42$a$ of Ti or Ta (which may be recessed into the upper surface portions of the Group III-N semiconductor layer 36); a middle layer 42$b$ of an aluminum-based layer, here aluminum or Si doped aluminum Al$_{1-x}$Si$_x$ layer; and an upper layer 42$c$ of tantalum or metal nitride layer, here for example tantalum (Ta), tantalum nitride (TaN) or titanium nitride (TiN) on the aluminum or Si doped aluminum Al$_{1-x}$Si$_x$ layer; and the electrode contacts 54$_1$-54$_9$ having an electrically conductive metal interconnect contact, here for example copper having the sides and bottom lined with a diffusion barrier layer, here for example, tantalum or tantalum nitride or a combination thereof. Thus, as will be discussed more detail below, relating to the back-side processing, it is noted that in this embodiment, there is no separate etch stop layer 42$_{ES}$ (described above in connection with FIGS. 2A-2U); rather, because of the fluorine chemical etchant used to form the vias 90 (FIG. 6C) in this embodiment, the etch stop layer is provided by layer 42$b$, here for example aluminum (or Si doped Aluminum Al$_{1-x}$Si$_x$, of electrical contact structures 42".

Next, the back-side processing proceeds as in FIG. 2U. More particularly the wafer is mounted face down on a temporary carrier, not shown, the wafer is thinned, here for example to 50 or 100 microns. The exposed bottom surface of such structure is masked by a mask 96 (FIG. 6C) to expose portions of the bottom of the substrate 32 under the source electrode structures 22$_1$-22$_3$. It should be noted that outer peripheral portions of the semiconductor or dielectric or metal material 82 Are covered by the mask 96; and hence under the inner portions 81$_{IP}$ (FIG. 6C') of the electrical contact structures 42 while the other portions 81$_{OP}$ of the electrical contact structures 42 remain in Ohmic contact with layer 36. Next, vias 90 are etched using a dry fluorine-based etch, here for example SF$_6$ to etch the vias 90 through the substrate layer 32 and through the inner portions of the material 82 (here for example SiNx, SiO2, molybdenum or poly silicon in FIG. 6C'), inner portions 81$_{IP}$ of the bottom layer 42$a$ of Ti or Ta (which may be recessed into the upper surface portions of the Group III-N semiconductor layer 36) and then stopping at inner portions of the Aluminum-based layer 42$b$ whose fluorine-based etch byproducts are non-volatile. Thus, here there is no additional (separate) etch stop layer 42$_{ES}$; rather layer 42$b$ functions as an etch stop layer.

Figure 6D:
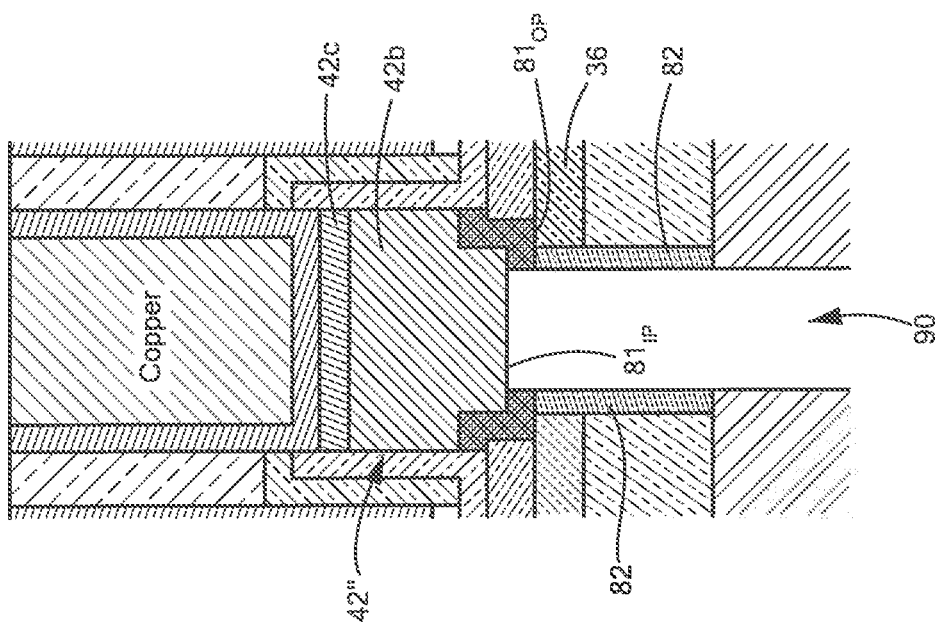
Figure 6D:
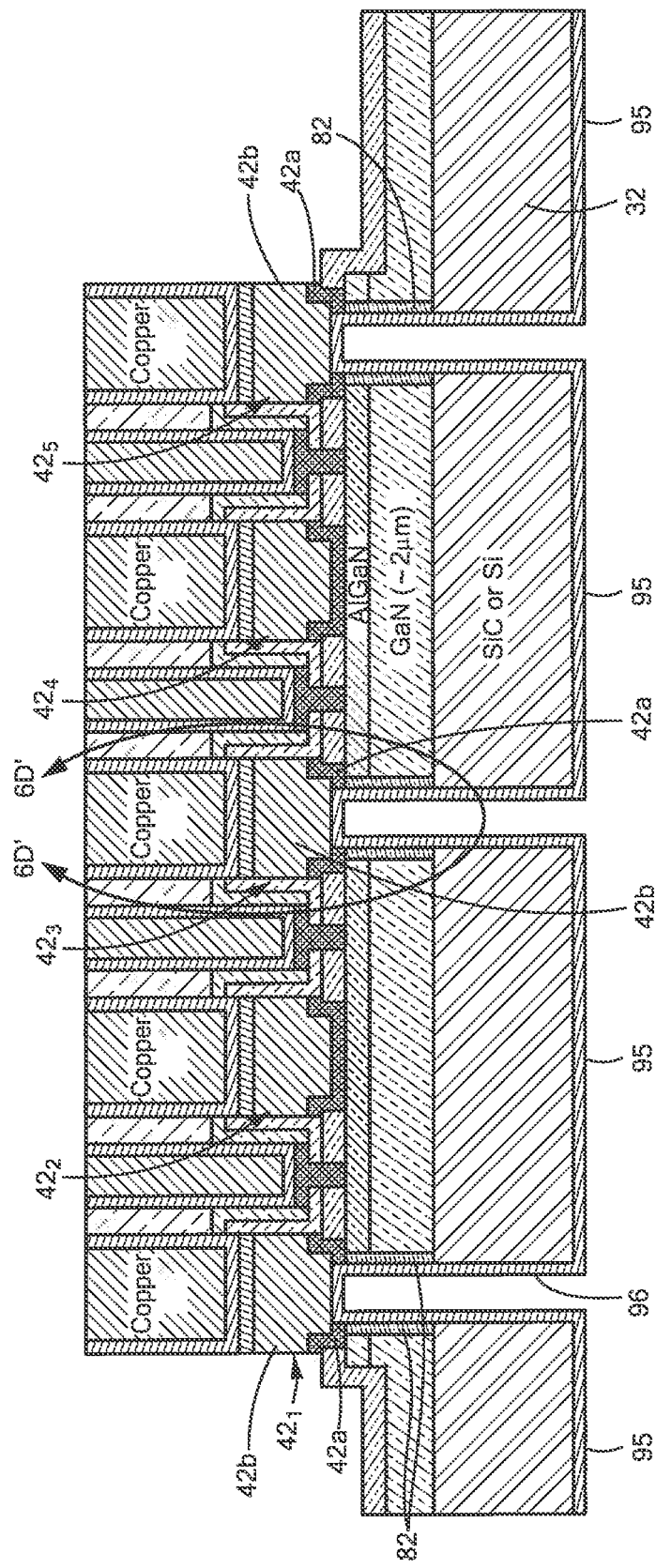

Next, referring to FIG. 6D, the bottom of the structure of FIG. 6C has a conductive layer 28, here for example copper-based, is formed over it and over the sides and bottom surface of then extended via holes 90 to form conductive vias 96 and a ground plane conductor 95, as described above in connection with FIG. 2U, for the structure to electrically interconnect the inner or central portions of the electrical contact structures 42" as shown, and therefore interconnect the source electrode structures 22$_1$-22$_3$. In this embodiment, the Group III-N material is etched from the front-side of the wafer, as described above in connection with FIG. 6A prior to back-side processing and via 90 formation. The apertures 80 (FIG. 6A) are then filled with a material layer 82 (here for example SiNx, SiO$_2$, molybdenum or polysilicon) that can be etched with fluorine-based dry etch chemistries. Assuming that all the layers that need to be etched to form the via 90 are now the substrate 32 (silicon, silicon carbide (SiC), silicon dioxide (SiO$_2$), silicon nitride (SiN$_x$) or a combination thereof) and the aperture semiconductor or dielectric or metal material 82 (here for example SiNx, SiO2, molybdenum or polysilicon), those layers can now all be etched using the fluorine-based etchants. As a result, a fluorine-based etch is then used for the entire via etch process.

Referring now FIG. 6D' another embodiment is described. In this embodiment the via 96 is etched wider than in FIG. 6D; however, here again the etching stops at the inner portions of the Aluminum based layer 42b. Thus again there is no additional (separate) etch stop layer 42$_{ES}$; rather layer 42b functions as an etch stop layer. In this case (FIG. 6D') there is no remaining dielectric layer 82 in the via 90 (as shown in FIG. 6C').

Referring now to FIGS. 7A-7G, another embodiment is shown. Here the structure 10''' shown in FIG. 2B is processed as described in connection with FIG. 2C except only windows 40$_2$-40$_6$ are formed, as shown. After forming windows 40$_2$-40$_6$, an etch stop layers 42$_{ES}$', here for example, silicon dioxide or SiN$_x$, are formed using conventional silicon (Si) foundry compatible (subtractive) lithography and etch processing techniques, on the inner surface portions of layer 36 exposed by the windows 40$_2$, 40$_4$, 40$_6$; it being noted in FIG. 7B that outer surface portions of the exposed surface of layer 36 are void of the etch stop layers 42$_{ES}$'. Alternately, but not shown, etch stop layers 42$_{ES}$', could be formed on the inner surface portions of layer 36 exposed by all windows 40.

Figure 7A:
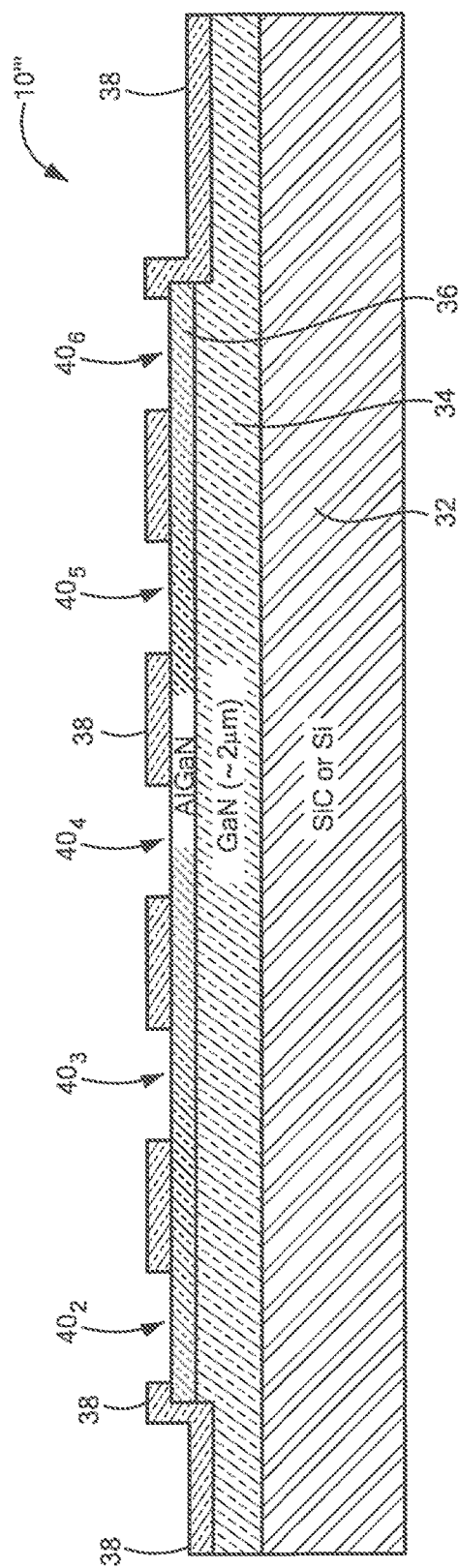
FIGS. 7A-7G are diagrammatical, cross-sectional sketches at various stages in the fabrication of a semiconductor structure according to another embodiment of the disclosure.
Figure 7B:
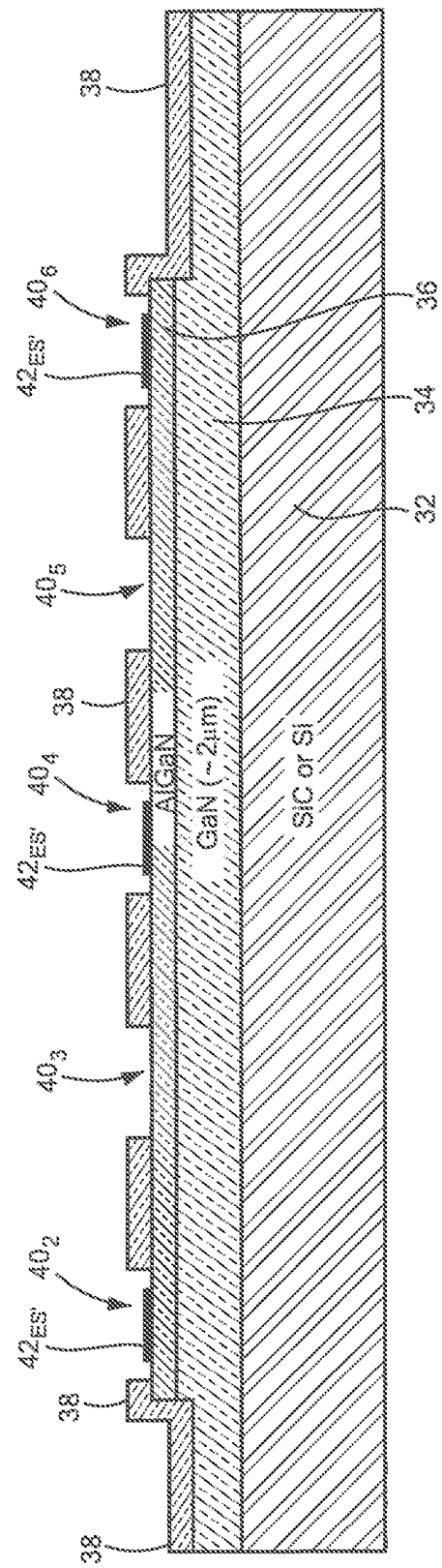
Figure 7C:
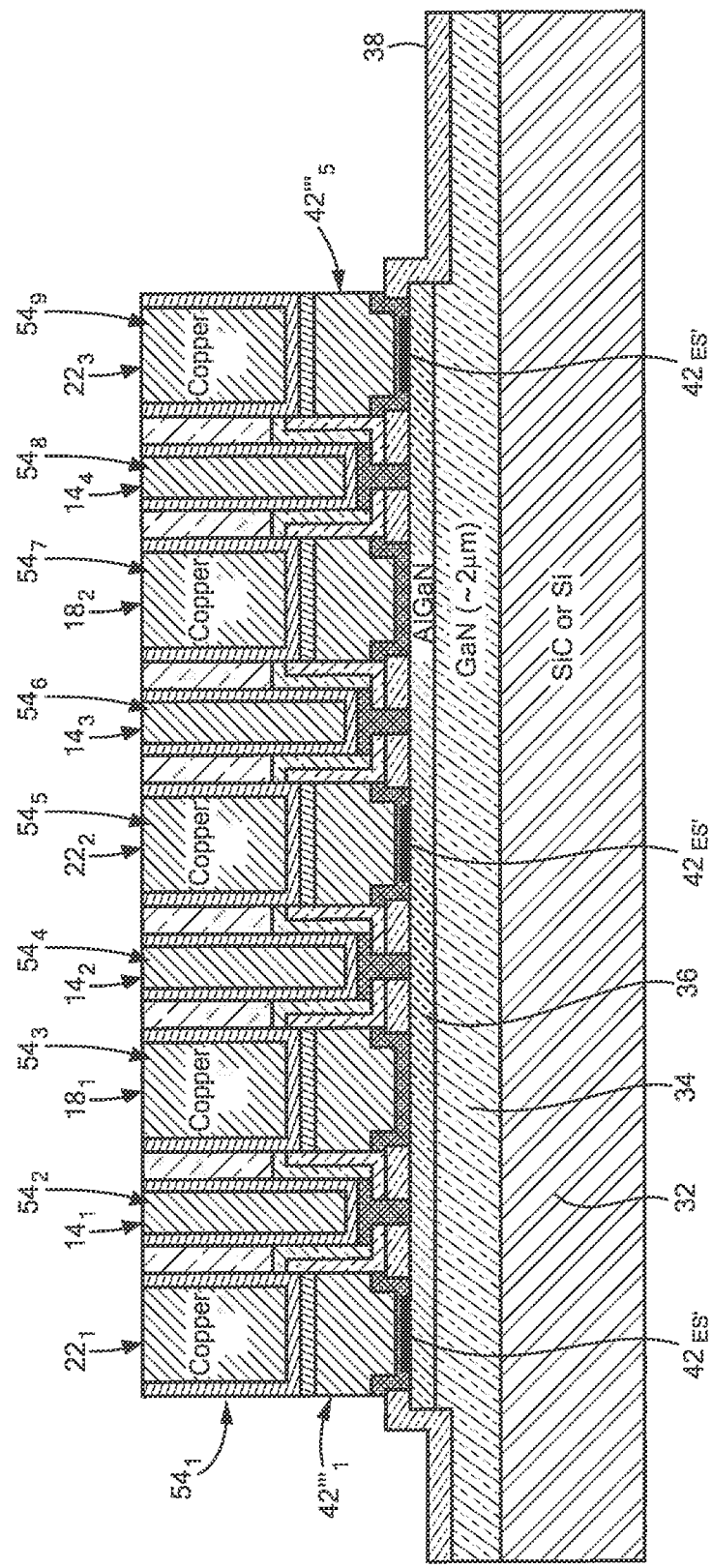

Referring now to FIG. 7C, layers 42a, 42b and 42c are now formed over the etch stop layers 42$_{ES}$'; it being noted that outer peripheral portions of the layers 42a, 42b and 42c are in direct contact with layer 36. Thus, after an anneal process described above in connection with FIGS. 4A, 4A' and 4B, 4B', Ohmic contact is formed between the outer peripheral portions of layers 42a, 42b and 42c and Group III-N layer 36. It should be noted that here the electrical contact structures 42'''$_1$, 42'''$_3$, and 42'''$_5$ include an etch stop layer, here etch stop layer 42$_{ES}$', that is under the inner portions of layers 42a, 42b and 42c; rather than on top of layers 42a, 42b, and 42c. Thus, while, as noted above in connection with FIG. 3B where the electrical contact structure 42''' included etch stop layer 42$_{ES}$ on top of layer 42c (on top of the electrical contact structure 42); here, as shown in FIG. 3B', the etch stop layer 42$_{ES}$' of the electrical contact structure 42' used in FIGS. 7A-7F is under the inner or central portion of layer 42a of the electrical contact structure 42''').

It is also noted in FIG. 7C that electrode contacts 54$_1$-54$_9$ simultaneously form the upper layers of the source electrode structures 22$_1$-22$_3$, drain electrode structures 18$_1$, 18$_2$, and gate electrode structures 14$_1$-14$_4$, as shown.

Figure 7D:
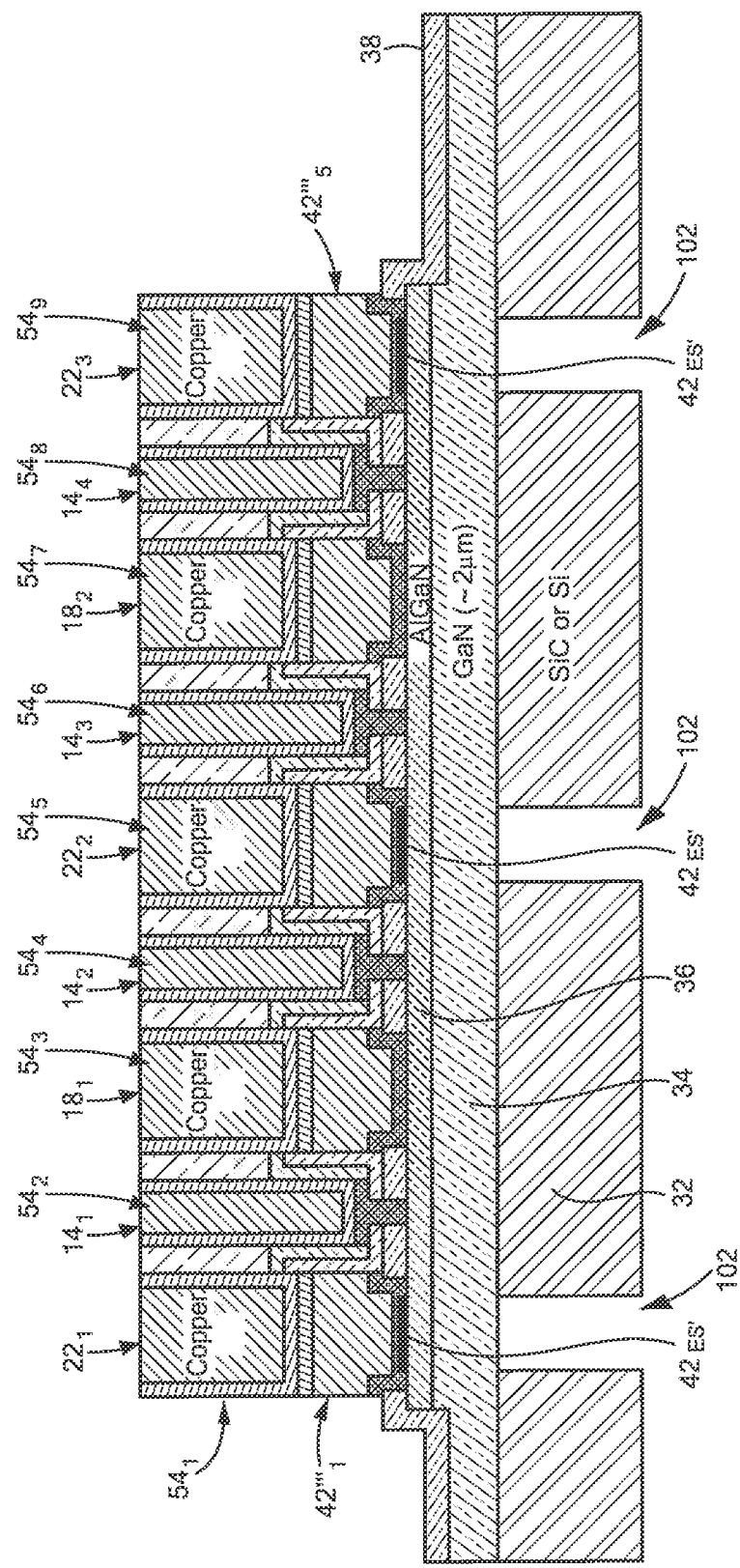

Referring now to FIG. 7D, after the completion of front-side processing, and referring now to FIG. 2S, the back-side processing begins. More particularly the wafer is mounted face down on a temporary carrier, not shown, the wafer is then thinned, here for example to 50 or 100 microns. The bottom surface of the structure is masked with windows therein disposed under the etch stop layers 42$_{ES}$'. An etchant, here for example, fluorine, is used to etch via 102 through the substrate 32, as shown.

Figure 7E:
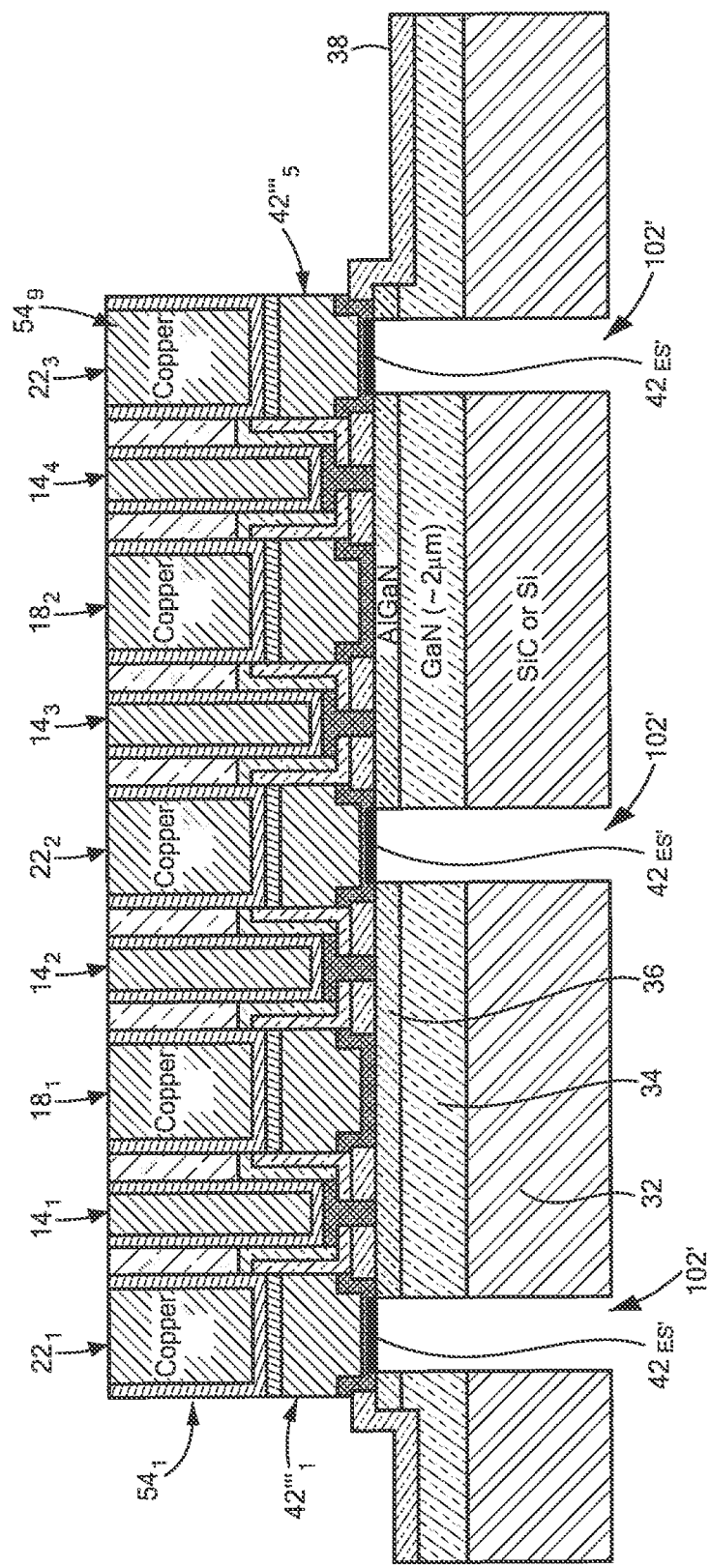
Figure 7F:
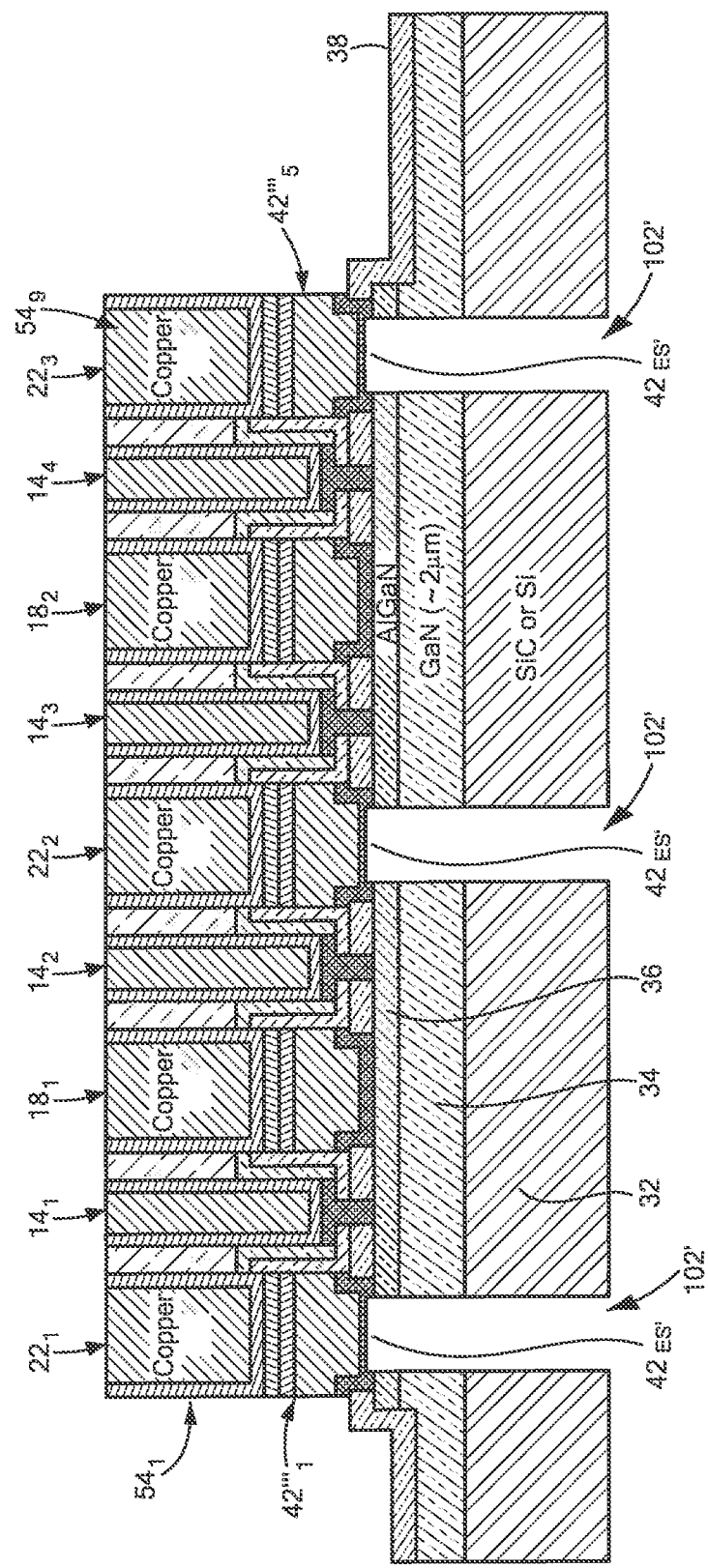

Referring now to FIG. 7E, a chlorine-based etchant such as BCl$_3$ and Cl$_2$ are used to extend the vias 102 to via 102'; as shown, such etching stopping at the etch stop layers 42$_{ES}$', as shown. Next, the etch stop layer 42$_{ES}$' is removed from the bottom of the via hole 102' using dry etch chemistries that are fluorine-based when either SiO$_2$ or SiN$_x$ is used as a layer 42$_{ES}$' etch stop. Fluorine-based wet etches are suitable for removing SiO$_2$ and Al$_2$O$_3$ layer 42$_{ES}$' etch stops, and some SiN$_x$ layer 42$_{ES}$' etch stops, as shown in FIG. 7F.

Figure 7G:
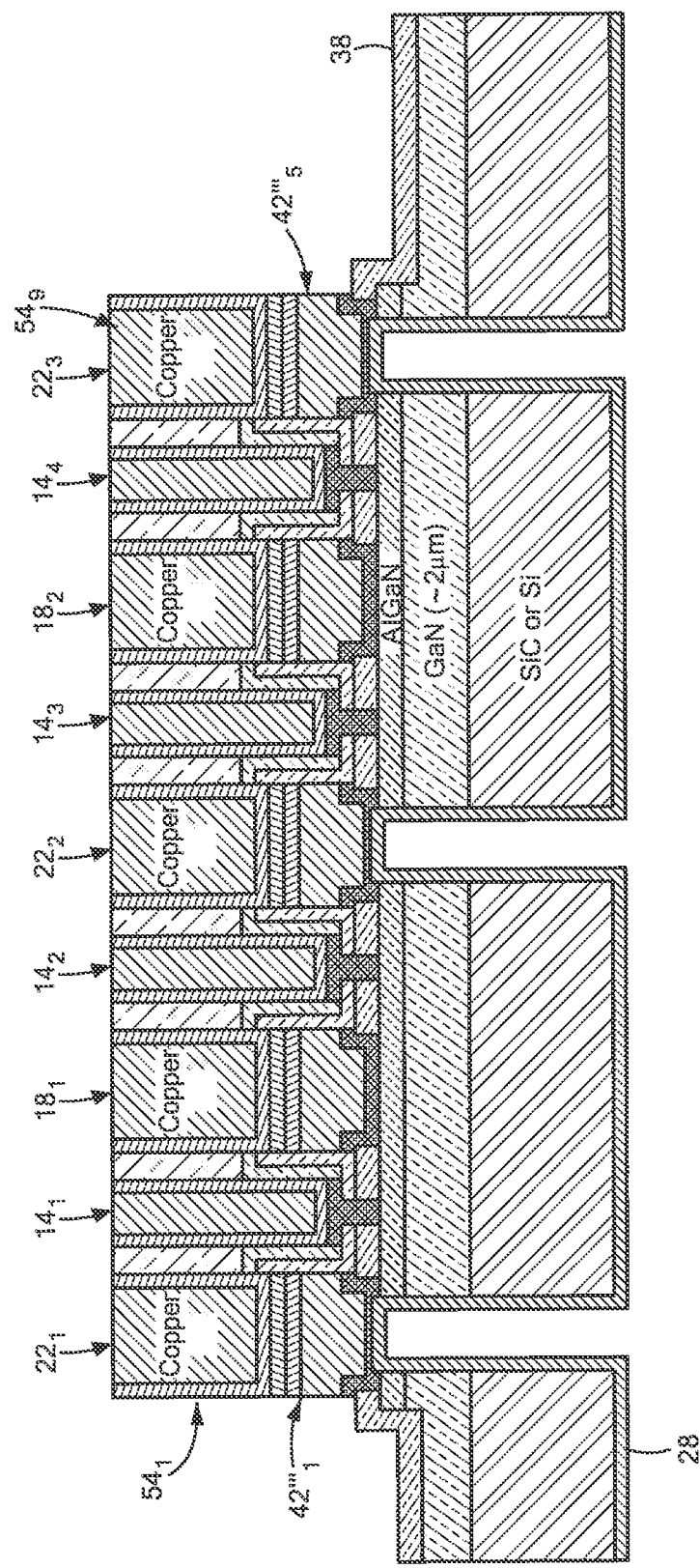

Referring now to FIG. 7G, a conductive layer 28 is formed over the bottom of the structure as described above in connection with FIG. 2U to electrically interconnect the source electrode structures 22$_1$-22$_3$.

Figure 8A:
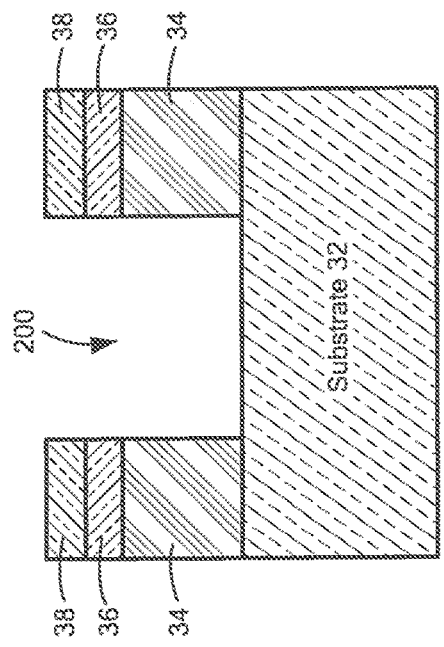
FIGS. 8A-8H are diagrammatical, cross-sectional sketches at various stages in the fabrication of a semiconductor structure according to another embodiment of the disclosure.
Figure 8C:
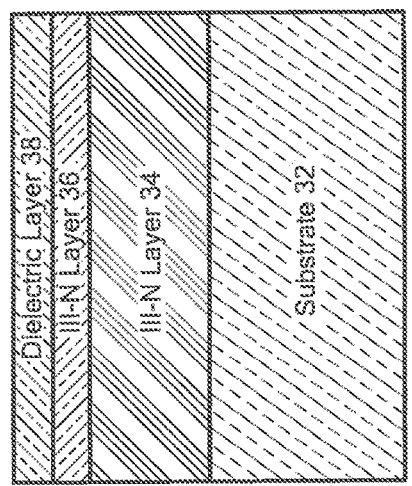
Figure 8B:
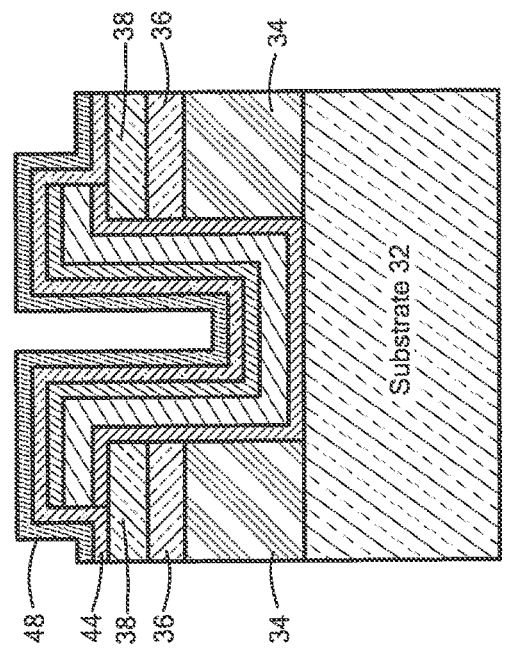

Referring now to FIGS. 8A-8F another embodiment is shown for forming an Ohmic contact to one of the source electrode structures and the connection of the source electrode structure to back-side metallization conductive layer 28. Thus, after forming the dielectric layer 38 on the upper surface of the AlGaN layer 36, as shown in FIG. 8A, a window 200 is formed through the dielectric layer 38, underlying portions of AlGaN layer 36, and GaN layer 34 to the surface of the substrate 32, as shown in FIG. 8B, here using conventional lithography and dry etch processes, here for example the chlorine-based etchants BCl$_3$ and Cl$_2$.

Figure 8D:
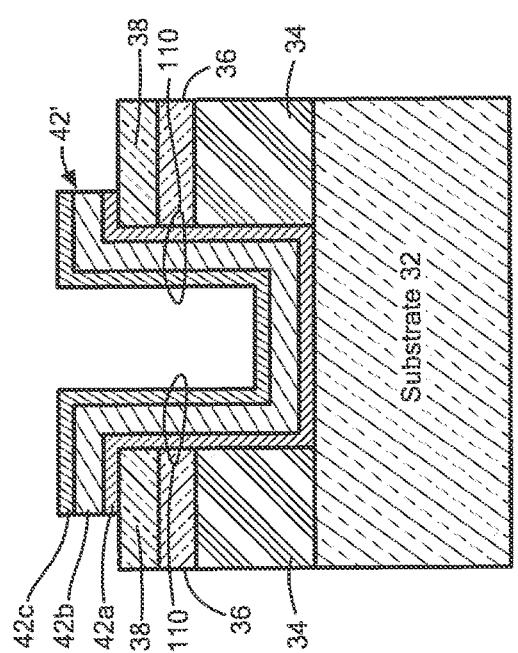

Next, referring to FIG. 8C, the electrical contact structure 42' having layers 42a, 42b and 42c of the Ohmic contact structure 42$_{OC}$ are sequentially deposited and patterned as shown using conventional lithographic-etching process as described above in connection with FIG. 2D, the Ohmic contact structure 42$_{OC}$ having: a bottom layer 42a of titanium (Ti) or tantalum (Ta); a layer 42b for example, aluminum or Si doped aluminum Al$_{1-x}$Si$_x$ (where the Si doping, x, is typically ≤0.05) on the layer 42a; and a layer 42c, for example tantalum (Ta) or a metal nitride, here for example titanium nitride (TiN). Next, the anneal processes described above is used to form Ohmic contact regions 110 (FIG. 8C between the Ohmic contact structure 42$_{OC}$ and sidewalls of the AlGaN layer 36. Next, the dielectric layers 44 and 48 are formed as shown in FIG. 8D, as described above in connection with FIGS. 2F through 2H.

Figure 8F:
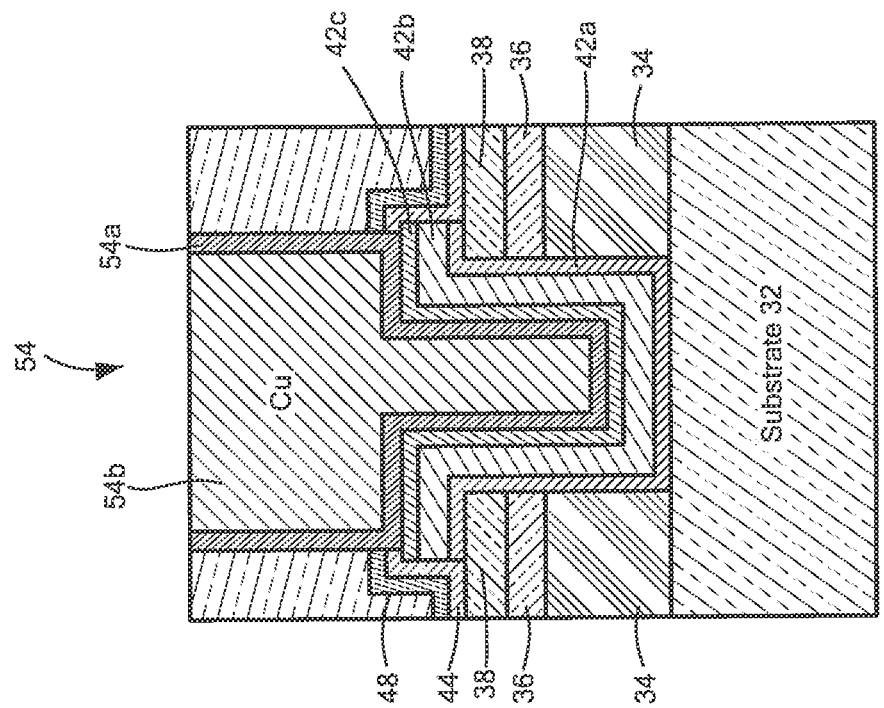
Figure 8E:
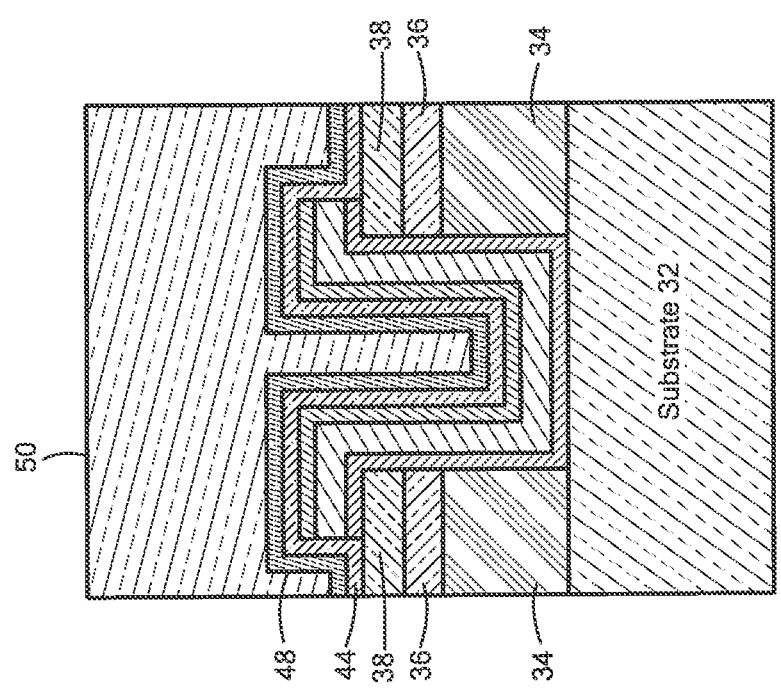

Next, the Damascene process begins by depositing the dielectric layer 50 as described above in connection with FIG. 2I, as shown in FIG. 8E, followed by the formation of the electrical interconnect including, in this example the upper layer 54b of copper having the bottom and sides lined with an adhesion and copper diffusion barrier layer 54a, here for example, tantalum or tantalum nitride or a combination thereof as described above in connection with FIGS. 2I-2L, resulting in an exemplary one of the above described Damascene electrode contacts 54$_1$-54$_{11}$, here indicated without a subscript as 54, as shown in FIG. 8F.

The processing continues as described above in connection with FIGS. 2M-2R after which the back-side processing begins as described above in connection with FIGS. 6A-6D. More particularly, the wafer is mounted face down on a temporary carrier, not shown, the wafer is thinned, here for example to 50 or 100 microns. The exposed bottom surface of such structure is masked to expose portions of the bottom of the substrate 32 under the source electrode structure. Next, vias 90 are etched using a dry fluorine-based etch, here for example SF6 to etch the vias 90 through the substrate layer 32 and through the bottom layer 42a of Ti or Ta and then stopping at the aluminum-based layer 42b whose fluorine-based etch byproducts are non-volatile. Thus, here there is no additional (separate) etch stop layer 42$_{ES}$; rather layer 42b functions as an etch stop layer, as shown in FIG. 8G.

Figure 8H:
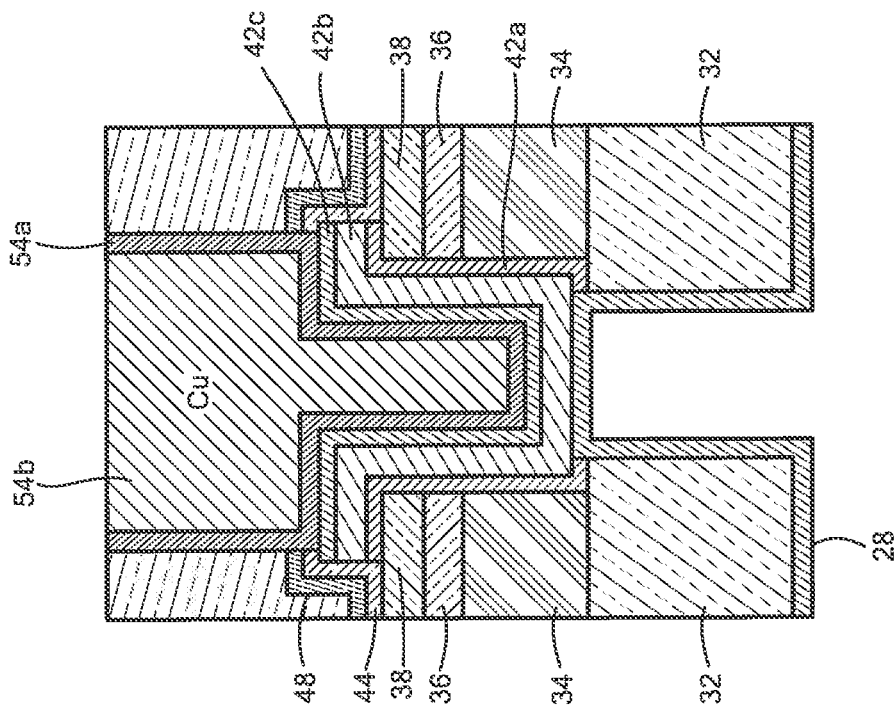
Figure 8G:
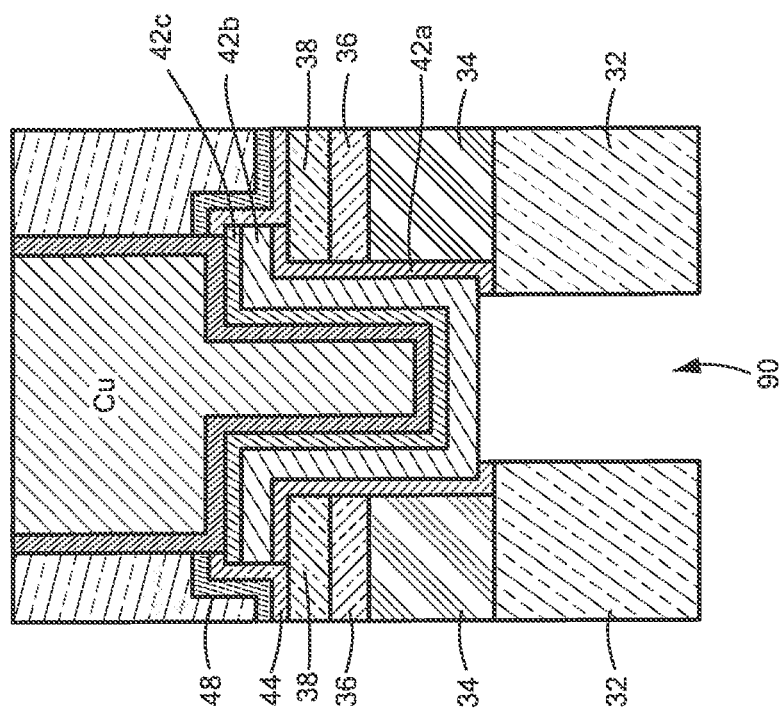

Next, referring to FIG. 8H, the bottom of the structure of FIG. 8G has a conductive layer 28 in electrical connection with the layer 42b of the electrical contact structure 42', as described above in connection with FIGS. 2S-2U.

Referring now to FIGS. 9A-9E, another embodiment is shown. Here, after forming the dielectric layer 38 on the upper surface of the AlGaN layer 36, as shown in FIG. 9A, the window 200 is formed through the dielectric layer 38, underlying portions of AlGaN layer 36, and GaN layer 34 to the surface of the substrate 32, as shown in FIG. 9B, here using conventional lithography and dry etch processes, here for example the chlorine-based etchants $BCl_3$ and $Cl_2$.

Next, the window 202 is etched with a fluorine-based dry etchant that laterally etches dielectric layer 38 (as shown in FIG. 9C) to expose a surface portion of Group III-N semiconductor layer 36 around the edge of the window 200 (as shown in FIG. 9B).

Next, as shown in FIGS. 9D and 9E, layers 42a, 42b, 44 and 48 are formed as described in connection with FIGS. 8C and 8D after which the process continues as described above in connection with FIGS. 8E and 8F.

It should be understood that various modifications may be made without departing from the spirit and scope of the disclosure. For example, the metal to semiconductor Ohmic contact structure 42$_{OC}$' may comprise a two or more layer stack of Al with Ta, Ti, TiN, Pt, Ni, Si, AlSi, W, or Mo such as Ta/Al, Ta/Al/Ta, Ta/Al$_{1-x}$Si$_x$/Ta, Ta/Al/TiN Ti/Al/Ni, Ta/Al, Ti/Al, Ti/Al/W, Ti/Al/Mo, Ti/Al/Pt. Furthermore, the structure shown in FIG. 2J may be removed from gold-free fabrication area prior to forming the electrode contacts 54 in which case the electrode contacts 54 may be gold.

Referring now to FIGS. 11A-11E, a process for selective deposition of Ni based gate structures is described. Thus, after forming the openings or windows 46 as shown in FIG. 2F, a Nickel Oxide (NiO) gate metal layer 128 is selectively deposited through the opening 46, here using ALD; it being noted that the NiO layer 128 will not adhere to the SiNx layer 44 but will adhere to the AlGaN layer 36 terminated in native oxides that are likely to form —OH groups during the NiO ALD deposition process thereby facilitating the ALD deposition. That is, NiO metal deposition on the SiNx is suppressed because there is not a significant concentration of —OH groups (as there is on oxide layers such as $SiO_2$ or $Al_2O_3$) on the SiNx layer to which the NiO will bond with whereas the AlGaN being a semiconductor will have some native oxide upon which the NiO will deposit during the ALD. This dependence on —OH groups for deposition is the basis for selective gate metal deposition on deposited oxides (e.g. $SiO_2$ or $Al_2O_3$), native oxides, or oxygen plasma treated surfaces (e.g. oxidized AlGaN surfaces or SiNx surfaces).

Next, referring to FIG. 11B the NiO layer 128 is annealed in a reducing agent, here for example a gas comprising, for example, hydrogen to convert, reduce, the NiO to Ni layer 128' by a reaction that is the following: $NiO+H_2=Ni+H_2O$, forming gate electrode structures 14'$_1$-14'$_4$ as shown in FIG. 11B.

Figure 11C:
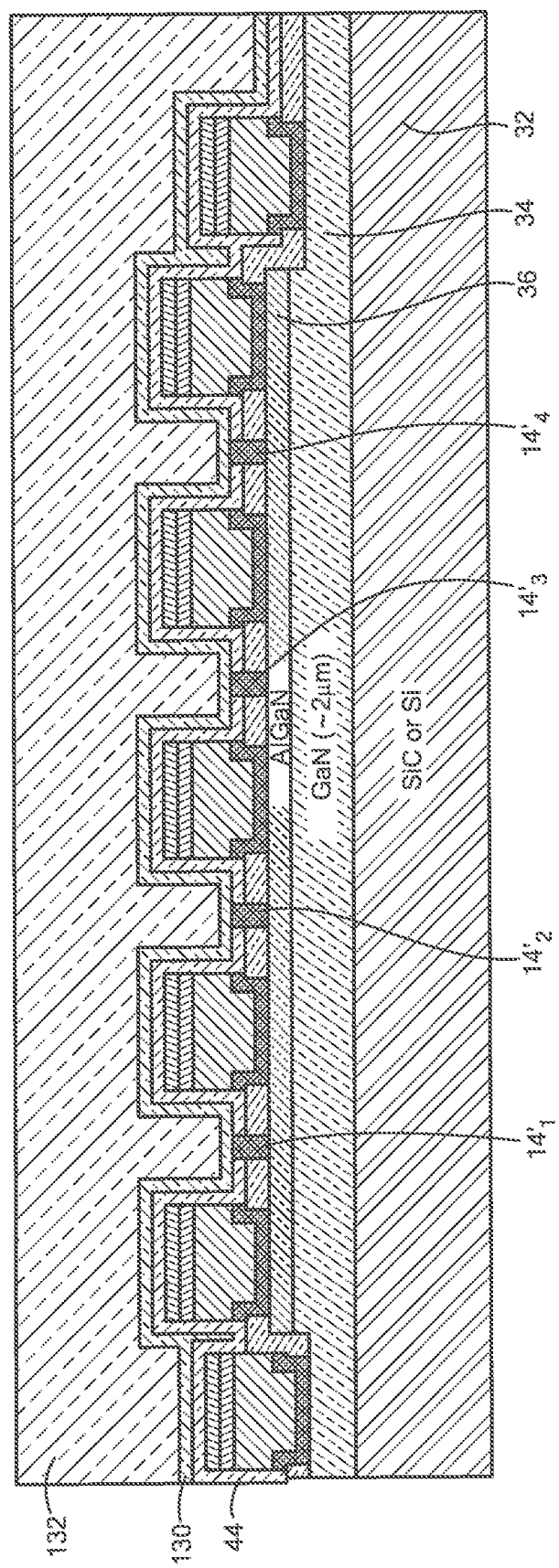

Next, referring to FIG. 11C, a dielectric layer 130, here for example, SiNx, is deposited over the structure followed by a layer 50, of here for example, silicon dioxide, which is then planarized using Chemical Mechanical Polishing (CMP) as shown in FIG. 11C.

Figure 11D:
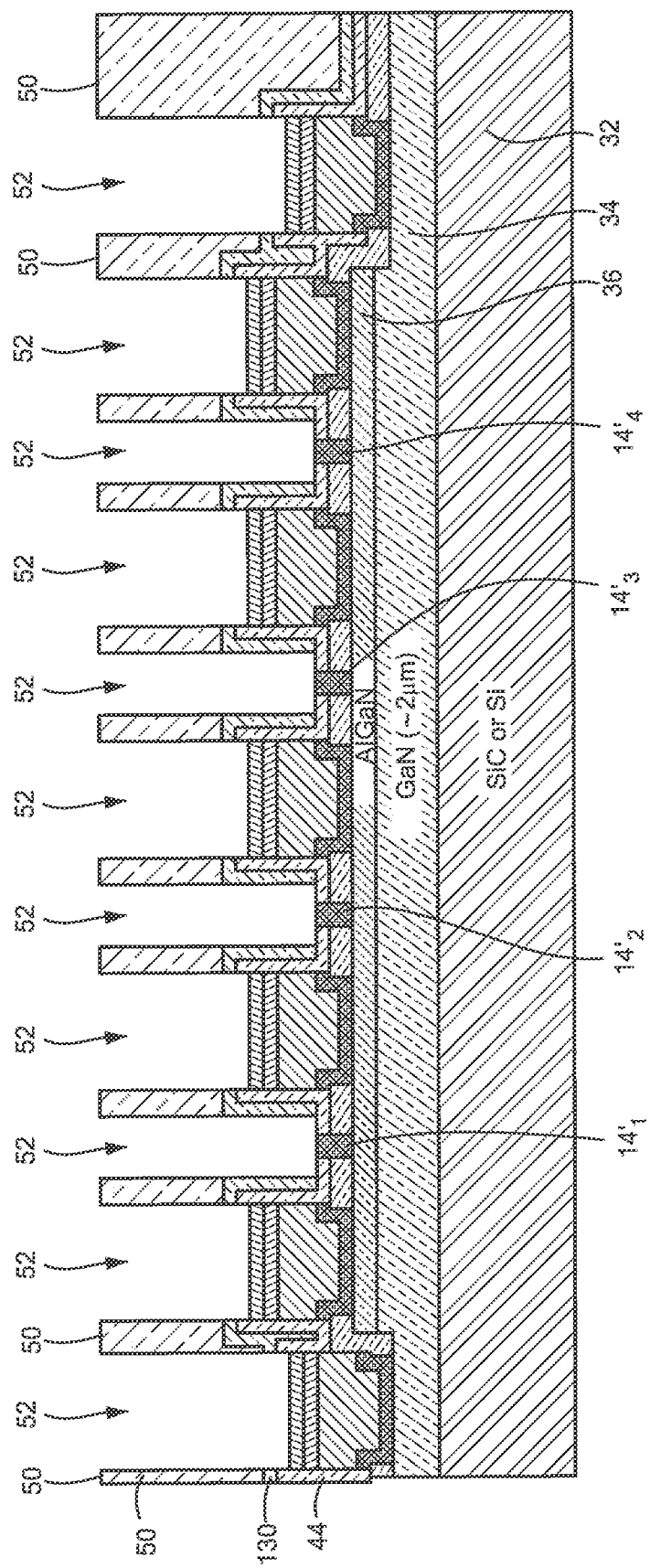
Figure 11E:
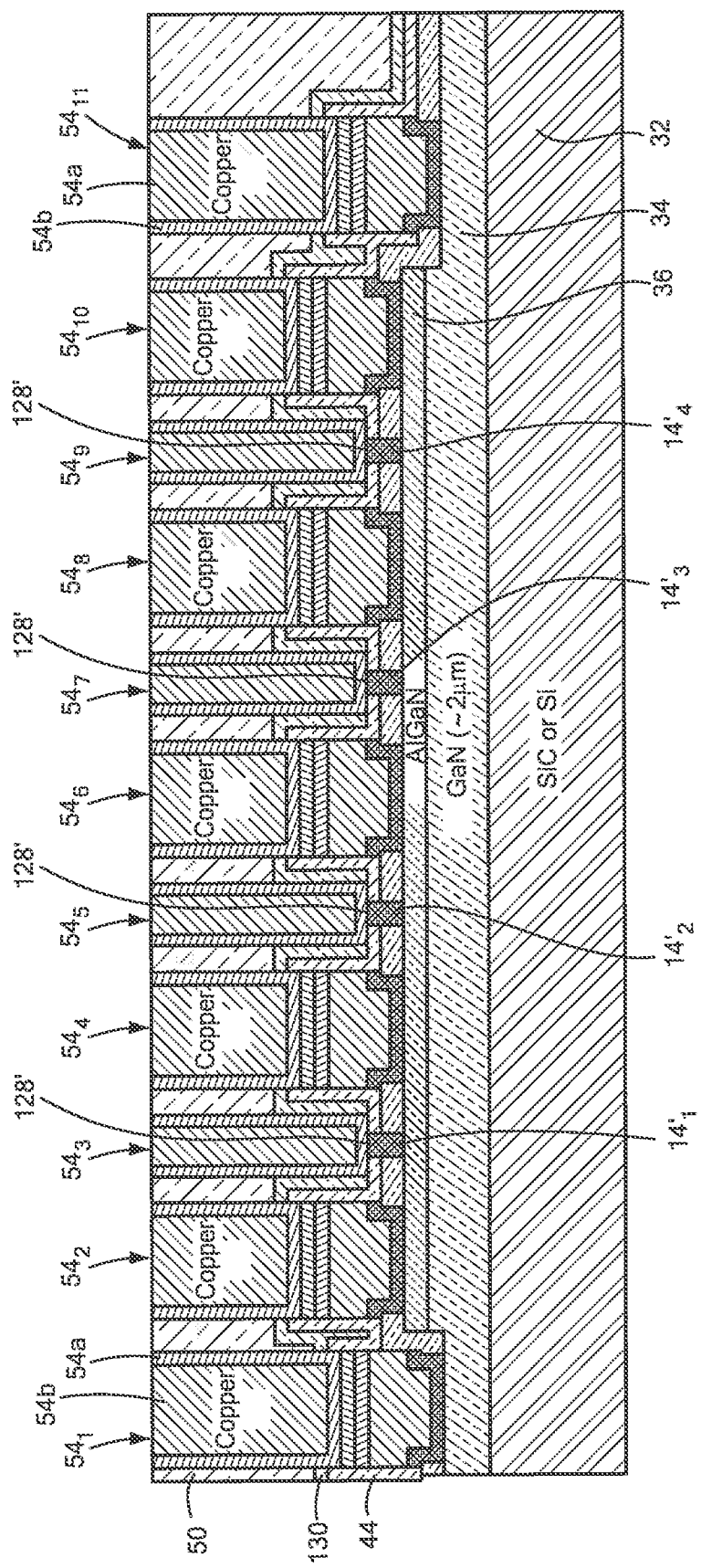

Openings 52 are formed over the source Ohmic contact (S), drain Ohmic contact (D) and the Ni gate metal 128' through the silicon oxide layer 50 using a conventional lithographic-etch process, here for example, using a fluorine based dry etch, it being noted that the etching stops at the SiNx layer 130. Next, the openings 108 are continued through the SiNx layer 130 using a fluorine based dry etch to thereby expose the source Ohmic contact (S), drain Ohmic contact (D) and the Ni gate metal 128' that forms gate electrode structures 14'$_1$-14'$_4$, as shown in FIG. 11D Next, referring to FIG. 11E, copper Damascene contact 54$_1$-54$_{11}$ are formed on the exposed source Ohmic contact (S), drain Ohmic contact (D) and the Ni gate metal 128', as shown. More particular, here the copper Damascene electrode contacts 54$_1$-54$_{11}$, are formed by first sputtering a thin metal seed layer (typically Ta/Cu, Ta/TaN/Cu, or TaN/Cu and ≤100 nm) to facilitate copper plating onto the exposed source Ohmic contact (S), drain Ohmic contact (D) and the Ni gate metal 128' of gate electrode structures 14'$_1$-14'$_4$. It is noted that the seed layer also functions as a copper diffusion barrier and as an adhesion layer to the dielectric. The excess copper overfill of the openings 52 (FIG. 11D) is then removed with chemical mechanical polishing (CMP), which defines the metal interconnects by leaving only metal disposed in the trenches behind to complete the FET. The remainder of FET processing then proceeds in as described in 2L-2U.

Figure 12A:
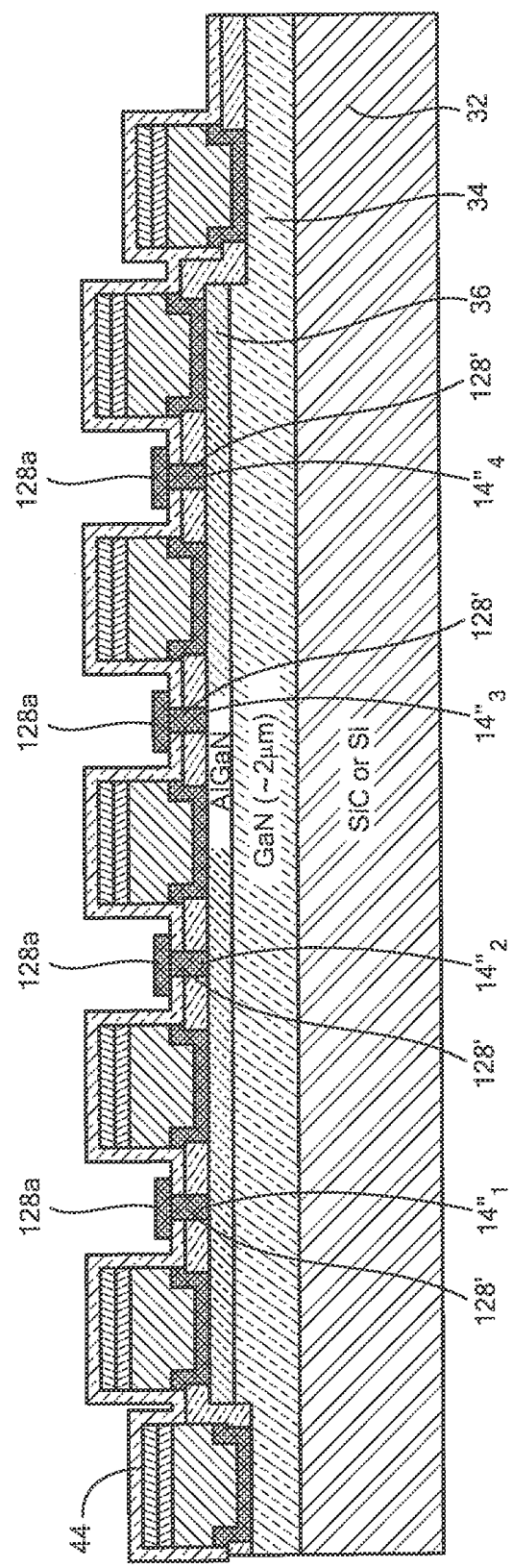
FIGS. 12A-12C are diagrammatical cross sectional sketches of steps used to fabricate a HEMT FET in accordance with another embodiment of the disclosure.
Figure 12B:
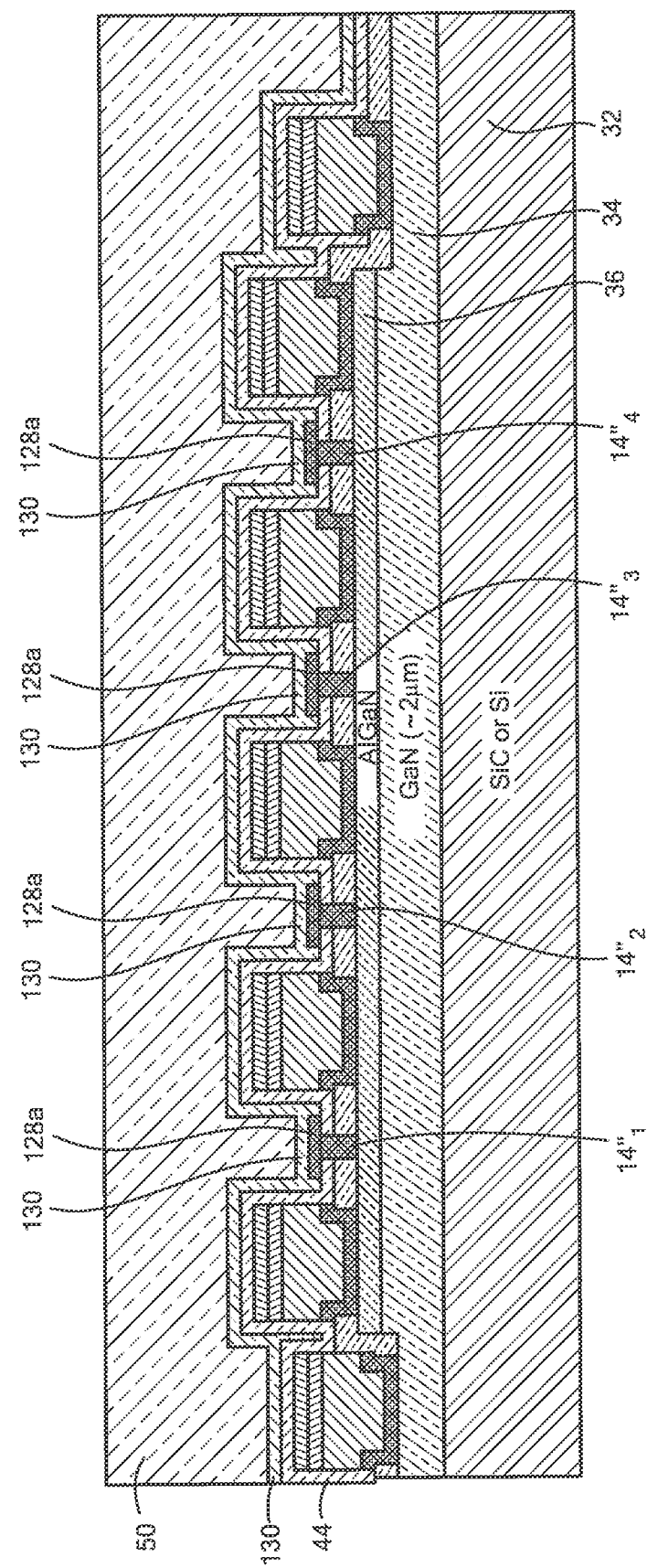
Figure 12C:
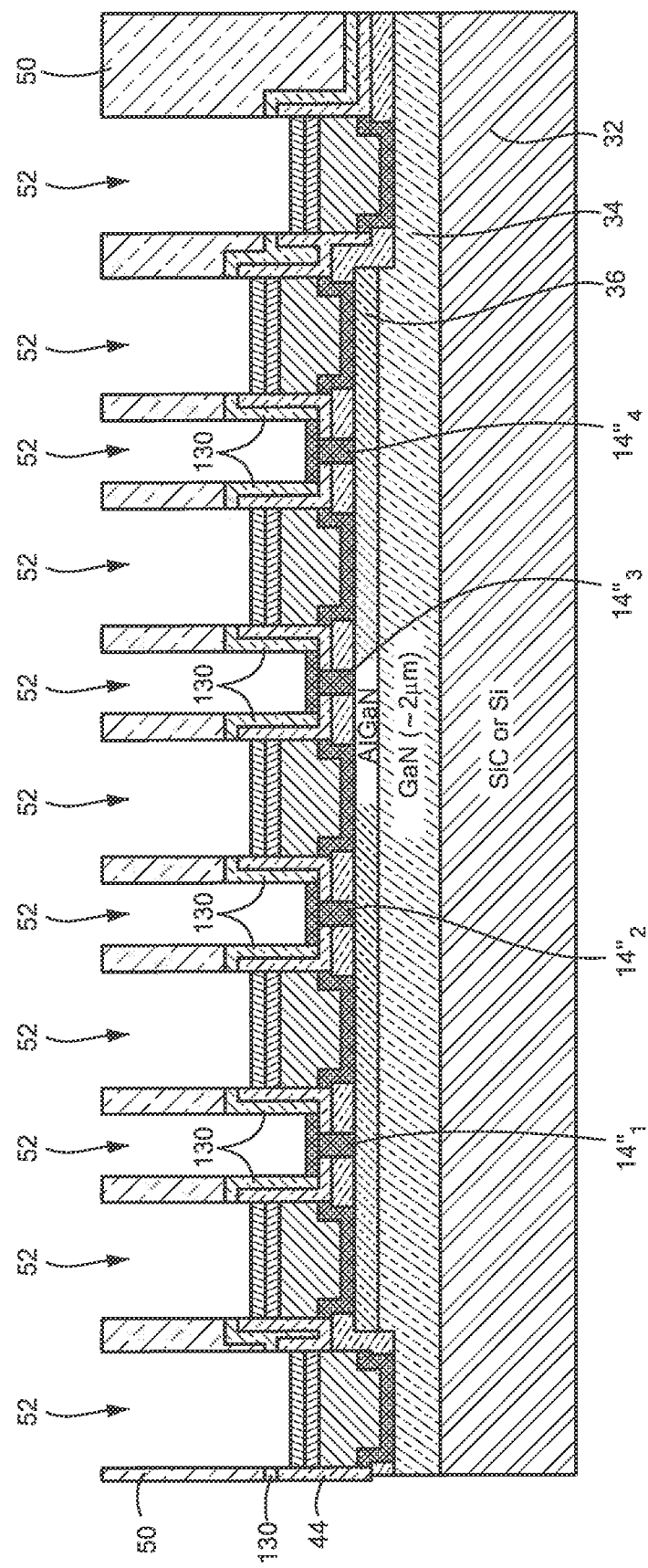

Referring now to FIGS. 12A-12C, another embodiment is shown. Here, after forming the gate metal 128' as shown in FIG. 11B, a top, or cap layer 128a, for example, TiN/W, W, Ta, TaN, Ta/TaN, or Mo for example is formed on the gate metal 128' to provide for example gamma gate structures 14$_1$"-14$_4$", as shown in FIG. 12A.

Next, referring to FIG. 12B, a dielectric layer 130, here for example, SiNx, is deposited over the structure followed by a layer 50, of here for example, silicon dioxide, which is then planarized using Chemical Mechanical Polishing (CMP).

Referring now to FIG. 12C, Openings 52 are formed over the source Ohmic contact (5), drain Ohmic contact (D) and the Ni gate metal 128' through the silicon oxide layer 50 using a conventional lithographic-etch process, here for example, using a fluorine based dry etch, it being noted that the etching stops at the SiNx layer 130. Next, the Openings 52 are continued through the SiNx layer 130 using a fluorine based dry etch to thereby expose the source Ohmic contact (S), drain Ohmic contact (D) and the Ni gate metal 128' that forms gate electrode structures 14$_1$"-44$_4$", as shown in FIG. 12C. The remainder of processing proceeds as described above in connection with FIG. 11F (or FIG. 2K) and then 2L-2U to complete the FET.

Referring now to FIG. 13A, here after forming the structure shown in FIG. 2E, a layer 140 of $Al_2O_3$ is deposited over layer 44, as shown, here, for example, using ALD having ≥1 deposition cycle.

Next, referring to FIG. 13B, the layer 140 is patterned as shown using conventional lithography followed by a wet and/or dry etch process, for example a hydrofluoric acid based wet etch, or chlorine based dry etch, or combination of both.

Figure 13C:
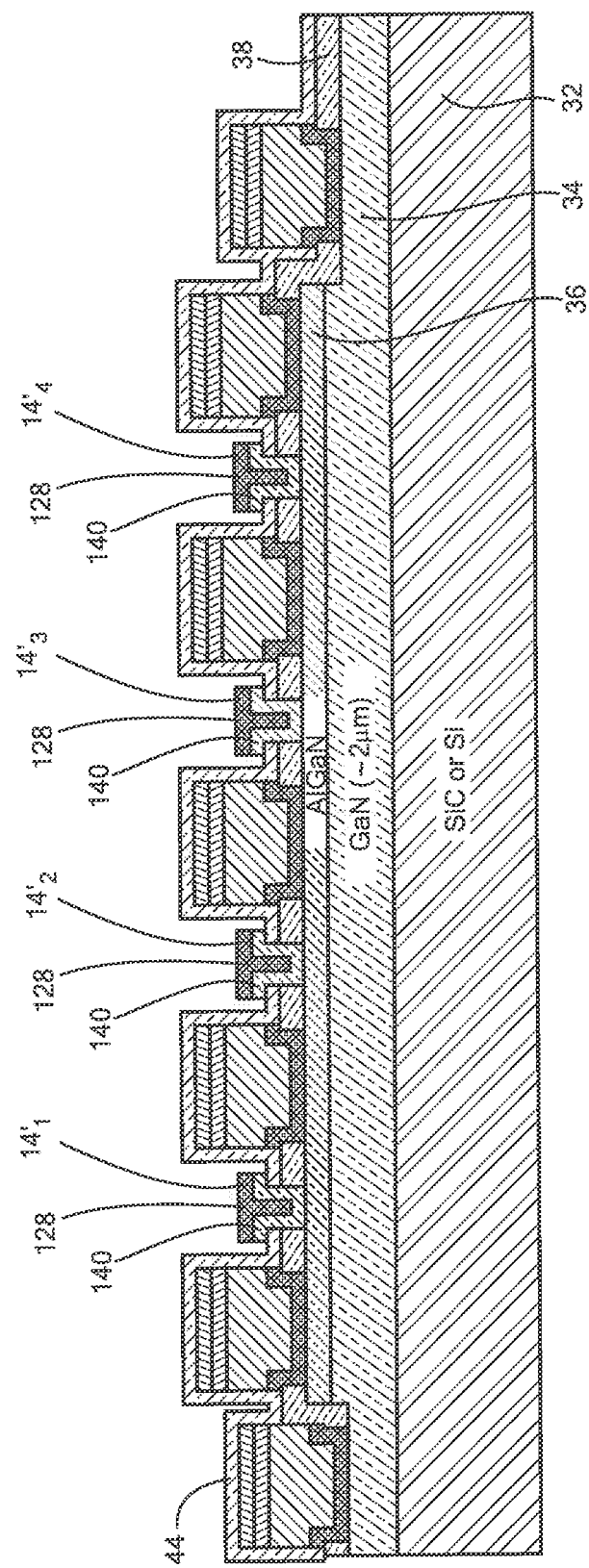

Next, referring to FIG. 13C, the process continues by forming selectively on the patterned $Al_2O_3$ layer 140, the ALD NiO material, layer 128, as described above in connection with FIG. 12G; as noted above, the NiO layer 128 will not adhere to the SiNx layer 44 but will adhere to the patterned $Al_2O_3$ layer 140. Next, the process continues as described above in connection with FIG. 11B, wherein the NiO is annealed in a reducing agent, here for example a gas comprising, here for example, hydrogen to convert, reduce, the NiO to Ni. As previously discussed, NiO metal deposition on the SiNx is suppressed because there is not a significant concentration of —OH groups (as there is on oxide layers such as $SiO_2$ or $Al_2O_3$) whereas the $Al_2O_3$, being an oxide the NiO will bond readily during ALD deposition.

Next the process continues as described above in connection with FIGS. 11C-11E (or a FIGS. 2H-2K), and then by FIGS. 2L-2U.

Figure 14C:
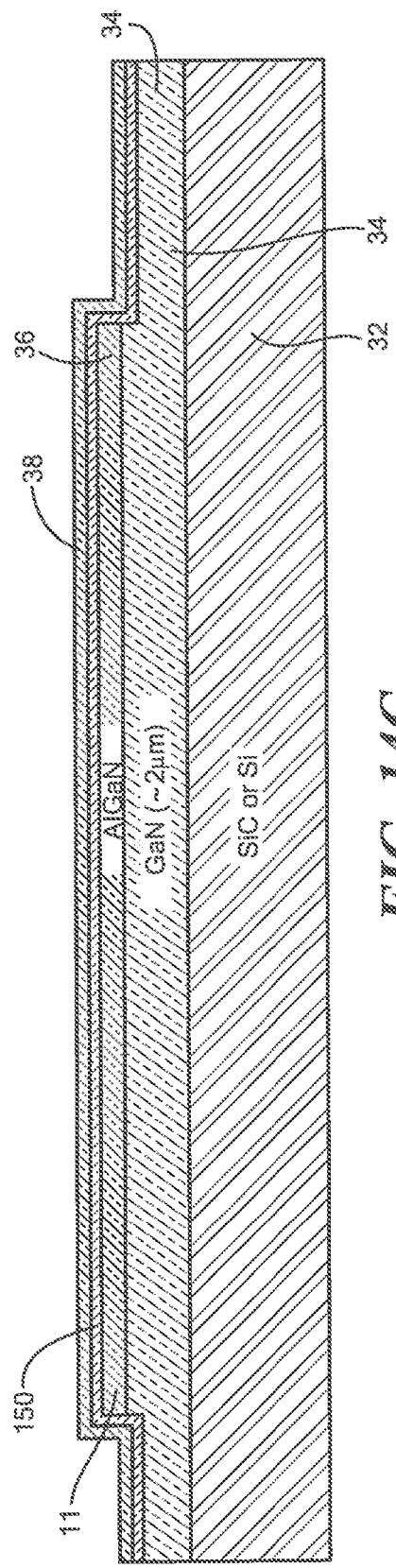
Figure 14D:
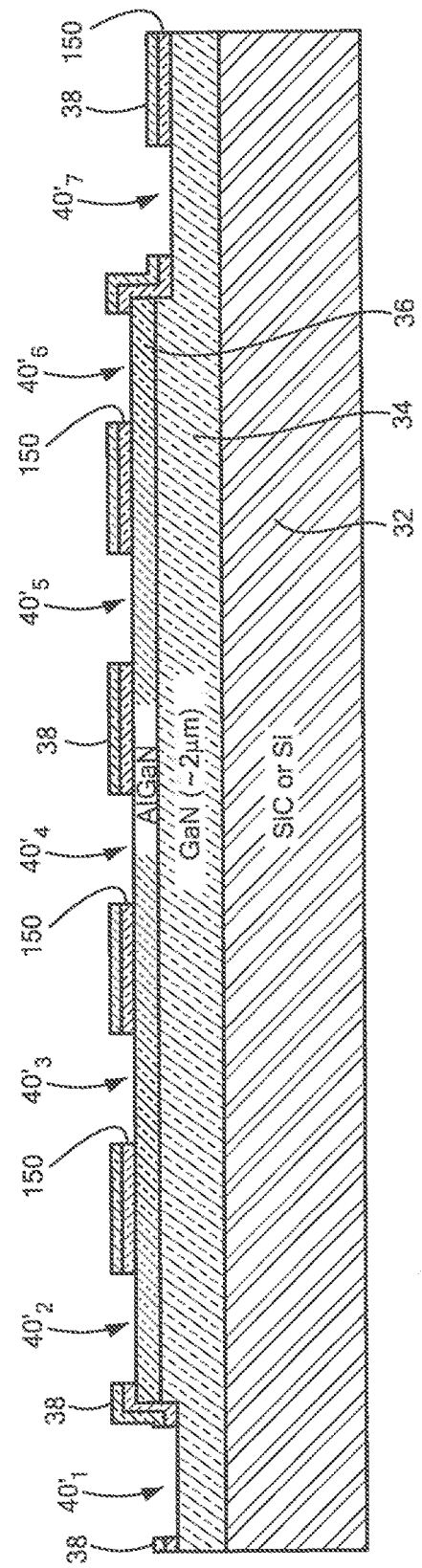

Referring now to FIGS. 14A-14K, the gate for a Metal-Insulator-Semiconductor FET (MISFET) will be described. Thus, here an insulator layer 150 of, for example, $Al_2O_3$ is formed over the AlGaN layer 36 (FIG. 14A) as shown in FIG. 14B. Then, fabrication proceeds in a similar manner FIGS. 2B-2F with the additional requirement that the $Al_2O_3$ layer 150 would need to be removed in addition to portions of SiNx layer 38 to form windows $40'_1$-$40'_7$ as shown in FIG. 14D. In practice, the fluorine based contact formation dry etch of SiNx would be selective to the $Al_2O_3$ layer 150. Removing the $Al_2O_3$ requires to a dilute HF wet etch or chlorine based dry etch.

Figure 14E:
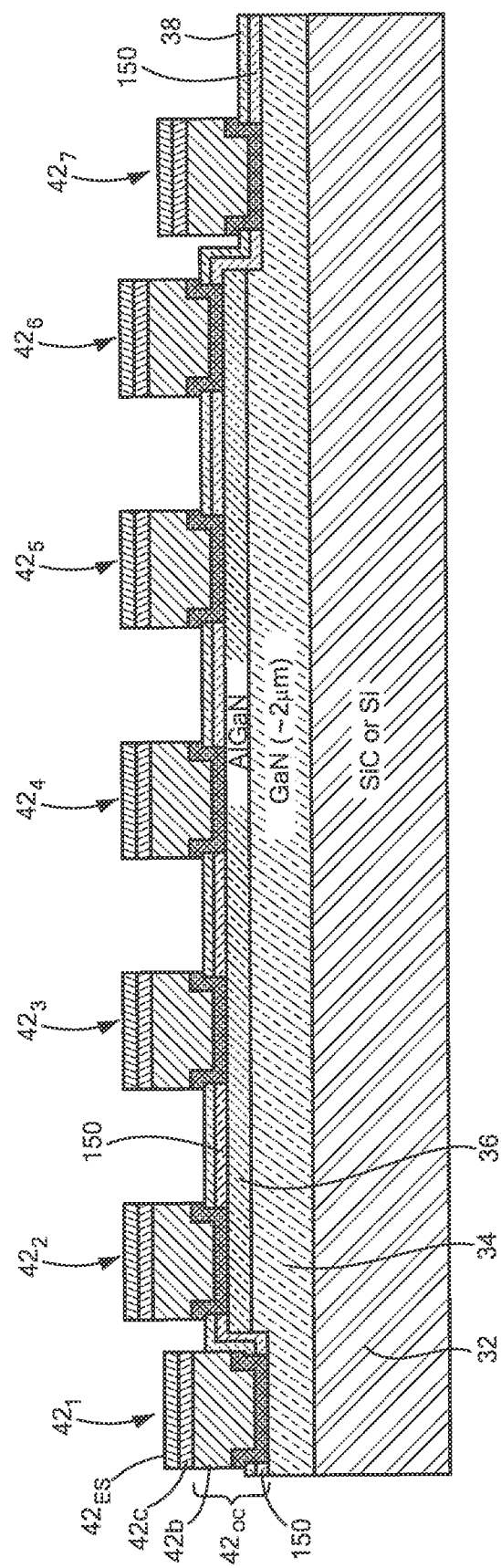
Figure 14F:
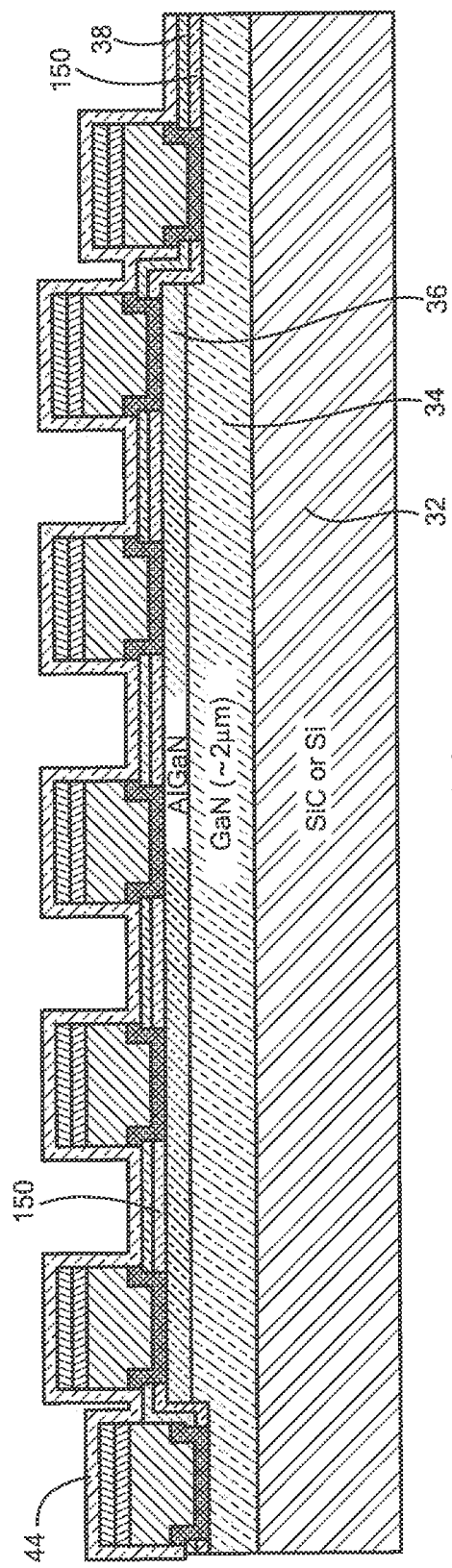

The source (S) and drain (D) electrical contact structures $42_1$ through $42_7$ are formed as described above in connection with FIG. 2D; as shown in FIG. 14E. After forming the electrical contact structures $42_1$ through $42_7$ as described above in connection with FIG. 21D, the process continues as described above in connection with FIGS. 2E-2F with a dielectric layer 44, here also $SiN_x$, layer being formed as shown in FIG. 14F.

Next, openings 46 are formed through layers 44 and passivation layer 38, here for example, silicon nitride $SiN_x$ 38 as shown in FIG. 14G, as described above in connection with FIG. 2F. It is noted that the etching used to form the openings 46 stops at the $Al_2O_3$ layer 150 using a timed etch process.

Figure 14K:
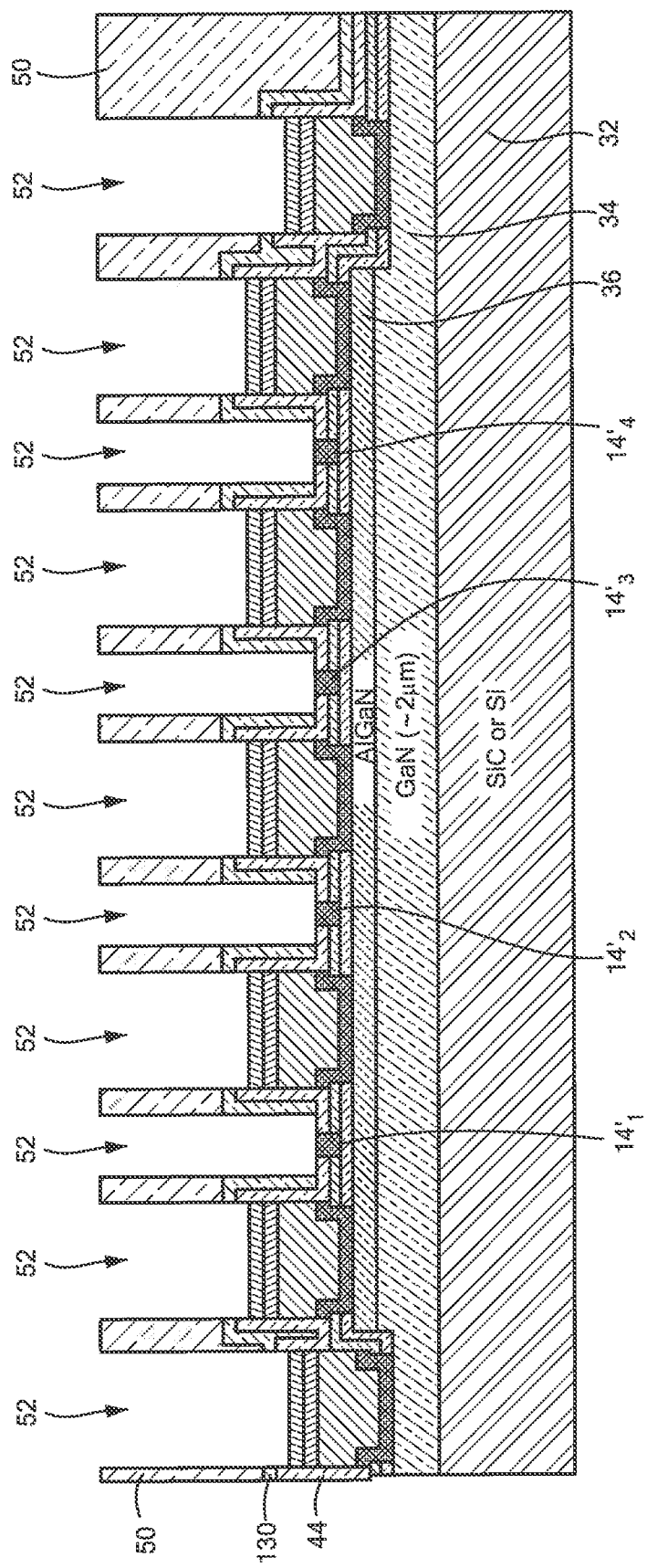

Next Nickel Oxide (NiO) gate metal layer 128 is selectively deposited through the opening, here using ALD, as described above in connection with FIG. 11A, as shown in FIG. 14H. Next, referring to FIG. 14I, the NiO layer 128 is annealed in a reducing agent, here for example a gas comprising, here for example, hydrogen to convert, reduce, the NiO to Ni layer 128', as described above in connection with FIG. 11B, as shown in FIG. 14I. Next, as indicated in FIG. 14J, the process continues as described above in connection with FIGS. 11C-11E, or alternately the process continues as FIGS. 12A-12C followed by FIGS. 2L-2U to complete the FET, as shown in FIGS. 14J-14K.

A number of embodiments of the disclosure have been described. Nevertheless, it will be understood that various modifications may be made without departing from the spirit and scope of the disclosure. For instance, the NiO metal 128 need not be reduced to Ni metal 128' or only partially reduced in any the previous embodiments. Accordingly, other embodiments are within the scope of the following claims.

What is claimed is:

1. A method for forming a gate electrical structure for a Field Effect Transistor, such gate electrode structure comprising: a lower gate electrode contract structure having a gate metal layer; and an upper electrode contact structure, the method comprising:
    providing a semiconductor;
    forming a dielectric layer over the semiconductor with an opening therein over a selected portion of the semiconductor;
using a deposition process to selectively deposit the gate metal layer of the lower gate electrode contact structure over the dielectric layer and into the opening, the gate metal layer being deposited being non-adherent to the dielectric layer by the gate metal layer deposition process; and
    wherein the deposition process comprises depositing a gate metal oxide layer and subsequently chemically reducing the deposited gate metal oxide layer into the gate metal layer.

2. A method for forming a gate electrical structure for a Field Effect Transistor, such gate electrode structure comprising: a lower gate electrode contract structure having a gate metal layer; and an upper electrode contact structure, the method comprising:
    providing a semiconductor;
    forming a dielectric layer over the semiconductor with an opening therein over a selected portion of the semiconductor;
using a deposition process to selectively deposit the gate metal layer of the lower gate electrode contact structure over the dielectric layer and into the opening, the gate metal layer being deposited being non-adherent to the dielectric layer by the gate metal layer deposition process; and
    wherein the deposition process comprises: depositing a gate metal oxide layer being non-adherent to the dielectric layer and adherent to the semiconductor; and subsequently chemically reacting the gate metal oxide layer to form the gate metal layer.

3. A method for forming a gate electrical structure for a Field Effect Transistor, such gate electrode structure comprising: a lower gate electrode contract structure having a gate metal layer; and an upper electrode contact structure, the method comprising:
    providing a semiconductor;
    forming a dielectric layer over the semiconductor with an opening therein over a selected portion of the semiconductor;
using a deposition process to selectively deposit the gate metal layer of the lower gate electrode contact structure over the dielectric layer and into the opening, the gate metal layer being deposited being non-adherent to the dielectric layer by the gate metal layer deposition process;
    including forming an insulation layer over the semiconductor, the opening exposes the insulating layer, and wherein the deposition process comprises: depositing a gate metal oxide layer non-adherent to the dielectric layer by the gate metal layer deposition process and adherent to the insulating layer; and, chemically reducing the gate metal oxide layer to form the gate metal layer.

4. A method for forming a gate electrical structure for a Field Effect Transistor, such gate electrode structure comprising: a lower gate electrode contract structure having a gate metal layer; and an upper electrode contact structure, the method comprising:
    providing a semiconductor;
    forming a non-oxide dielectric layer over a surface of the semiconductor, the non-oxide dielectric layer having an opening therein disposed over a selected portion of the surface of the semiconductor;
subjecting the non-oxide dielectric layer and the exposed selected portion of the surface of the semiconductor to a gate metal deposition process wherein a gate metal being deposited is non-adherent to the non-oxide dielectric layer and is adherent to an oxide formed on the exposed selected portion of the surface of the semiconductor;
    including forming an oxide insulation layer over the surface of the semiconductor, the opening exposing the oxide insulating layer, and wherein the gate metal is deposited is non-adherent to the non-oxide dielectric layer by the gate metal deposition process and adherent to the oxide insulating layer.

5. A method for forming a gate structure for a Field Effect Transistor, comprising:
    providing a semiconductor;
    forming a dielectric layer over the semiconductor with an opening therein over a selected portion of the semiconductor;
selectively depositing a gate metal oxide into the opening;
    wherein the initial gate metal forming comprises Atomic Layer Deposition;

wherein the initial gate metal is a metal oxide; and wherein the gate metal oxide layer is Nickel Oxide and annealing the Nickel Oxide in a reducing agent to convert the Nickel Oxide into Nickel to form the gate metal layer.

6. A method for forming a gate structure over a selected portion of a Group III-V semiconductor, comprising:

forming a dielectric layer over the semiconductor with an opening therein over a selected portion of the semiconductor;

forming Nickel Oxide on a surface exposed by the opening;

annealing the Nickel Oxide in a reducing agent to convert the Nickel Oxide into Nickel.

7. The method recited in claim 6 wherein the initial gate metal forming comprises Atomic Layer Deposition.

* * * * *